US007332066B2

(12) United States Patent
Chen et al.

(10) Patent No.: US 7,332,066 B2
(45) Date of Patent: *Feb. 19, 2008

(54) APPARATUS AND METHOD FOR ELECTROCHEMICALLY DEPOSITING METAL ON A SEMICONDUCTOR WORKPIECE

(75) Inventors: Linlin Chen, Plano, TX (US); Gregory J. Wilson, Kalispell, MT (US); Paul R. McHugh, Kalispell, MT (US); Robert A. Weaver, Whitefish, MT (US); Thomas L. Ritzdorf, Big Fork, MT (US)

(73) Assignee: Semitool, Inc., Kalispell, MT (US)

( * ) Notice: Subject to any disclaimer, the term of this patent is extended or adjusted under 35 U.S.C. 154(b) by 144 days.

This patent is subject to a terminal disclaimer.

(21) Appl. No.: 11/053,050

(22) Filed: Feb. 7, 2005

(65) Prior Publication Data

US 2005/0245083 A1 Nov. 3, 2005

Related U.S. Application Data

(60) Continuation of application No. 10/377,397, filed on Feb. 27, 2003, now Pat. No. 7,115,196, which is a division of application No. 09/732,513, filed on Dec. 7, 2000, now Pat. No. 6,565,729, which is a continuation-in-part of application No. 09/387,099, filed on Aug. 31, 1999, now Pat. No. 6,277,263, which is a continuation of application No. PCT/US99/06306, filed on Mar. 22, 1999, which is a continuation-in-part of application No. 09/045,245, filed on Mar. 20, 1998, now Pat. No. 6,197,181, said application No. 09/732,513 is a continuation-in-part of application No. PCT/US00/10120, filed on Apr. 13, 2000.

(60) Provisional application No. 60/206,663, filed on May 24, 2000, provisional application No. 60/182,160, filed on Feb. 14, 2000, provisional application No. 60/143,769, filed on Jul. 12, 1999, provisional application No. 60/129,055, filed on Apr. 13, 1999, provisional application No. 60/085,675, filed on May 15, 1998.

(51) Int. Cl.
C25D 7/12 (2006.01)
C25D 17/00 (2006.01)
C25D 17/12 (2006.01)

(52) U.S. Cl. .......................... 205/96; 205/148; 205/157

(58) Field of Classification Search .................... None
See application file for complete search history.

(56) References Cited

U.S. PATENT DOCUMENTS 1,526,644 A 2/1925 Pinney (Continued)

FOREIGN PATENT DOCUMENTS

CA 873651 6/1971

(Continued)

OTHER PUBLICATIONS

U.S. Appl. No. 60/129,055, filed Apr. 1999, McHugh.

(Continued)

Primary Examiner—Harry D Wilkins, III
(74) Attorney, Agent, or Firm—Klarquist Sparkman, LLP

(57) ABSTRACT

A process for metallization of a workpiece, such as a semiconductor workpiece. In an embodiment, an alkaline electrolytic copper bath is used to electroplate copper onto a seed layer, electroplate copper directly onto a barrier layer material, or enhance an ultra-thin copper seed layer which has been deposited on the barrier layer using a deposition process such as PVD. The resulting copper layer provides an excellent conformal copper coating that fills trenches, vias, and other microstructures in the workpiece. When used for seed layer enhancement, the resulting copper seed layer provide an excellent conformal copper coating that allows the microstructures to be filled with a copper layer having good uniformity using electrochemical deposition techniques. Further, copper layers that are electroplated in the disclosed manner exhibit low sheet resistance and are readily annealed at low temperatures.

38 Claims, 27 Drawing Sheets

U.S. PATENT DOCUMENTS

| | | |
|---|---|---|
| 1,881,713 A | 10/1932 | Laukel |
| 2,195,454 A * | 4/1940 | Greenspan .................. 205/295 |
| 2,250,556 A * | 7/1941 | Stareck ....................... 205/295 |
| 2,256,274 A | 9/1941 | Boedecker et al. |
| 2,411,674 A | 11/1946 | Wilson |
| 2,742,412 A | 4/1956 | Cransberg et al. |
| 2,996,408 A | 8/1961 | Lukes |
| 3,267,010 A | 8/1966 | Creutz et al. |
| 3,309,263 A | 3/1967 | Grobe |
| 3,328,273 A | 6/1967 | Creutz et al. |
| 3,616,284 A | 10/1971 | Bodmer et al. |
| 3,664,933 A | 5/1972 | Clauss |
| 3,684,666 A | 8/1972 | Shaw et al. |
| 3,706,635 A | 12/1972 | Kowalski |
| 3,706,651 A | 12/1972 | Leland |
| 3,716,462 A | 2/1973 | Jensen |
| 3,770,598 A | 11/1973 | Creutz |
| 3,798,003 A | 3/1974 | Ensley et al. |
| 3,878,066 A | 4/1975 | Dettke et al. |
| 3,930,963 A | 1/1976 | Polichette et al. |
| 3,968,885 A | 7/1976 | Hassan et al. |
| 4,000,046 A | 12/1976 | Weaver |
| 4,022,679 A | 5/1977 | Koziol et al. |
| 4,030,015 A | 6/1977 | Herko et al. |
| 4,046,105 A | 9/1977 | Gomez |
| 4,072,557 A | 2/1978 | Schiel |
| 4,082,638 A | 4/1978 | Jumer |
| 4,113,577 A | 9/1978 | Ross et al. |
| 4,134,802 A | 1/1979 | Herr |
| 4,137,867 A | 2/1979 | Aigo |
| 4,165,252 A | 8/1979 | Gibbs |
| 4,170,959 A | 10/1979 | Aigo |
| 4,222,834 A | 9/1980 | Bacon et al. |
| 4,238,310 A | 12/1980 | Eckler et al. |
| 4,246,088 A | 1/1981 | Murphy et al. |
| 4,259,166 A | 3/1981 | Whitehurst |
| 4,272,335 A | 6/1981 | Combs |
| 4,279,948 A | 7/1981 | Kukanskis et al. |
| 4,287,029 A | 9/1981 | Shimamura |
| 4,304,641 A | 12/1981 | Grandia et al. |
| 4,323,433 A | 4/1982 | Loch |
| 4,341,629 A | 7/1982 | Uhlinger |
| 4,360,410 A | 11/1982 | Fletcher et al. |
| 4,378,283 A | 3/1983 | Seyffert |
| 4,384,930 A | 5/1983 | Eckles |
| 4,391,694 A | 7/1983 | Runsten |
| 4,422,915 A | 12/1983 | Wielonski et al. |
| 4,431,361 A | 2/1984 | Bayne |
| 4,437,943 A | 3/1984 | Beck et al. |
| 4,440,597 A | 4/1984 | Wells et al. |
| 4,443,117 A | 4/1984 | Muramoto et al. |
| 4,449,885 A | 5/1984 | Hertel et al. |
| 4,451,197 A | 5/1984 | Lange |
| 4,463,503 A | 8/1984 | Applegate |
| 4,466,864 A | 8/1984 | Bacon |
| 4,469,566 A | 9/1984 | Wray |
| 4,475,823 A | 10/1984 | Stone |
| 4,480,028 A | 10/1984 | Kato et al. |
| 4,495,153 A | 1/1985 | Midorikawa |
| 4,495,453 A | 1/1985 | Inaba |
| 4,500,394 A | 2/1985 | Rizzo |
| 4,529,480 A | 7/1985 | Trokhan |
| 4,541,895 A | 9/1985 | Albert |
| 4,566,847 A | 1/1986 | Maeda |
| 4,576,685 A | 3/1986 | Goffredo et al. |
| 4,576,689 A | 3/1986 | Makkaev et al. |
| 4,585,539 A | 4/1986 | Edson |
| 4,604,177 A | 8/1986 | Sivilotti |
| 4,604,178 A | 8/1986 | Fiegener |
| 4,624,749 A | 11/1986 | Black et al. |
| 4,634,503 A | 1/1987 | Nogavich |
| 4,639,028 A | 1/1987 | Olson |
| 4,648,944 A | 3/1987 | George et al. |
| 4,670,126 A | 6/1987 | Messer et al. |
| 4,673,469 A | 6/1987 | Beach et al. |
| 4,685,414 A | 8/1987 | DiRico |
| 4,687,552 A | 8/1987 | Early et al. |
| 4,693,017 A | 9/1987 | Oehler et al. |
| 4,696,729 A | 9/1987 | Santini |
| 4,715,934 A | 12/1987 | Tamminen |
| 4,741,624 A | 5/1988 | Barroyer |
| 4,760,671 A | 8/1988 | Ward |
| 4,761,214 A | 8/1988 | Hinman |
| 4,770,590 A | 9/1988 | Hugues et al. |
| 4,781,800 A | 11/1988 | Goldman et al. |
| 4,800,818 A | 1/1989 | Kawaguchi et al. |
| 4,828,654 A | 5/1989 | Reed |
| 4,849,054 A | 7/1989 | Klowak |
| 4,858,539 A | 8/1989 | Schumann |
| 4,864,239 A | 9/1989 | Casarcia et al. |
| 4,868,992 A | 9/1989 | Crafts et al. |
| 4,898,647 A | 2/1990 | Luce et al. |
| 4,902,398 A | 2/1990 | Homstad |
| 4,906,341 A | 3/1990 | Yamakawa |
| 4,913,085 A | 4/1990 | Vohringer et al. |
| 4,924,890 A | 5/1990 | Giles et al. |
| 4,944,650 A | 7/1990 | Matsumoto |
| 4,949,671 A | 8/1990 | Davis et al. |
| 4,951,601 A | 8/1990 | Maydan et al. |
| 4,959,278 A | 9/1990 | Shimauchi et al. |
| 4,962,726 A | 10/1990 | Matsushita et al. |
| 4,979,464 A | 12/1990 | Kunze-Concewitz et al. |
| 4,988,533 A | 1/1991 | Freeman et al. |
| 4,990,224 A | 2/1991 | Mahmoud |
| 5,000,827 A | 3/1991 | Schuster et al. |
| 5,021,129 A | 6/1991 | Arbach et al. |
| 5,024,746 A | 6/1991 | Stierman et al. |
| 5,026,239 A | 6/1991 | Chiba |
| 5,048,589 A | 9/1991 | Cook et al. |
| 5,054,988 A | 10/1991 | Shiraiwa |
| 5,055,036 A | 10/1991 | Asano et al. |
| 5,061,144 A | 10/1991 | Akimoto |
| 5,069,548 A | 12/1991 | Boehnlein |
| 5,078,852 A | 1/1992 | Yee |
| 5,083,364 A | 1/1992 | Olbrich et al. |
| 5,096,550 A | 3/1992 | Mayer |
| 5,110,248 A | 5/1992 | Asano et al. |
| 5,115,430 A | 5/1992 | Hahne et al. |
| 5,116,430 A | 5/1992 | Hirai et al. |
| 5,125,784 A | 6/1992 | Asano |
| 5,128,912 A | 7/1992 | Hug et al. |
| 5,135,636 A | 8/1992 | Yee et al. |
| 5,138,973 A | 8/1992 | Davis et al. |
| 5,146,136 A | 9/1992 | Ogura |
| 5,151,168 A | 9/1992 | Gilton et al. |
| 5,155,336 A | 10/1992 | Gronet et al. |
| 5,156,174 A | 10/1992 | Thompson |
| 5,156,730 A | 10/1992 | Bhatt |
| 5,161,168 A | 11/1992 | Schilling |
| 5,168,886 A | 12/1992 | Thompson et al. |
| 5,168,887 A | 12/1992 | Thompson |
| 5,169,408 A | 12/1992 | Biggerstaff et al. |
| 5,172,803 A | 12/1992 | Lewin |
| 5,174,045 A | 12/1992 | Thompson et al. |
| 5,178,512 A | 1/1993 | Skrobak |
| 5,178,639 A | 1/1993 | Nishi |
| 5,180,273 A | 1/1993 | Salaya et al. |
| 5,183,377 A | 2/1993 | Becker et al. |
| 5,186,594 A | 2/1993 | Toshima et al. |
| 5,209,817 A | 5/1993 | Ahmad et al. |
| 5,217,586 A | 6/1993 | Datta et al. |
| 5,222,310 A | 6/1993 | Thompson |
| 5,227,041 A | 7/1993 | Brogden |
| 5,228,232 A | 7/1993 | Miles |

| | | | | | |
|---|---|---|---|---|---|
| 5,228,966 A | 7/1993 | Murata | 5,584,310 A | 12/1996 | Bergman |
| 5,230,371 A | 7/1993 | Lee | 5,584,971 A | 12/1996 | Komino |
| 5,232,511 A | 8/1993 | Bergman | 5,593,545 A | 1/1997 | Rugowski et al. |
| 5,235,995 A | 8/1993 | Bergman et al. | 5,597,460 A | 1/1997 | Reynolds |
| 5,238,500 A | 8/1993 | Bergman | 5,597,836 A | 1/1997 | Hackler et al. |
| 5,246,565 A | 9/1993 | Nignardot | 5,600,532 A | 2/1997 | Michiya et al. |
| 5,252,137 A | 10/1993 | Tateyama et al. | 5,609,239 A | 3/1997 | Schlecker |
| 5,252,196 A | 10/1993 | Sonnenberg et al. | 5,620,581 A | 4/1997 | Ang |
| 5,252,807 A | 10/1993 | Chizinsky | RE35,513 E | 5/1997 | Nobel et al. |
| 5,256,262 A | 10/1993 | Blomsterberg | 5,639,206 A | 6/1997 | Oda et al. |
| 5,256,274 A | 10/1993 | Poris | 5,639,316 A | 6/1997 | Cabral, Jr. et al. |
| 5,271,953 A | 12/1993 | Litteral | 5,641,613 A | 6/1997 | Boff et al. |
| 5,271,972 A | 12/1993 | Kwok et al. | 5,650,082 A | 7/1997 | Anderson |
| 5,284,548 A | 2/1994 | Carey et al. | 5,651,823 A | 7/1997 | Parodi et al. |
| 5,301,700 A | 4/1994 | Kamikawa et al. | 5,658,387 A | 8/1997 | Reardon |
| 5,302,464 A | 4/1994 | Nomura et al. | 5,660,472 A | 8/1997 | Peuse et al. |
| 5,306,895 A | 4/1994 | Ushikoshi et al. | 5,660,517 A | 8/1997 | Thompson et al. |
| 5,314,294 A | 5/1994 | Taniguchi et al. | 5,662,788 A | 9/1997 | Sandhu |
| 5,316,642 A | 5/1994 | Young | 5,664,337 A | 9/1997 | Davis et al. |
| 5,326,455 A | 7/1994 | Kubo et al. | 5,670,034 A | 9/1997 | Lowery |
| 5,330,604 A | 7/1994 | Allum et al. | 5,674,787 A | 10/1997 | Zhao et al. |
| 5,332,271 A | 7/1994 | Grant et al. | 5,676,337 A | 10/1997 | Giras et al. |
| 5,332,445 A | 7/1994 | Bergman | 5,677,118 A | 10/1997 | Spara et al. |
| 5,340,456 A | 8/1994 | Mehler | 5,678,320 A | 10/1997 | Thompson et al. |
| 5,344,491 A | 9/1994 | Katou | 5,681,392 A | 10/1997 | Swain |
| 5,348,620 A | 9/1994 | Hermans et al. | 5,683,564 A | 11/1997 | Reynolds |
| 5,364,504 A | 11/1994 | Smurkoski et al. | 5,683,568 A | 11/1997 | Harris et al. |
| 5,366,785 A | 11/1994 | Sawdai | 5,684,654 A | 11/1997 | Searle et al. |
| 5,366,786 A | 11/1994 | Connor et al. | 5,684,713 A | 11/1997 | Asada et al. |
| 5,368,711 A | 11/1994 | Poris | 5,695,810 A | 12/1997 | Dubin et al. |
| 5,372,848 A | 12/1994 | Blackwell et al. | 5,700,127 A | 12/1997 | Harada |
| 5,376,176 A | 12/1994 | Kuriyama | 5,711,646 A | 1/1998 | Ueda et al. |
| 5,377,708 A | 1/1995 | Bergman | 5,719,447 A | 2/1998 | Gardner |
| 5,388,945 A | 2/1995 | Garric et al. | 5,723,028 A | 3/1998 | Poris |
| 5,391,285 A | 2/1995 | Lytle et al. | 5,723,387 A | 3/1998 | Chen |
| 5,391,517 A | 2/1995 | Gelatos et al. | 5,730,854 A | 3/1998 | Martin |
| 5,405,518 A | 4/1995 | Hsieh et al. | 5,731,678 A | 3/1998 | Zila et al. |
| 5,409,587 A | 4/1995 | Sandhu et al. | 5,744,019 A | 4/1998 | Ang |
| 5,411,076 A | 5/1995 | Matsunaga et al. | 5,746,565 A | 5/1998 | Tepolt |
| 5,421,987 A | 6/1995 | Tzanavaras et al. | 5,747,098 A | 5/1998 | Larson |
| 5,427,674 A | 6/1995 | Langenskiold et al. | 5,750,018 A | 5/1998 | Brasch |
| 5,429,686 A | 7/1995 | Chiu et al. | 5,754,842 A | 5/1998 | Minagawa |
| 5,429,733 A | 7/1995 | Ishida | 5,755,948 A | 5/1998 | Lazaro et al. |
| 5,431,803 A | 7/1995 | DiFranco et al. | 5,759,006 A | 6/1998 | Miyamoto et al. |
| 5,437,777 A | 8/1995 | Kishi | 5,762,751 A | 6/1998 | Bleck |
| 5,441,629 A | 8/1995 | Kosaki | 5,765,444 A | 6/1998 | Bacchi |
| 5,442,416 A | 8/1995 | Tateyama et al. | 5,765,889 A | 6/1998 | Nam et al. |
| 5,443,707 A | 8/1995 | Mori | 5,776,327 A | 7/1998 | Botts et al. |
| 5,443,865 A | 8/1995 | Tisdale et al. | 5,785,826 A | 7/1998 | Greenspan |
| 5,445,484 A | 8/1995 | Kato et al. | 5,788,829 A | 8/1998 | Joshi et al. |
| 5,447,615 A | 9/1995 | Ishida | 5,802,856 A | 9/1998 | Schaper et al. |
| 5,454,405 A | 10/1995 | Hawes | 5,824,599 A | 10/1998 | Schacham-Diamand et al. |
| 5,454,930 A | 10/1995 | Miura et al. | 5,829,791 A | 11/1998 | Kotsubo et al. |
| 5,460,478 A | 10/1995 | Akimoto et al. | 5,843,296 A | 12/1998 | Greespan |
| 5,464,313 A | 11/1995 | Ohsawa | 5,871,626 A | 2/1999 | Crafts et al. |
| 5,472,502 A | 12/1995 | Batchelder | 5,871,805 A | 2/1999 | Lemelson |
| 5,472,592 A | 12/1995 | Lowery | 5,882,498 A | 3/1999 | Dubin et al. |
| 5,482,891 A | 1/1996 | Shieh et al. | 5,891,513 A | 4/1999 | Dubin et al. |
| 5,489,341 A | 2/1996 | Bergman et al. | 5,892,207 A | 4/1999 | Kawamura et al. |
| 5,500,081 A | 3/1996 | Bergman | 5,897,368 A | 4/1999 | Cole, Jr. et al. |
| 5,501,768 A | 3/1996 | Hermans et al. | 5,904,827 A | 5/1999 | Reynolds |
| 5,508,095 A | 4/1996 | Allum et al. | 5,908,543 A | 6/1999 | Matsunami et al. |
| 5,512,319 A | 4/1996 | Cook et al. | 5,913,147 A | 6/1999 | Dubin et al. |
| 5,514,258 A | 5/1996 | Brinket et al. | 5,925,227 A | 7/1999 | Kobayashi et al. |
| 5,516,412 A | 5/1996 | Andricacos et al. | 5,932,077 A | 8/1999 | Reynolds |
| 5,522,975 A | 6/1996 | Andricacos et al. | 5,937,142 A | 8/1999 | Moslehi et al. |
| 5,527,390 A | 6/1996 | Ono et al. | 5,957,836 A | 9/1999 | Johnson |
| 5,544,421 A | 8/1996 | Thompson et al. | 5,968,333 A | 10/1999 | Nogami et al. |
| 5,549,808 A | 8/1996 | Farooq et al. | 5,969,422 A | 10/1999 | Ting et al. |
| 5,567,267 A | 10/1996 | Kazama et al. | 5,972,192 A | 10/1999 | Dubin et al. |
| 5,571,325 A | 11/1996 | Ueyama | 5,980,706 A | 11/1999 | Bleck |
| 5,575,611 A | 11/1996 | Thompson et al. | 5,985,126 A | 11/1999 | Bleck |
| 5,576,052 A | 11/1996 | Arledge et al. | 5,989,397 A | 11/1999 | Laube et al. |

| | | |
|---|---|---|
| 5,989,406 A | 11/1999 | Beetz, Jr. et al. |
| 5,998,123 A | 12/1999 | Tanaka et al. |
| 5,999,886 A | 12/1999 | Martin et al. |
| 6,001,235 A | 12/1999 | Arken et al. |
| 6,004,828 A | 12/1999 | Hanson |
| 6,017,820 A | 1/2000 | Ting et al. |
| 6,027,631 A | 2/2000 | Broadbent |
| 6,028,986 A | 2/2000 | Song |
| 6,036,836 A | 3/2000 | Peeters et al. |
| 6,051,284 A | 4/2000 | Byrne et al. |
| 6,053,687 A | 4/2000 | Kirkpatrick |
| 6,065,424 A | 5/2000 | Shacham-Diamand et al. |
| 6,069,068 A | 5/2000 | Rathore et al. |
| 6,072,160 A | 6/2000 | Bahl |
| 6,072,163 A | 6/2000 | Armstrong et al. |
| 6,074,544 A | 6/2000 | Reid et al. |
| 6,080,288 A | 6/2000 | Schwartz et al. |
| 6,080,291 A | 6/2000 | Woodruff et al. |
| 6,080,691 A | 6/2000 | Woodruff et al. |
| 6,086,680 A | 7/2000 | Foster et al. |
| 6,090,260 A | 7/2000 | Inoue et al. |
| 6,091,498 A | 7/2000 | Hanson |
| 6,099,702 A | 8/2000 | Reid |
| 6,099,712 A | 8/2000 | Ritzdorf |
| 6,103,085 A | 8/2000 | Woo et al. |
| 6,107,192 A | 8/2000 | Subrahmanyan et al. |
| 6,108,937 A | 8/2000 | Raaijmakers |
| 6,110,011 A | 8/2000 | Somekh |
| 6,110,346 A | 8/2000 | Reid et al. |
| 6,113,771 A | 9/2000 | Landau et al. |
| 6,130,415 A | 10/2000 | Knoot |
| 6,136,163 A | 10/2000 | Cheung |
| 6,139,703 A | 10/2000 | Hanson et al. |
| 6,139,712 A | 10/2000 | Patton |
| 6,140,234 A | 10/2000 | Uzoh et al. |
| 6,140,241 A | 10/2000 | Shue et al. |
| 6,143,147 A | 11/2000 | Jelinek |
| 6,143,155 A | 11/2000 | Adams et al. |
| 6,151,532 A | 11/2000 | Barone et al. |
| 6,156,167 A | 12/2000 | Patton et al. |
| 6,157,106 A | 12/2000 | Tietz et al. |
| 6,159,354 A | 12/2000 | Contolini et al. |
| 6,162,344 A | 12/2000 | Reid et al. |
| 6,162,488 A | 12/2000 | Gevelber et al. |
| 6,168,695 B1 | 1/2001 | Woodruff |
| 6,174,425 B1 | 1/2001 | Simpson |
| 6,174,796 B1 | 1/2001 | Takagi et al. |
| 6,179,983 B1 | 1/2001 | Reid et al. |
| 6,184,068 B1 | 2/2001 | Ohtani et al. |
| 6,193,859 B1 | 2/2001 | Contolini et al. |
| 6,197,181 B1 | 3/2001 | Chen |
| 6,197,688 B1 | 3/2001 | Simpson |
| 6,199,301 B1 | 3/2001 | Wallace |
| 6,218,097 B1 | 4/2001 | Bell et al. |
| 6,221,230 B1 | 4/2001 | Takeuchi et al. |
| 6,228,232 B1 | 5/2001 | Woodruff et al. |
| 6,234,738 B1 | 5/2001 | Kimata |
| 6,251,238 B1 | 6/2001 | Kaufman |
| 6,251,528 B1 | 6/2001 | Uzoh et al. |
| 6,254,742 B1 | 7/2001 | Hanson et al. |
| 6,258,220 B1 | 7/2001 | Dordi |
| 6,261,433 B1 | 7/2001 | Landau |
| 6,270,647 B1 | 8/2001 | Graham |
| 6,277,263 B1 | 8/2001 | Chen |
| 6,278,089 B1 | 8/2001 | Young et al. |
| 6,280,183 B1 | 8/2001 | Mayur et al. |
| 6,280,582 B1 | 8/2001 | Woodruff et al. |
| 6,280,583 B1 | 8/2001 | Woodruff et al. |
| 6,290,833 B1 | 9/2001 | Chen |
| 6,297,154 B1 | 10/2001 | Gross et al. |
| 6,303,010 B1 | 10/2001 | Woodruff et al. |
| 6,309,520 B1 | 10/2001 | Woodruff et al. |
| 6,309,524 B1 | 10/2001 | Woodruff et al. |
| 6,318,951 B1 | 11/2001 | Schmidt et al. |
| 6,319,831 B1 | 11/2001 | Tsai et al. |
| 6,322,112 B1 | 11/2001 | Duncan |
| 6,322,677 B1 | 11/2001 | Woodruff |
| 6,342,137 B1 | 1/2002 | Woodruff |
| 6,365,729 B1 | 4/2002 | Tyagi |
| 6,391,166 B1 | 5/2002 | Wang |
| 6,395,164 B1 | 5/2002 | Andricacos et al. |
| 6,402,923 B1 | 6/2002 | Mayer |
| 6,409,892 B1 | 6/2002 | Woodruff et al. |
| 6,428,660 B2 | 8/2002 | Woodruff et al. |
| 6,428,662 B1 | 8/2002 | Woodruff et al. |
| 6,444,101 B1 | 9/2002 | Stevens |
| 6,471,850 B2 | 10/2002 | Shiepe et al. |
| 6,471,913 B1 | 10/2002 | Weaver et al. |
| 6,481,956 B1 | 11/2002 | Hofmeister |
| 6,491,806 B1 | 12/2002 | Dubin et al. |
| 6,497,801 B1 | 12/2002 | Woodruff et al. |
| 6,531,046 B2 | 3/2003 | Morrissey et al. |
| 6,562,421 B2 | 5/2003 | Sudo et al. |
| 6,565,729 B2 | 5/2003 | Chen et al. |
| 6,565,731 B1 | 5/2003 | Couble et al. |
| 6,569,297 B2 | 5/2003 | Wilson et al. |
| 6,599,412 B1 | 7/2003 | Graham et al. |
| 6,623,609 B2 | 9/2003 | Harris et al. |
| 6,632,334 B2 | 10/2003 | Anderson et al. |
| 6,632,345 B2 | 10/2003 | Chen |
| 6,654,122 B1 | 11/2003 | Hanson et al. |
| 6,660,137 B2 | 12/2003 | Wilson et al. |
| 6,672,820 B1 | 1/2004 | Hanson et al. |
| 6,678,055 B2 | 1/2004 | Du-Nour et al. |
| 6,699,373 B2 | 3/2004 | Woodruff et al. |
| 6,709,562 B1 | 3/2004 | Andricacos et al. |
| 6,749,390 B2 | 6/2004 | Woodruff et al. |
| 6,752,584 B2 | 6/2004 | Woodruff et al. |
| 6,755,954 B2 | 6/2004 | Mayer et al. |
| 6,773,571 B1 | 8/2004 | Mayer et al. |
| 6,780,374 B2 | 8/2004 | Weaver et al. |
| 6,811,675 B2 | 11/2004 | Chen |
| 6,916,412 B2 | 7/2005 | Woodruff et al. |
| 6,921,468 B2 | 7/2005 | Graham et al. |
| 2002/0008036 A1 | 1/2002 | Wang |
| 2002/0032499 A1 | 3/2002 | Wilson et al. |
| 2002/0043466 A1 | 4/2002 | Dordi et al. |
| 2002/0125141 A1 | 9/2002 | Wilson et al. |
| 2002/0139678 A1 | 10/2002 | Wilson et al. |
| 2003/0038035 A1 | 2/2003 | Wilson et al. |
| 2003/0062258 A1 | 4/2003 | Woodruff et al. |
| 2003/0070918 A1 | 4/2003 | Hanson |
| 2003/0127337 A1 | 7/2003 | Hanson et al. |
| 2004/0031693 A1 | 2/2004 | Chen et al. |
| 2004/0055877 A1 | 3/2004 | Wilson et al. |
| 2004/0072419 A1 | 4/2004 | Baskaran et al. |
| 2004/0099533 A1 | 5/2004 | Wilson et al. |
| 2004/0188259 A1 | 9/2004 | Wilson et al. |
| 2005/0121317 A1 | 6/2005 | Klocke et al. |
| 2005/0121326 A1 | 6/2005 | Klocke et al. |
| 2005/0139478 A1 | 6/2005 | Chen |
| 2005/0150770 A1 | 7/2005 | Chen |
| 2005/0173252 A1 | 8/2005 | Chen |

FOREIGN PATENT DOCUMENTS

| | | |
|---|---|---|
| DE | 41 14 427 | 11/1992 |
| DE | 195 25 666 | 10/1996 |
| EP | 0 140 404 | 8/1984 |
| EP | 0 047 132 | 7/1985 |
| EP | 0 677 612 A3 | 10/1985 |
| EP | 0 257 670 | 3/1988 |
| EP | 0 290 210 | 11/1988 |
| EP | 0 582 019 | 10/1995 |
| EP | 0 677 612 A2 | 10/1995 |
| EP | 0 544 311 | 5/1996 |

| | | |
|---|---|---|
| EP | 0 881 673 | 5/1998 |
| EP | 0 982 771 | 8/1999 |
| EP | 1 069 213 | 7/2000 |
| EP | 0 452 939 | 11/2000 |
| GB | 2 217 107 | 3/1989 |
| GB | 2 254 288 | 3/1992 |
| GB | 2 279 372 | 6/1994 |
| GB | 2 285 174 | 12/1994 |
| GB | 2 305 188 | 4/1997 |
| JP | 52-16433 | 7/1975 |
| JP | 10-48442 | 2/1989 |
| JP | 4144150 | 5/1992 |
| JP | 4311591 | 11/1992 |
| JP | 5142262 | 6/1993 |
| JP | 5146984 | 6/1993 |
| JP | 5195183 | 8/1993 |
| JP | 5211224 | 8/1993 |
| JP | 6017291 | 1/1994 |
| JP | 6073598 | 3/1994 |
| JP | 6224202 | 8/1994 |
| JP | 7113159 | 5/1995 |
| JP | 7197299 | 8/1995 |
| JP | 10-083960 | 3/1998 |
| JP | 11-036096 | 2/1999 |
| JP | 11-080993 | 3/1999 |
| WO | 90/00476 | 1/1990 |
| WO | 91/04213 | 4/1991 |
| WO | 95/06326 | 3/1995 |
| WO | 95/20064 | 7/1995 |
| WO | 99/16936 | 4/1996 |
| WO | 99/25904 | 5/1999 |
| WO | 99/25905 | 5/1999 |
| WO | 99/40615 | 8/1999 |
| WO | 99/41434 | 8/1999 |
| WO | 99/45745 | 9/1999 |
| WO | 99/47731 | 9/1999 |
| WO | 00/02675 | 1/2000 |
| WO | 00/02808 | 1/2000 |
| WO | 00/03072 | 1/2000 |
| WO | 00/32835 | 6/2000 |
| WO | 00/61498 | 10/2000 |
| WO | 00/61837 | 10/2000 |
| WO | 01/46910 | 6/2001 |
| WO | 01/90434 | 11/2001 |
| WO | 01/91163 | 11/2001 |
| WO | 02/02808 | 1/2002 |
| WO | 02/17203 | 2/2002 |
| WO | 02/45476 | 6/2002 |
| WO | 02/97165 | 12/2002 |
| WO | 02/99165 | 12/2002 |
| WO | 03/018874 | 3/2003 |

OTHER PUBLICATIONS

U.S. Appl. No. 60/143,769, filed Jul. 1999, McHugh.
U.S. Appl. No. 60/182,160, filed Feb. 2000, McHugh et al.
U.S. Appl. No. 60/206,663, filed May 2000, Wilson et al.
U.S. Appl. No. 60/294,690, filed May 2001, Gibbons et al.
U.S. Appl. No. 60/316,597, filed Aug. 2001, Hanson.
U.S. Appl. No. 60/607,046, filed Sep. 2004, Klocke.
U.S. Appl. No. 60/607,460, filed Sep. 2004, Klocke.
Ali, Hassan O. et al., "A Review of Electroless Gold Deposition Processes," *Gold Bull*, vol. 17, No. 4, pp. 118-127 (1984).
Benedetti, A.V. et al., "Electrochemical Studies of Copper, Copper-Aluminum and Copper-Aluminum-Silver Alloys: Impedance Results in 0.5M NaCl," *Electrochimica Acta*, Great Britain, vol. 40, pp. 000 (Mar. 1995).
Bindra, Perminder et al., "Fundamental Aspects of Electroless Copper Plating," *Electroless Plating Fundamentals & Application*, Noyes Data Corporation/Noyes Publications, pp. 289-375 (Jan. 1990).
Contolini et al., "Copper Electroplating Process for Sub-Half-Micron ULSI Structures," VMIC Conference 1995 ISMIC—04/95/0322, pp. 322-328 (Jun. 17-29, 1995).
Desilva, Melvin J., et al., "A Novel Seed Layer Scheme to Protect Catalytic Surfaces for Electroless Deposition," *J. Electrochem. Soc.*, vol. 143, No. 11, pp. 3512-3516 (Nov. 1996).
Despic, Aleksandar R., "Deposition and Dissolution of Metals and Alloys, Part B: Mechanisms, Kinetics, Texture, and Morphology" *Comprehensive Treatise of Electrochemistry vol. 7: Kinetics and Mechanisms of Electrode Processes*, Plenum Press, New York and London, pp. 451-527 (1983).
Devaraj et al., "Pulsed Electrodeposition of Copper," *Plating & Surface Finishing*, pp. 72-78 (Aug. 1992).
Dubin, V.M., "Electrochemical Deposition of Copper for On-Chip Interconnects," *Advanced MicroDevices*, 32 pgs.
Dubin, V.M. et al., "Copper Plating Techniques for ULSI Metallization," *Advanced Metallization and Interconnect Systems for ULSI Application in 1997: Materials Research Symposium Proceedings*, Materials Research Society, Warrendale, pp. 405-411 (Jan. 1998).
Dubin, V. et al., "Copper Electroplating for On-Chip Metallization," *Advanced Micro Devices*, Sunnyvale, 11 pgs.
Dublin, V.M. et al., "Sub-Half Micron Electroless Cu Metallization," *Materials Research Society Symposium Proceedings*, Materials Research Society, vol. 427, pp. 179-184 (Jan. 1996).
Dubin, V.M. et al., "Selective and Blanket Electroless Copper Deposition for Ultralarge Scale Integration," *J. Electrochem. Soc.*, The Electrochemical Society, Inc., vol. 144, No. 3, pp. 898-908 (Mar. 1997).
Fujinami, T. et al., "Electroless Copper Plating on PZT Ceramic," *Plating & Surface Finishing*, pp. 100-104 (May 1998).
Gabe, D.R., "Principles of Metal Surface Treatment and Protection," Pergamon Press, Great Britain, Second Edition, 198 pgs. (1978).
Gauvin et al., "The Effect of Chloride Ions on Copper Deposition," *J. of Electrochemical Society*, vol. 99, No. 2, pp. 71-75 (Feb. 1952).
Gignac, L.M. et al., "Characterization of Plated Cu Thin Film Microstructures," *Material Research Society Symposium Proceedings vol. 564: Advanced Interconnects and Contacts*, Materials Research Society, Warrendale, pp. 373-434 (Apr. 1999).
Kang, S. et al., "Relationship Between Texture and Surface Morphology of Copper Electrodeposits," *Plating & Surface Finishing*, pp. 67-70 (Oct. 1995).
Kelly, J.J. et al., "Copper Deposition in the Presence of Polyethylene Glycol: I. Quartz Crystal Microbalance Study," *J. Eletrochem. Soc.*, The Electrochemical Society, Inc., vol. 145, No. 10, pp. 3472-3481 (Oct. 1998).
Khera, R.P., "The Basic Principles of Electrolytic Deposition," Semi-Conductor Products Division, Motorola, Inc., McDowell Road, Phoenix, Arizona, pp. 69-84.
Krishnan, R.M. et al., "Electroplating of Copper from a Non-cyanide Electrolyte," *Plating & Surface Finishing*, vol. 82, No. 7, pp. 56-59 (Jul. 1995).
Kröger, R. et al., "Properties of Copper Films Prepared by Chemical Vapor Deposition for Advanced Metallization of Microelectronic Devices," *Journal of the Electrochemical Society*, vol. 146, No. 9, pp. 3248-3254 (1999).

Lee, Tien-Yu Tom et al., "Application of a CFD Tool in Designing a Fountain Plating Cell for Uniform Bump Plating of Semiconductor Wafers," *IEEE Transactions on Components Packaging and Manufacturing Technology*, vol. 19, No. 1, pp. 131-137 (Feb. 1996).

Lopatin, S. et al., "Electroless Cu and Barrier Layers for Sub-Half Micron Multilevel Interconnects," *Multilevel Interconnect Technology, Conference 3214, SPIE*, vol. 3214, pp. 21-32 (Oct. 1997).

Lopatin, S. et al., "Extendibility of Ion-Metal Plasma and Electroplating Technologies for Damascene-Based Copper Metallization," *Advanced Micro Devices, Sunnyvale*, 7 pgs.

Lopatin, S. et al., "Conformal Electroless Copper Deposition for Sub—0.5 µm Interconnect Wiring of Wiring of Very High Aspect Ratio," *Proceedings of the Third Symposium on Electrochemically Deposited Thin Films*, The Electrochemical Society, Inc., Pennington, vol. 96-19, pp. 271-288 (1997).

Lowenheim, F.A. et al. (Eds.), "Gold," *Modern Electroplating*, Third Edition, John Wiley & Sons, New York, pp. 224-244 (1974).

Lowenheim, F.A. et al. (Eds.), "Electroless Plating," *Modern Electroplating*, Third Edition, John Wiley & Sons, Inc., New York, pp. 710-747 (1974).

Lowenheim, F.A., "Plating on Nonconductors," *Electroplating*, McGraw-Hill Book Company, pp. 416-425 (1978).

Lowenheim, F.A., "Electrochemistry Applied to Electroplating," *Electroplating*, McGraw-Hill Book Company, New York, pp. 152-155 (1978).

Murarka, S.P. et al., "Copper Metallization for ULSI and Beyond," *Critical Reviews in Solid State and Materials Sciences*, Center for Integrated Electronics and Electronic Manufacturing, Rensselaer Polytechnic Institute, New York, vol. 20, No. 2, pp. 87-124 (1995).

Murarka, S.P., "Metallization: Theory and Practice for VLSI and ULSI," Butterworth-Heinemann, Stoneham, Maine, 256 pgs. (1993).

Nobe, K., "Electrodissolution Kinetics of Metals and Alloys," Department of Chemical Engineering, University of California, Los Angeles, 17 pgs.

Oskam, G. et al., "Electrochemical Deposition of Copper on a n-Si-TiN," *Journal of the Electrochemical Society*, vol. 146, No. 4, pp. 1436-1441 (1991).

Osero, N.M., "An Overview of Pulse Plating," *Plating and Surface Finishing*, pp. 20-22 (Mar. 1986).

Palmans, R. et al., "Development of an Electroless Copper Deposition Bath for Via Fill Applications on Tin Seed Layers," *Advanced Metallization for ULSI Applications in 1994: Materials Research Society Symposium Proceedings*, Materials Research Society, Pittsburgh, pp. 87-94 (Jan. 1995).

Passal, F., "Copper Plating During the Last Fifty Years," *Plating*, pp. 628-638 (Jun. 1959).

Patent Abstract of Japan, "Partial Plating Device," Publication No. 01234590, Publication Date: Sep. 19, 1989.

Patent Abstract of Japan, "Plating Method," Publication No. 57171690, Publication Date: Oct. 22, 1982.

Patent Abstract of Japan, English Abstract Translation—Japanese Utility Model No. 2538705, Publication Date: Aug. 25, 1992.

Patent Abstract of Japan, "Organic Compound and its Application," Publication No. 08-003153, Publication Date: Jan. 9, 1996.

Reid, J.D. et al., "Impedance Behavior of a Sulfuric Acid-Cupic Sulfate/Copper Cathode Interface," *J. Electrochem. Society: Electrochemical Science and Technology*, vol. 134, No. 6, pp. 1389-1394 (Jun. 1987).

Ritter et al., "Two- Three-Dimensional Numerical Modeling of Copper Electroplating for Advanced ULSI Metallization," *Solid-State Electronics*, vol. 44, pp. 797-807 (2000).

Sato, N., "Toward a More Fundamental Understanding of Corrosion Processes," *Corrosion*, National Association of Corrosion Engineers, vol. 45, No. 5, pp. 354-367 (May 1989).

Schlesinger, M. et al. (Eds.), "Electrodeposition of Gold," *Modern Electroplating*, Fourth Edition, John Wiley & Sons, Inc., pp. 201-225 (2000).

Schlesinger, M. et al. (Eds.), "Electroless Deposition of Nickel," *Modern Electroplating*, Fourth Edition, John Wiley & Sons, Inc., pp. 667-684 (2000).

Shacham-Diamand, Y., "Electroless Copper for Micropackaging and Ultralarge-Scale Integrated Circuit Applications," *Materials for Electronic Packaging*, Butterworth-Heinemann, Newton, Maine, pp. 221-240 (1995).

Shacham-Diamand, Y. et al., "Electroless Copper Deposition for ULSI," *Thin Solid Films 262*, Elsevier Science S.A., pp. 93-103 (1995).

Shacham-Diamand, Y. et al., "0.35 µm Cu-Filled Via Holes by Blanket Deposited Electroless Copper on Sputtered Seed Layer," SEMATECH, Austin, 3 pgs. (Jun. 27-29, 1995).

Singer, P., "Copper Goes Mainstream: Low k to Follow," *Semiconductor International*, pp. 67-70 (Nov. 1997).

Smy, T. et al., "Simulation of Electroless Deposition of Cu Thin Films for Very Large Scale Integration Metallization," *Journal of the Electrochemical Society*, The Electrochemical Society, Inc., vol. 144, No. 6, pp. 2115-2122 (Jun. 1997).

Steigerwald, J.M. et al., "Electrochemical Potential Measurements During the Chemical-Mechanical Polishing of Copper Thin Films," *Journal of the Electrochemical Society*, The Electrochemical Society, Inc., vol. 142, No. 7, pp. 2379-2385 (Jul. 1995).

Taylor, T. et al., "Electrolyte Composition Monitoring for Copper Interconnect Applications," Semitool, Inc., Kalispell, 26 pgs. (1998).

Wünsche, M. et al., "Morphology and Stability of Electrochemically Generated Copper Layers: The Effect of Electron Transfer and Nucleation Kinetics," *Circuits World*, vol. 22, No. 3, pp. 4-9 (1996).

Yoshiki, H. et al., "Adhesion Mechanism of Electroless Copper Film Formed on Ceramic Substrates Using ZnO Thin Film as an Intermediate Layer," *J. Electrochem. Soc.*, The Electrochemical Society, Inc., vol. 145, No. 5, pp. 1430-1434 (May 1998).

Yung, E.K. et al., "Fundamental Study of Acid Copper Through-Hole Electroplating Process," *J. Electrochem. Soc.*, The Electrochemical Society, Inc., vol. 136, No. 3, pp. 756-767 (Mar. 1989).

Yung, E.K. et al., "Plating of Copper into Through Holes and Vias," *J. Electrochem. Soc.*, The Electrochemical Society, Inc., vol. 136, No. 1, pp. 206-215 (Jan. 1989).

L'Augmentation Du Courant Limite Par Les Differentes Formes D'Electrodes, 20 pgs.

\* cited by examiner

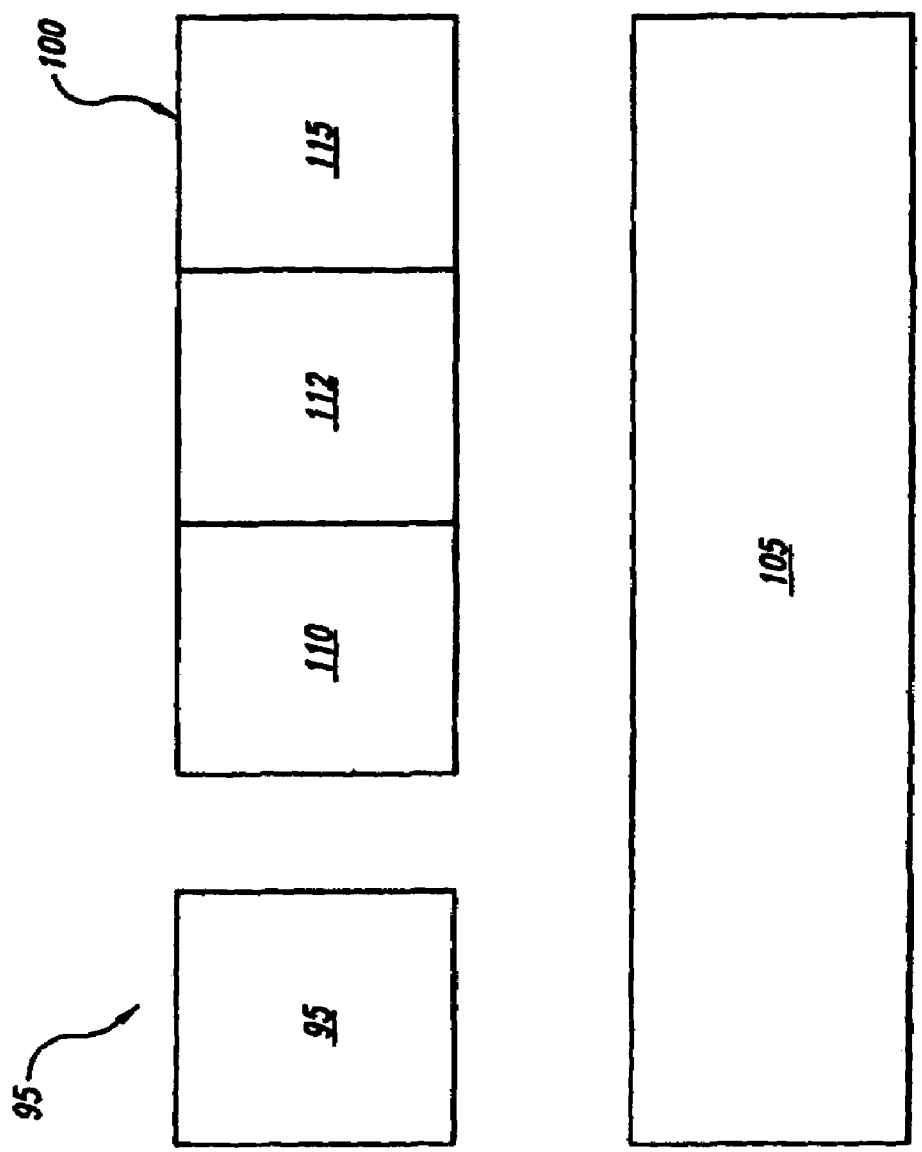

APPARATUS AND METHOD FOR ELECTROCHEMICALLY DEPOSITING METAL ON A SEMICONDUCTOR WORKPIECE

CROSS-REFERENCE TO RELATED APPLICATIONS

The present application is a continuation of U.S. patent application Ser. No. 10/377,397, filed Feb. 27, 2003, now U.S. Pat. No. 7,115,196, which is a division of U.S. patent application Ser. No. 09/732,513, filed Dec. 7, 2000, now U.S. Pat. No. 6,565,729, which is a continuation-in-part of U.S. patent application Ser. No. 09/387,099, filed Aug. 31, 1999, now U.S. Pat. No. 6,277,263, which is a continuation of International Patent Application No. PCT/US99/06306, filed Mar. 22, 1999, designating the United States, which is a continuation-in-part of U.S. patent application Ser. No. 09/045,245, filed Mar. 20, 1998, now U.S. Pat. No. 6,197,181, and claiming the benefit of U.S. Provisional Patent Application No. 60/085,675, filed May 15, 1998; and U.S. patent application Ser. No. 09/732,513 is also a continuation-in-part of International Patent Application No. PCT/US00/10120, filed Apr. 13, 2000, designating the United States and claiming the benefit of U.S. Provisional Patent Application Nos. 60/182,160, filed Feb. 14, 2000; 60/143,769, filed Jul. 12, 1999, and 60/129,055, filed Apr. 13, 1999; and U.S. patent application Ser. No. 09/732,513 claims the benefit of U.S. Provisional Patent Application No. 60/206,663, filed May 24, 2000, the disclosures of each of which are hereby expressly incorporated by reference.

FIELD OF THE INVENTION

The present invention relates to electrochemical processing of workpieces, and particularly for processes, apparatus and chemical solutions for depositing metals on microelectronic and micromechanical workpieces.

BACKGROUND OF THE INVENTION

In the fabrication of microelectronic devices, application of one or more metallization layers is often an important step in the overall fabrication process. The metallization may be used in the formation of discrete microelectronic components, such as read/write heads, but it is more often used to interconnect components formed on a workpiece, such as a semiconductor workpiece. For example, such structures are used to interconnect the devices of an integrated circuit.

A basic understanding of certain terms used herein will assist the reader in understanding the disclosed subject matter. To this end, basic definitions of certain terms, as used in the present disclosure, are set forth below.

Single Metallization Level is defined as a composite level of a workpiece that is exterior to the substrate. The composite level comprises one or more metal structures.

Substrate is defined as a base layer of material over which one or more metallization levels are disposed. The substrate may be, for example, a semiconductor, a ceramic, etc.

Workpiece is defined as an object that at least comprises a substrate, and may include further layers of material or manufactured components, such as one or more metallization levels, disposed on the substrate. The workpiece may be, for example, a semiconductor wafer, a micromechanical device, or other device.

An integrated circuit is an interconnected ensemble of devices formed within a semiconductor material and within a dielectric material that overlies a surface of the semiconductor. Devices which may be formed within the semiconductor include MOS transistors, bipolar transistors, diodes and diffused resistors. Devices which may be formed within the dielectric include thin-film resistors and capacitors. Typically, more than 100 integrated circuit die (IC chips) are constructed on a single 8 inch diameter silicon wafer. The devices utilized in each dice are interconnected by conductor paths formed within the dielectric. Typically, two or more levels of conductor paths, with successive levels separated by a dielectric layer, are employed as interconnections. In current practice, an aluminum alloy and silicon oxide are typically used for, respectively, the conductor and dielectric.

Delays in propagation of electrical signals between devices on a single die limit the performance of integrated circuits. More particularly, these delays limit the speed at which an integrated circuit may process these electrical signals. Larger propagation delays reduce the speed at which the integrated circuit may process the electrical signals, while smaller propagation delays increase this speed. Accordingly, integrated circuit manufacturers seek ways in which to reduce the propagation delays.

For each interconnect path, signal propagation delay may be characterized by a time delay $\tau$. See E. H. Stevens, *Interconnect Technology*, QMC, Inc., July 1993. An approximate expression for the time delay, $\tau$, as it relates to the transmission of a signal between transistors on an integrated circuit is given below.

$$\tau = RC[1 + (V_{SAT}/RI_{SAT})]$$

In this equation, R and C are, respectively, an equivalent resistance and capacitance for the interconnect path and $I_{SAT}$ and $V_{SAT}$ are, respectively, the saturation (maximum) current and the drain-to-source potential at the onset of current saturation for the transistor that applies a signal to the interconnect path. The path resistance is proportional to the resistivity, $\rho$, of the conductor material. The path capacitance is proportional to the relative dielectric permittivity, $K_e$, of the dielectric material. A small value of $\tau$ requires that the interconnect line carry a current density sufficiently large to make the ratio $V_{SAT}/RI_{SAT}$ small. It follows therefore, that a low-$\rho$ conductor which can carry a high current density and a low-$K_e$ dielectric must be utilized in the manufacture of high-performance integrated circuits.

To meet the foregoing criterion, copper interconnect lines within a low-$K_e$ dielectric will likely replace aluminum-alloy lines within a silicon oxide dielectric as the most suitable interconnect structure. See "Copper Goes Mainstream: Low-k to Follow", *Semiconductor International*, November 1997, pp. 67-70. Resistivities of copper films are in the range of 1.7 to 2.0 $\mu\Omega$cm.; resistivities of aluminum-alloy films are in the range of 3.0 to 3.5 $\mu\Omega$cm.

Despite the advantageous properties of copper, it has not been as widely used as an interconnect material as one would expect. This is due, at least in part, to the difficulty of depositing copper metallization and, further, due to the need for the presence of barrier layer materials. The need for a barrier layer arises from the tendency of copper to diffuse into silicon junctions and alter the electrical characteristics of the semiconductor devices formed in the substrate. Barrier layers made of, for example, titanium nitride, tantalum nitride, etc., must be laid over the silicon junctions and any intervening layers prior to depositing a layer of copper to prevent such diffusion.

A number of processes for applying copper metallization to semiconductor workpieces have been developed in recent years. One such process is chemical vapor deposition (CVD), in which a thin copper film is formed on the surface of the barrier layer by thermal decomposition and/or reaction of gas phase copper compositions. A CVD process can result in conformal copper coverage over a variety of topological profiles, but such processes are expensive when used to implement an entire metallization layer.

Another known technique, physical vapor deposition (PVD), can readily deposit copper on the barrier layer with relatively good adhesion when compared to CVD processes. One disadvantage of PVD processes, however, is that they result in poor (non-conformal) step coverage when used to fill microstructures, such as vias and trenches, disposed in the surface of the semiconductor workpiece. For example, such non-conformal coverage results in less copper deposition at the bottom and especially on the sidewalls of trenches in the semiconductor devices.

Inadequate deposition of a PVD copper layer into a trench to form an interconnect line in the plane of a metallization layer is illustrated in FIG. 1. As illustrated, the upper portion of the trench is effectively "pinched off" before an adequate amount of copper has been deposited within the lower portions of the trench. This result in an open void region that seriously impacts the ability of the metallization line to carry the electrical signals for which it was designed.

Electrochemical deposition of copper has been found to provide the most cost-effective manner in which to deposit a copper metallization layer. In addition to being economically viable, such deposition techniques provide substantially conformal copper films that are mechanically and electrically suitable for interconnect structures. These techniques, however, are generally only suitable for applying copper to an electrically conductive layer. As such, an underlying conductive seed layer is generally applied to the workpiece before it is subject to an electrochemical deposition process. Techniques for electrodeposition of copper on a barrier layer material have not heretofore been commercially viable.

The present inventors have recognized that there exists a need to provide copper metallization processing techniques that 1) provide conformal copper coverage with adequate adhesion to the barrier layer, 2) provide adequate deposition speeds, and 3) are commercially viable. These needs are met by the apparatus and processes of the present invention as described below.

BRIEF SUMMARY OF THE INVENTION

The present invention provides processes and apparatus for enhancing or repairing ultra-thin or incomplete metal seed layers that have been deposited on a workpiece, using electrolytic or electroless plating baths, in an electrodeposition reactor that is designed and adaptable for substrates having differing electrical properties.

One embodiment of the invention provides a process for applying a metallization interconnect structure to a workpiece on which an ultra-thin metal seed layer has been formed using a first deposition process. The first deposition process anchors the ultra-thin metal seed layer to an underlying layer, the ultra-thin metal seed layer having physical characteristics that render it generally unsuitable for bulk electrolytic deposition of a metal onto the metal seed layer. The process entails repairing the ultra-thin metal seed layer by electrochemically depositing additional metal on the ultra-thin metal seed layer within a principal fluid chamber of a reactor to provide an enhanced seed layer using a second deposition process. The second deposition process, which is different from the first deposition process, entails supplying electroplating power to a plurality of concentric anodes disposed at different positions within the principal fluid flow chamber relative to the workpiece. After seed layer repair, additional metal is deposited in an electrolytic bulk plating process onto the enhanced seed layer, under conditions in which the deposition rate of the electrolytic deposition process is substantially greater than the deposition rate of the process used to repair the metal seed layer.

Another embodiment of the invention provides a process for applying a metallization interconnect structure to a workpiece on which an ultra-thin metal seed layer has been formed using a first deposition process. The first deposition process anchors the ultra-thin metal seed layer to an underlying layer, the ultra-thin metal seed layer having physical characteristics that render it generally unsuitable for bulk electrolytic deposition of a metal onto the metal seed layer. The process entails repairing the ultra-thin metal seed layer by electrochemically depositing additional metal on the ultra-thin metal seed layer within a principal fluid chamber of a reactor to provide an enhanced seed layer using a second deposition process, that is different from the first deposition process. The second deposition process entails supplying electroplating power to a plurality of electrodes within the principal fluid flow chamber. At least two of the plurality of electrodes are independently connected to an electrical power supply. The supply of electrical power to the at least two electrodes is independently controlled during repair of the ultra-thin metal seed layer. After repair of the seed layer, additional metal is electrolytically deposited on the enhanced seed layer under conditions in which the deposition rate of the electrolytic deposition process is substantially greater than the deposition rate of the process used to repair the metal seed layer.

Another embodiment of the invention provides a process for applying a metallization interconnect structure to a workpiece on which an ultra-thin metal seed layer has been formed using a first deposition process. The first deposition process anchors the ultra-thin metal seed layer to an underlying layer, the ultra-thin metal seed layer having physical characteristics that render it generally unsuitable for bulk electrolytic deposition of a metal onto the metal seed layer. The process entails subjecting the workpiece to an electrochemical deposition process that is different from the first deposition process, in an alkaline electroplating bath. The alkaline electroplating bath includes metal ions complexed with a complexing agent such that additional metal is deposited on the ultra-thin copper seed layer to thereby repair the seed layer. This results in an enhanced seed layer. The second deposition process is carried out by supplying electroplating power to a plurality of concentric anodes disposed at different positions, relative to the workpiece, within a principal fluid flow chamber of a reactor. Thereafter, additional metal is deposited on the enhanced seed layer using an electrolytic bulk deposition process under conditions in which the deposition rate of the electrolytic deposition process is substantially greater than the deposition rate of the process used to repair the metal seed layer.

Another embodiment of the invention provides a process for applying a metallization interconnect structure to a workpiece on which an ultra-thin metal seed layer has been formed using a first deposition process. The first deposition process anchors the ultra-thin metal seed layer to an underlying layer, the ultra-thin metal seed layer having physical characteristics that render it generally unsuitable for bulk electrolytic deposition of a metal onto the metal seed layer. The process entails subjecting the workpiece to an electrochemical deposition process that is different from the first deposition process, in an alkaline electroplating bath. The bath includes metal ions complexed with a complexing agent such that additional metal is deposited on the ultra-thin copper seed layer to thereby repair the seed layer, resulting in an enhanced seed layer. The first deposition process entails supplying electroplating power to a plurality of electrodes within the principal fluid flow chamber, wherein at least two of the plurality of electrodes are independently connected to an electrical power supply. The supply of electrical power to the at least two electrodes is independently controlled during repair of the ultra-thin metal seed layer. Thereafter additional metal is electrolytically deposited on the enhanced seed layer under conditions in which the deposition rate of the electrolytic deposition process is substantially greater than the deposition rate of the process used to repair the metal seed layer.

Another embodiment of the invention provides a process for applying a metallization interconnect structure to a workpiece on which an ultra-thin metal seed layer has been formed using a first deposition process. The first deposition process anchors the ultra-thin metal seed layer to an underlying layer, the ultra-thin metal seed layer having physical characteristics that render it generally unsuitable for bulk electrolytic deposition of a metal onto the metal seed layer. The process entails repairing the ultra-thin metal seed layer by electrochemically depositing additional metal on the ultra-thin metal seed layer within a principal fluid chamber of a reactor to provide an enhanced seed layer using a second deposition process, that is different from the first deposition process. During repair, the workpiece is exposed to an electroplating solution within a fluid flow chamber of a reactor. The fluid flow chamber defines a sidewall and a plurality of nozzles disposed in the sidewall and arranged and directed to provide vertical and radial fluid flow components that combine to create a substantially uniform normal flow component radially across a surface of the workpiece on which the ultra-thin metal seed layer is formed. Thereafter, additional metal is electrolytically deposited on the enhanced seed layer under conditions in which the deposition rate of the deposition process is substantially greater than the deposition rate of the process used to repair the metal seed layer.

Another embodiment of the invention provides a process for applying a metallization interconnect structure to a workpiece on which an ultra-thin metal seed layer has been formed using a first deposition process. The first deposition process anchors the ultra-thin metal seed layer to an underlying layer, the ultra-thin metal seed layer having physical characteristics that render it generally unsuitable for bulk electrolytic deposition of a metal onto the metal seed layer. The process entails subjecting the workpiece to an electrochemical deposition process that is different from the first deposition process, in an alkaline electroplating bath. The bath includes metal ions complexed with a complexing agent such that additional metal is deposited on the ultra-thin copper seed layer to thereby repair the seed layer, resulting in an enhanced seed layer. During repair, the workpiece is exposed to an electroplating solution within a fluid flow chamber of a reactor, the fluid flow chamber defining a sidewall and a plurality of nozzles disposed in the sidewall and arranged and directed to provide vertical and radial fluid flow components that combine to create a substantially uniform normal flow component radially across a surface of the workpiece on which the ultra-thin metal seed layer is formed. Thereafter, additional metal is deposited on the enhanced seed layer under electrolytic plating conditions in which the deposition rate of the deposition process is substantially greater than the deposition rate of the process used to repair the metal seed layer.

Another embodiment of the invention provides a process for applying a metallization interconnect structure to a workpiece on which an ultra-thin metal seed layer has been formed using a first deposition process. The first deposition process anchors the ultra-thin metal seed layer to an underlying layer, the ultra-thin metal seed layer having physical characteristics that render it generally unsuitable for bulk electrolytic deposition of a metal onto the metal seed layer. The process entails repairing the ultra-thin metal seed layer by electrochemically depositing additional metal on the ultra-thin metal seed layer within a principal fluid chamber of a reactor to provide an enhanced seed layer using a second electrolytic or electroless deposition process, that is different from the first deposition process. Thereafter, additional metal is electrolytically deposited in bulk on the enhanced seed layer under conditions in which the deposition rate of the electrolytic deposition process is substantially greater than the deposition rate of the process used to repair the metal seed layer. The bulk deposition process entails supplying electroplating power to a plurality of concentric anodes disposed at different positions within the principal fluid flow chamber relative to the workpiece.

Another embodiment of the invention provides a process for applying a metallization interconnect structure to a workpiece on which an ultra-thin metal seed layer has been formed using a first deposition process. The first deposition process anchors the ultra-thin metal seed layer to an underlying layer, the ultra-thin metal seed layer having physical characteristics that render it generally unsuitable for bulk electrolytic deposition of a metal onto the metal seed layer. The process entails repairing the ultra-thin metal seed layer by electrolytically or electrolessly depositing additional metal on the ultra-thin metal seed layer to provide an enhanced seed layer using a second deposition process, that is different from the first deposition process. Thereafter, additional metal is electrolytically bulk deposited on the enhanced seed layer within a principal fluid chamber of a reactor under conditions in which the deposition rate of the electrolytic deposition process is substantially greater than the deposition rate of the process used to repair the metal seed layer. The bulk deposition entails supplying electroplating power to a plurality of electrodes within the principal fluid flow chamber, wherein at least two of the plurality of electrodes are independently connected to an electrical power supply. The supply of electrical power to the at least two electrodes is independently controlled during deposition.

Another embodiment of the invention provides a process for applying a metallization interconnect structure to a workpiece on which an ultra-thin metal seed layer has been formed using a first deposition process. The first deposition process anchors the ultra-thin metal seed layer to an underlying layer, the ultra-thin metal seed layer having physical characteristics that render it generally unsuitable for bulk electrolytic deposition of a metal onto the metal seed layer. The process entails repairing the ultra-thin metal seed layer by electrochemically depositing additional metal on the ultra-thin metal seed layer to provide an enhanced seed layer using a second deposition process, that is different from the first deposition process. Thereafter, additional metal is electrochemically bulk deposited on the enhanced seed layer within a principal fluid chamber of a reactor under conditions in which the deposition rate of the deposition process is substantially greater than the deposition rate of the process used to repair the metal seed layer. The bulk deposition entails exposing the workpiece to an electroplating solution within a fluid flow chamber of a reactor, the fluid flow chamber defining a sidewall and a plurality of nozzles disposed in the sidewall and arranged and directed to provide vertical and radial fluid flow components that combine to create a substantially uniform normal flow component radially across a surface of the workpiece on which the ultra-thin metal seed layer is formed.

The present invention employs a novel approach to the metallization of a workpiece, such as a semiconductor workpiece. In accordance with the invention, an alkaline electroplating bath is suitably used to electroplate metal onto a seed layer, electroplate metal directly onto a barrier layer material, or repair (i.e., enhance) an ultra-thin copper seed layer which has been deposited on the barrier layer using a deposition process such as PVD or CVD. The metal deposition in the alkaline bath suitably takes place in a reactor including a plurality of electrodes. In a first embodiment the electrodes are concentric annular anodes arranged at differing positions relative to the workpiece. In a second embodiment, the plurality of electrodes are independently controlled for greater uniformity in metal deposition across the workpiece. In a third embodiment, the reactor is configured to induce a helical flow pattern in the plating bath solution during deposition.

The resulting metal layer provides an excellent conformal copper coating that fills trenches, vias, and other microstructures in the workpiece. When used for seed layer enhancement, the resulting metal seed layer provides an excellent conformal metal coating that allows the microstructures to be filled with a copper layer having good uniformity using electrochemical deposition techniques. Further, metal layers that are electroplated in the disclosed manner exhibit low sheet resistance and are readily annealed at low temperatures.

The disclosed process, as noted above, is applicable to a wide range of steps used in the manufacture of a metallization layer in a workpiece. The workpiece may, for example, be a semiconductor workpiece that is processed to form integrated circuits or other microelectronic components, or a micromechanical device. Without limitation as to the applicability of the disclosed invention, a process for enhancing a seed layer is described.

A process for applying a metallization interconnect structure to a workpiece having a barrier layer deposited on a surface thereof is also set forth. The process includes the forming of an ultra-thin metal seed layer on the barrier layer. The ultra-thin seed layer has a thickness of less than or equal to about 500 Angstroms and may be formed from any material that can serve as a seed layer for subsequent metal deposition. Such metals include, for example, copper, copper alloys, aluminum, aluminum alloys, nickel, nickel alloys, zinc, chromium, tin, gold, silver, lead, cadmium, platinum, palladium, iridium and ruthenium, etc. The ultra-thin seed layer is then enhanced or repaired by depositing additional metal thereon in a separate deposition step to provide an enhanced seed layer that is suitable for use in a primary metal deposition. The metal deposition in the alkaline bath suitably takes place in a reactor including a plurality of electrodes. In a first embodiment the electrodes are concentric annular anodes arranged at differing positions relative to the workpiece. In a second embodiment, the plurality of electrodes are independently controlled for greater uniformity in metal deposition across the workpiece. In a third embodiment, the reactor is configured to induce a helical flow pattern in the plating bath solution during deposition. The enhanced seed layer has a thickness at all points on sidewalls of substantially all recessed features distributed within the workpiece that is equal to or greater than about 10% of the nominal seed layer thickness over an exteriorly disposed surface of the workpiece.

In accordance with a specific embodiment of the process, a copper-containing metallization interconnect structure is formed. To this end, the ultra-thin seed layer is enhanced or repaired by subjecting the semiconductor workpiece to an electrochemical copper deposition process in which an alkaline bath having a complexing agent is employed. The copper complexing agent may be at least one complexing agent selected from a group consisting of EDTA, ED, and a polycarboxylic acid such as citric acid or salts thereof.

In an alternate embodiment, the seed layer may be enhanced by using an electroless plating bath composition, such as an electroless copper sulfuric acid bath.

BRIEF DESCRIPTION OF THE SEVERAL VIEWS OF THE DRAWINGS

FIG. 7 is a schematic representation of a portion of a semiconductor manufacturing line suitable for implementing the disclosed seed layer enhancement steps.

DETAILED DESCRIPTION OF THE INVENTION

The present invention employs a novel approach to applying copper metallization to a workpiece, such as a semiconductor workpiece. In accordance with the invention, an alkaline electrolytic or electroless bath containing a metal ion to be deposited, such as an alkaline electrolytic copper bath is used to electroplate metal onto a seed layer, electroplate metal directly onto a barrier layer material, or enhance or repair an ultra-thin metal seed layer which has been deposited on the barrier layer using a deposition process such as CVD or PVD. After enhancement of the ultra-thin metal seed layer, additional metal is suitable deposited, under differing conditions onto the enhanced seed layer, in a bulk fill process.

The present invention pertains to processes for applying a metallization layer. Although the disclosed method may be used in connection with a substantial number of different metal compositions, the specific embodiment disclosed herein is directed to the application of a copper-containing metallization layer. To this end, an alkaline electrolytic copper bath is used to enhance an ultra-thin copper seed layer which has been deposited on a barrier layer using a deposition process such as PVD. The enhanced copper seed layer provides an excellent conformal copper coating that allows trenches and vias to be subsequently bulk filled with a copper layer having good uniformity using electrochemical deposition techniques.

The seed layer enhancement process, or the bulk fill process, or both processes, are suitably carried out in a reactor that includes a plurality of anodes. The plurality of anodes may be arranged concentrically, or may be individually controlled with respect to applied voltage potential or current, to effect the uniformity of metal deposition across the workpiece. The seed layer enhancement and/or the bulk fill may also be carried out in a reactor that includes one or more jets, through which process fluid is introduced into a reaction chamber. The jets are angularly disposed relative to a chamber sidewall to create vertical and radial fluid flow components that combine to provide a substantially uniform normal flow component radially across a surface of the workpiece on which the metal is deposited. These processes and reactors in which they are suitable carried out will be described subsequently herein below.

Figure 1:
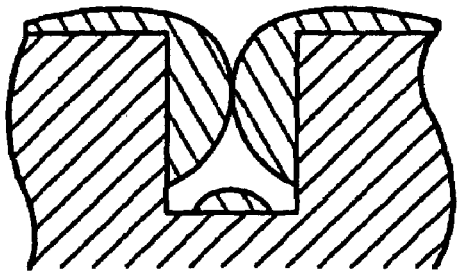
FIG. 1 is a cross-sectional view illustrating an interconnect line formed completely by PVD copper.
Figure 2A:
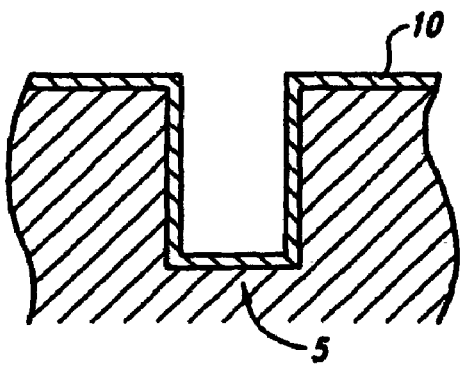
FIGS. 2A-2E are cross-sectional views through a semiconductor workpiece illustrating the various layers of material as they are applied in accordance with one embodiment of the present invention.

A cross-sectional view of a micro-structure, such as trench 5, that is to be filled with copper metallization is illustrated in FIG. 2A and will be used to describe the seed layer enhancement aspects of the present invention. As shown, a thin barrier layer 10 of, for example, titanium nitride or tantalum nitride is deposited over the surface of a semiconductor device or, as illustrated in FIG. 2A, over a layer of a dielectric 8, such as silicon dioxide. The barrier layer 10 acts to prevent the migration of copper to any semiconductor device formed in the substrate. Any of the various known techniques, such as CVD or PVD, can be used to deposit the barrier layer depending on the particular barrier material being used. Suitably, the thickness for the barrier layer is approximately 100 to 300 Angstroms.

Figure 2B:
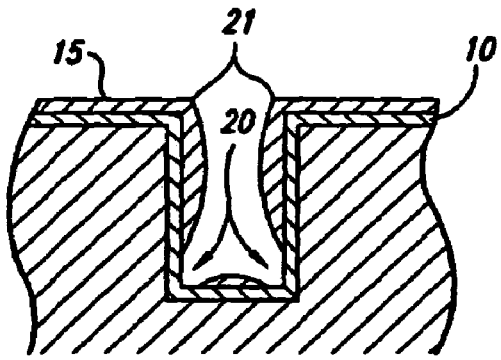

After the deposition of the barrier layer, an ultra-thin copper seed layer 15 is deposited on the barrier layer 10. The resulting structure is illustrated in FIG. 2B. Suitably, the copper seed layer 15 is formed using a vapor deposition technique, such as CVD or PVD. In order to have adequate adhesion and copper coverage, a relatively thick (1000 Angstroms) copper seed layer is usually required. Such a thick seed layer leads to problems with close-off of small geometry trenches, however, when a PVD deposition process is employed for applying the seed layer.

Contrary to traditional thoughts regarding seed layer application, the copper seed layer 15 of the illustrated embodiment is ultra-thin, having a thickness of about 50 to about 500 Angstroms, suitably about 100 to about 250 Angstroms, and still more suitably about 200, Angstroms. The ultra-thin copper seed layer can be deposited using a CVD or a PVD process, or a combination of both. PVD is the preferred application process, however, because it can readily deposit copper on the barrier layer 10 with relatively good adhesion. By depositing an ultra-thin seed layer of copper, rather than the relatively thick seed layer used in the prior art, pinching off of the trenches can be avoided.

The use of an ultra-thin seed layer 15 generally introduces its own set of problems. One of the most significant of these problems is the fact that such ultra-thin layers do not generally coat the barrier layer 10 in a uniform manner. Rather, voids or non-continuous seed layer regions on the sidewalls, such as at 20, are often present in an ultra-thin seed layer 15 thereby resulting in the inability to properly apply a subsequent electrochemically deposited copper layer in the regions 20. Further, ultra-thin seed layers tend to include spikes, such as at 21, that impact the uniformity of the subsequent electrolytically deposited metal layer. Such spikes 21 result in high potential regions at which the copper deposits at a higher rate than at other, more level regions. As such, the seed layer 15 is not fully suitable for the traditional electroplating techniques typically used after application of a seed layer.

The present inventors have found that an ultra-thin seed layer can be employed if it is combined with a subsequent electrochemical seed layer enhancement technique. In a first embodiment, the electrochemical enhancement technique is an electroplating technique using an alkaline plating bath. An alternate embodiment of electrochemical deposition to enhance or repair an ultra-thin or otherwise incomplete or deficient seed layer uses an electroless plating bath. Electroless plating baths are well known in the art, such as electroless copper sulfuric acid baths, and are used in accordance with the present invention to deposit additional metal on the initial ultra-thin seed layer to repair or enhance the seed layer.

Figure 2C:
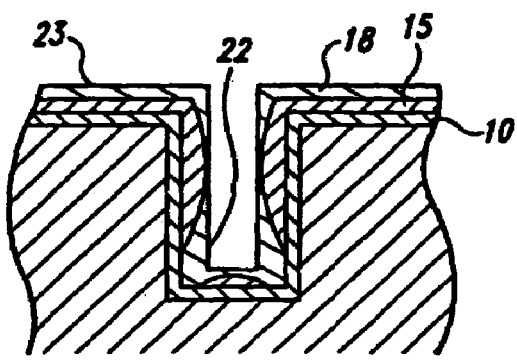

The preferred technique of electroplating in an alkaline bath to repair or enhance a seed layer will now be described. To this end, the semiconductor workpiece is subject to a subsequent process step in which a further amount of copper 18 is applied to the ultra-thin seed layer to thereby enhance the seed layer. A seed layer enhanced by the additional deposition of copper is illustrated in FIG. 2C. As shown in FIG. 2C, the void or non-continuous regions 20 of FIG. 2B have been filled thereby leaving substantially all of the barrier layer 10 covered with copper.

Suitably, the seed layer enhancement process continues until a sidewall step coverage, i.e., the ratio of the seed layer thickness at the bottom sidewall regions 22 to the nominal thickness of the seed layer at the exteriorly disposed side 23 of the workpiece, achieves a value of at least 10%. More suitably, the sidewall step coverage is at least about 20%. Such sidewall step coverage values are present in substantially all of the recessed structures of the semiconductor workpiece. It will be recognized, however, that certain recessed structures distributed within the semiconductor workpiece may not reach these sidewall step coverage values. For example, such structures disposed at the peripheral edges of a semiconductor wafer may not reach these step coverage values. Similarly, defects or contaminants at the situs of certain recessed structures may prevent them from reaching the desired coverage values. The nominal thickness of the enhanced seed layer at the exteriorly disposed side of the workpiece is suitably in the range of 500 angstroms 1600 angstroms.

Although the embodiment of the process disclosed herein is described in connection with copper metallization, it is understood that the basic principle of the enhancement of an ultra-thin seed layer prior to the bulk deposition thereof can be applied to other metals or alloys that are capable of being electroplated. Such metals include iron, nickel, cobalt, zinc, copper-zinc, nickel-iron, cobalt-iron, etc.

The embodiments disclosed above utilize depositing a metal, such as copper, during seed layer enhancement. It should be understood that alternately a metal alloy, such as a copper alloy may be applied. The alloy is suitably selected to include an element or elements that preferentially locate at the interfaces between differing materials, which enhances anchorage of the materials, and also may lead to improved electromigration effect.

A thermal processing step may also be employed after seed layer enhancement deposition, at an elevated temperature selected to cause material diffusion at the interfaces between materials, thereby anchoring the materials or components thereof together.

Figure 3:
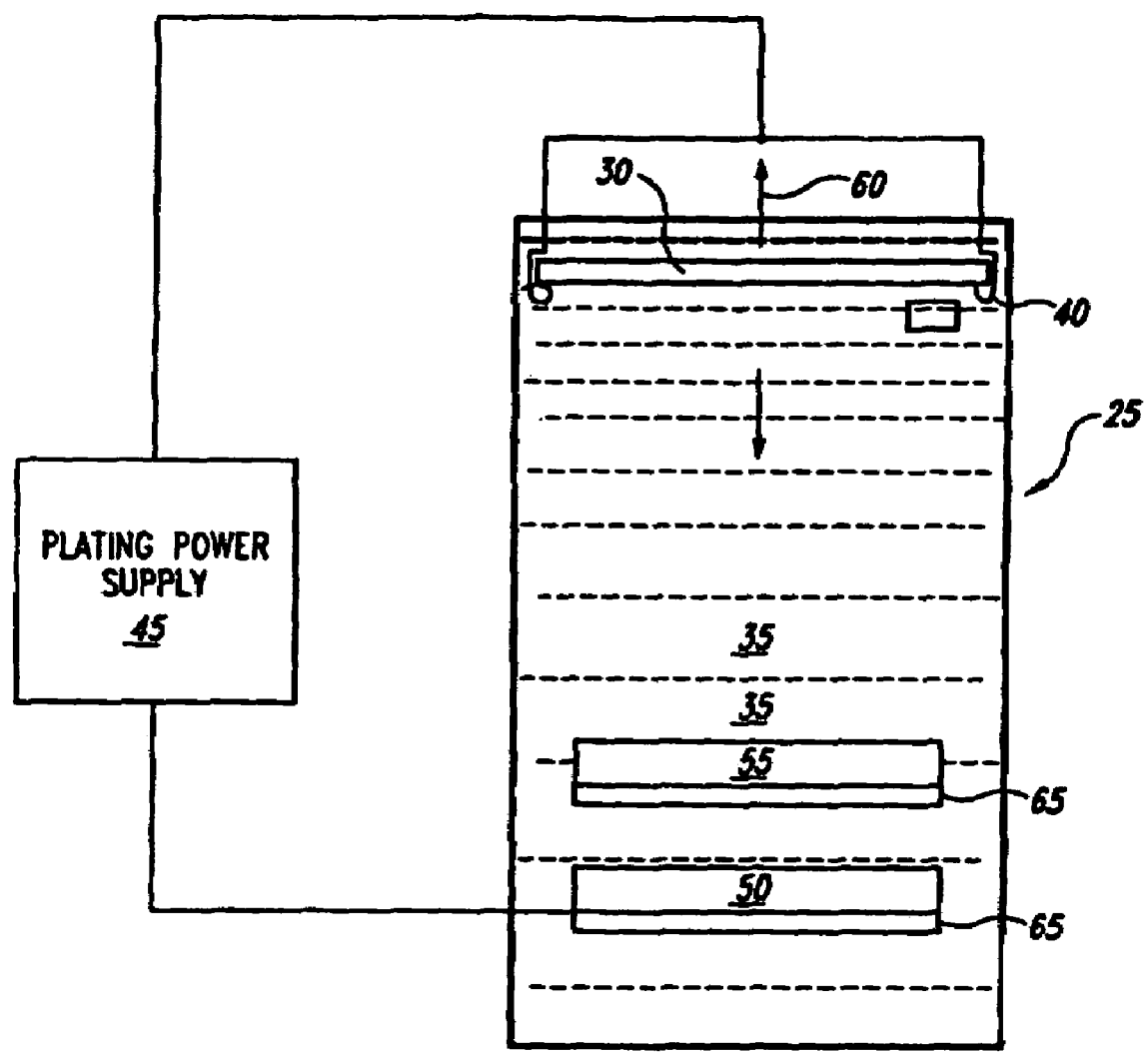
FIG. 3 is a schematic representation of a first reactor suitable for enhancing an ultra-thin seed layer.

A schematic representation of a reactor 25 suitable for enhancing the ultra-thin copper seed layer is illustrated in FIG. 3. It will be recognized that this apparatus is also suitable for applying a blanket plating layer and/or full-fill plating of recessed micro-structures. As shown, a semiconductor workpiece, such as a semiconductor wafer 30, is positioned face down in a bath 35 of electroplating solution. One or more contacts 40 are provided to connect the wafer 30 to a plating power supply 45 as a cathode of an electroplating cell. An anode 50 is disposed in the bath 35 and is connected to the plating power supply 45. Suitably, a diffuser 55 is disposed between the anode 50 and the wafer/cathode 30. The wafer 30 may be rotated about axis 60 during the enhancement process. Anode 50 may be provided with a dielectric shield 65 at a backside thereof which faces an incoming stream of plating bath fluid. Alternate and preferred reactors for use in the present invention will be described subsequently herein below.

A. Electroplating Solutions and Processes

As noted above, certain aspects of the present invention relate to new and useful plating solutions. These solutions can be used for blanket plating, full-fill of the recessed micro-structures, seed layer enhancement, etc. The preferred electrolytic bath solution for enhancing the seed layer is an alkaline copper bath in which copper ions are complexed with a complexing agent. A suitable composition and range of concentrations for the various components of the plating bath include the following:

1. Copper sulfate: 0.03M to 0.25M (suitably, 0.04);
2. Complexing agent: complex to metal ratios from 1 to 4, suitably 2;
3. Boric acid: 0.01M to 0.5M, suitably 0.05M; and
4. pH: 5-13, suitably 9.5.

A suitable source of copper ions is copper sulfate ($CuSO_4$). The concentration of copper sulfate in the bath is suitably within the range of 0.03 to 0.25 M, and is more suitably about 0.1 M.

Complexing agents that are suitable for use in the present invention form a stable complex with copper ions and prevent the precipitation of copper hydroxide. Ethylene diamine tetracetic acid (EDTA), ethylene diamine (ED), citric acid, and their salts have been found to be particularly suitable copper complexing agents. The molar ratio of complexing agent to copper sulfate in the bath is suitably within the range of 1 to 4, and is suitably about 2. Such complexing agents can be used alone, in combination with one another, or in combination with one or more further complexing agents.

The electrolytic bath is suitably maintained at a pH of at least 9.0. Potassium hydroxide, ammonium hydroxide, tetramethylammonium hydroxide, or sodium hydroxide is utilized to adjust and maintain the pH at the desired level of 9.0 or above. A suitable pH for a citric acid or ED bath is about 9.5, while a suitable pH for an EDTA bath is about 12.5. As noted above, the complexing agent assists in preventing the copper from precipitating at the high pH level.

Additional components can be added to the alkaline copper bath. For example, boric acid ($H_3BO_3$) aids in maintaining the pH at 9.5 when citric acid or ED is used as the complexing agent, and provides brighter copper deposits when added to an electrolytic bath containing EDTA as the complexing agent. If boric acid is added, its concentration in the bath is suitably within the range of 0.01 to 0.5 M.

In general, the temperature of the bath can be within the range of 20 to 35° C., with 25° C. being a suitable temperature. The current density for electrolytically depositing copper to enhance the copper seed layer can be 1 to 5 milliamps/$cm_2$, while a plating time of about 1 to about 5 minutes is sufficient to enhance the copper seed layer. The plating waveform may be, for example, a forward periodic pulse having a period of 2 msec at a 50% duty cycle.

An amine free acid complexing agent, for example, a polycarboxylic acid, such as citric acid, and salts thereof, is preferable to the use of EDTA or ED. EDTA and ED include amine groups. These amine groups often remain on the surface of the semiconductor workpiece after rinsing and drying of the wafer. Subsequent processes, particularly such processes as photolithographic processes, may be corrupted by the reactions resulting from the presence of these amine groups. The amine groups may, for example, interfere with the chemical reactions associated with th exposing and/or curing of photoresist materials. As such, amine free complexing agents are particularly suitable in processes in which a photolithographic process follows an electrodeposition process.

Figure 4A:
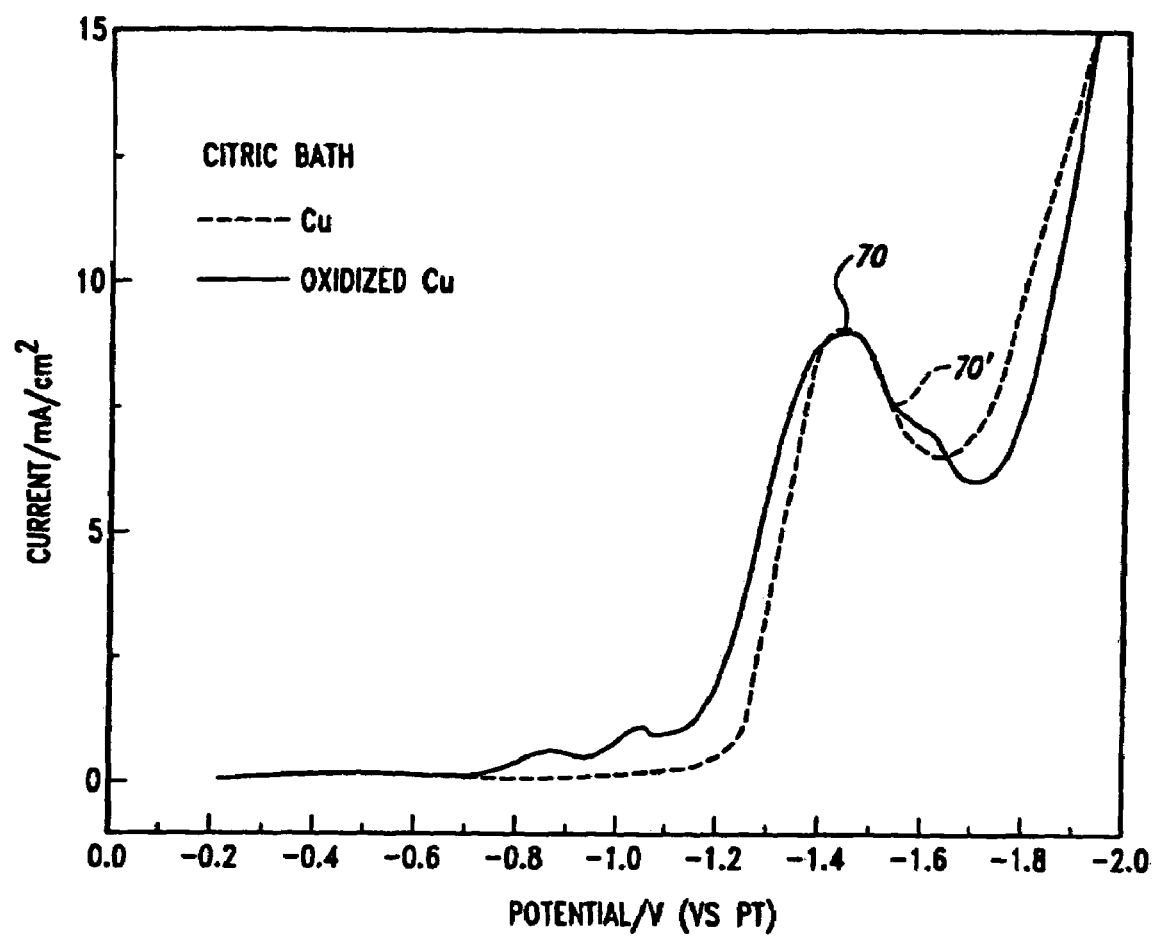
FIG. 4A is a graph illustrating the current-potential curves of a plating solution using a polycarboxylic acid, such as citric acid, as a complexing agent.
Figure 4B:
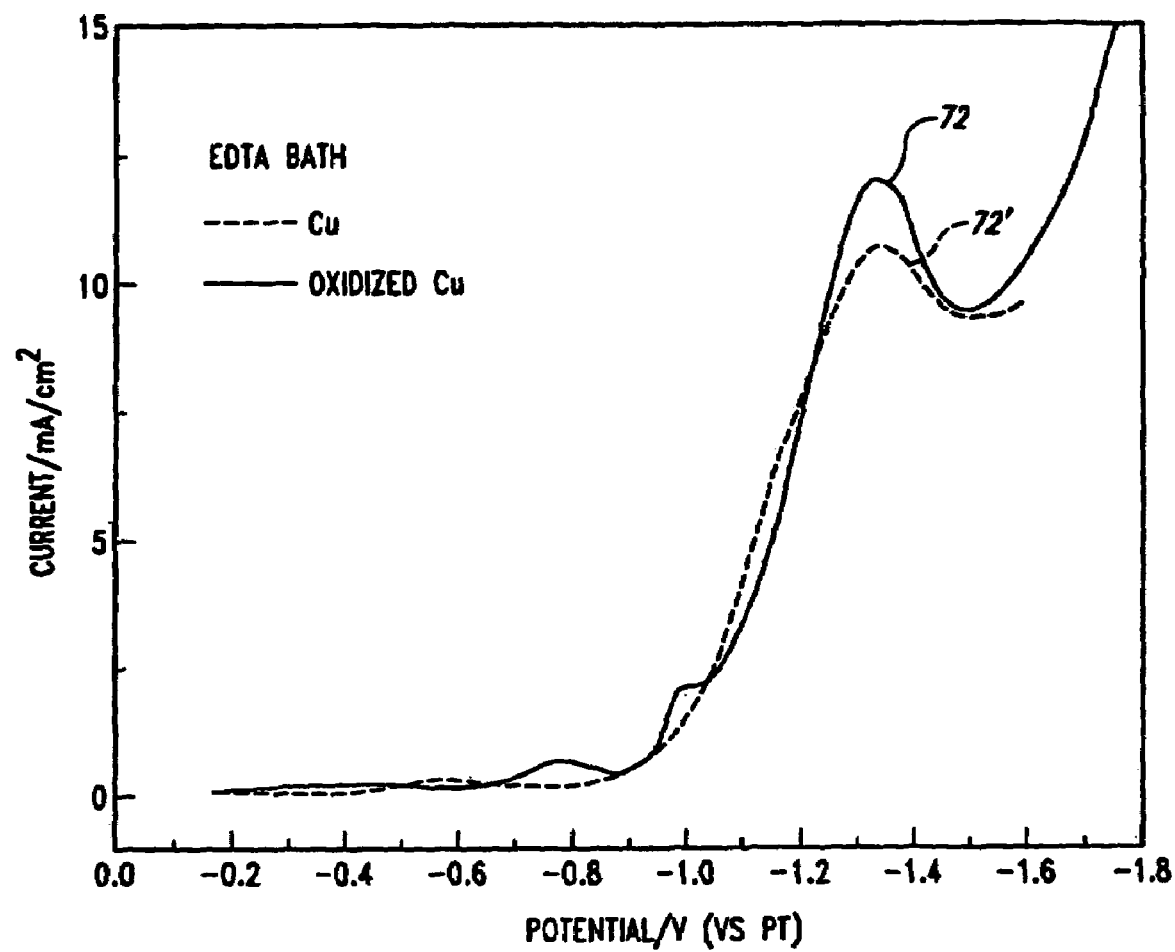
FIG. 4B a graph illustrating the current-potential curves of a plating solution using EDTA, an amine-containing plating solution, as the complexing agent.

A further advantage of using a polycarboxylic acid, such as citric acid, stems from the fact that the magnitude of the voltage potential at which the copper is plated is greater than the magnitude of the voltage potential at which the copper is plated in a bath containing EDTA. This is illustrated in FIGS. 4A and 4B where FIG. 4A is a current-potential graph for a citric acid bath, and FIG. 4B is a current-potential graph for an EDTA bath. Electroplating takes place at the voltage where the corresponding current increases abruptly. This plating voltage is referred to as the deposition potential, which is approximately −1.25 volts as shown in FIG. 4A for a bath employing citric acid as the complexing agent, and is approximately −1.0 volts as shown in FIG. 4B for a bath employing EDTA as the complexing agent. The current peaks (70 70' for the a bath containing a citric acid, and 72, 72' for the bath containing the EDTA) are the limiting currents which are mainly determined by mass transfer and the concentration of copper ions in the plating solutions. As illustrated, the magnitude of the current and the particular plating potential is slightly dependent on the substrate material. The different substrate results are illustrated in FIGS. 4A and 4B, where 70 and 72 are the curves for a copper substrate material, and 70' and 72' are curves for a copper substrate material comprised of copper with a copper oxide coating. It is noted that additional peaks occur on oxidized copper in the same electrolytes. These peaks are related to the electrochemical reduction of copper oxide to metallic copper before the alkaline electrochemical copper deposition.

It is believed that a copper layer plated at a higher plating potential in an alkaline bath provides greater adhesion to the underlying barrier layer than a copper layer plated at a lower plating potential in an acid bath. For copper to adhere to the barrier material, it is thought that copper ions must impinge on the barrier surface with sufficient energy to penetrate a thin oxidized or contaminated layer at the barrier surface. It is therefore believed that a copper layer deposited at a higher magnitude plating potential adhere is better to the exposed barrier layer during the plating process when compared to a layer plated using a smaller magnitude plating potential. This factor, combined with the inter-copper chemical bond between the PVD copper and the electrochemically deposited copper provides for an enhanced seed layer having excellent electrical as well as barrier adhesion properties. Such characteristics are also desirable for films used in blanket plating, full-fill plating, pattern plating, etc.

It has been found that the resistivity of the deposited copper film is directly related to the resistivity of the plating bath solution. Additives that assist in lowering the resistivity of the solution therefore provide a corresponding reduction in the resistivity of the deposited film.

Figure 4C:
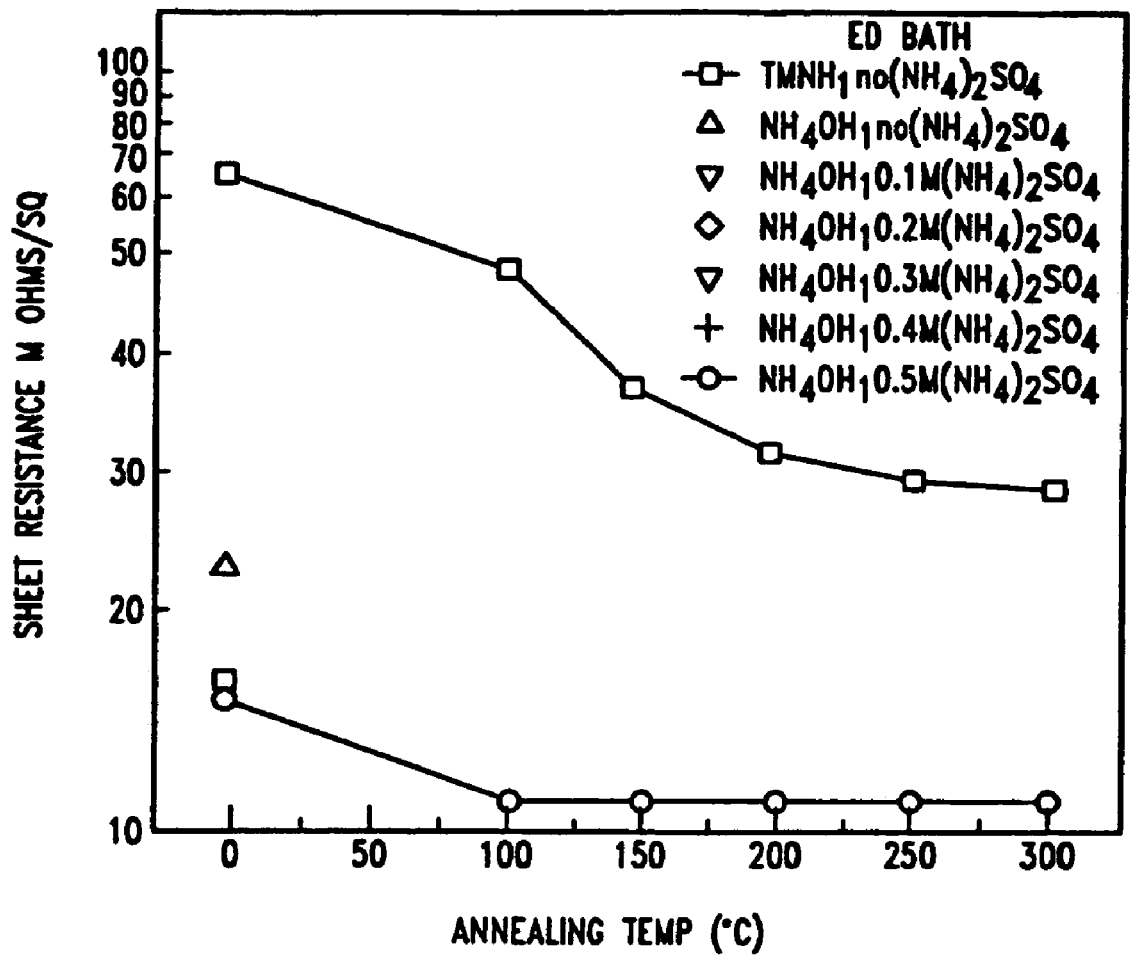
FIG. 4C is a graph of sheet resistance change with annealing temperature for copper films deposited from a bath solution with and without ammonium sulfate.

Experimental results indicate that addition of ammonium sulfate significantly reduces the resistivity of the plating bath solution and, as such, the deposited film. The sheet resistance obtained for different amounts of ammonium sulfate are compared in the graph FIG. 4C. As can be seen, the highest sheet resistance, either with or without annealing at high temperatures, was obtained in the bath containing no ammonium sulfate. If ammonium hydroxide was used to adjust pH in which a trace amount of ammonium sulfate is introduced to the bath, the sheet resistance was reduced from 76 to 23. As the concentration of ammonium sulfate increased from 0.1 M to 0.5 M, the sheet resistance continuously decreased in a corresponding manner.

Figure 4D:
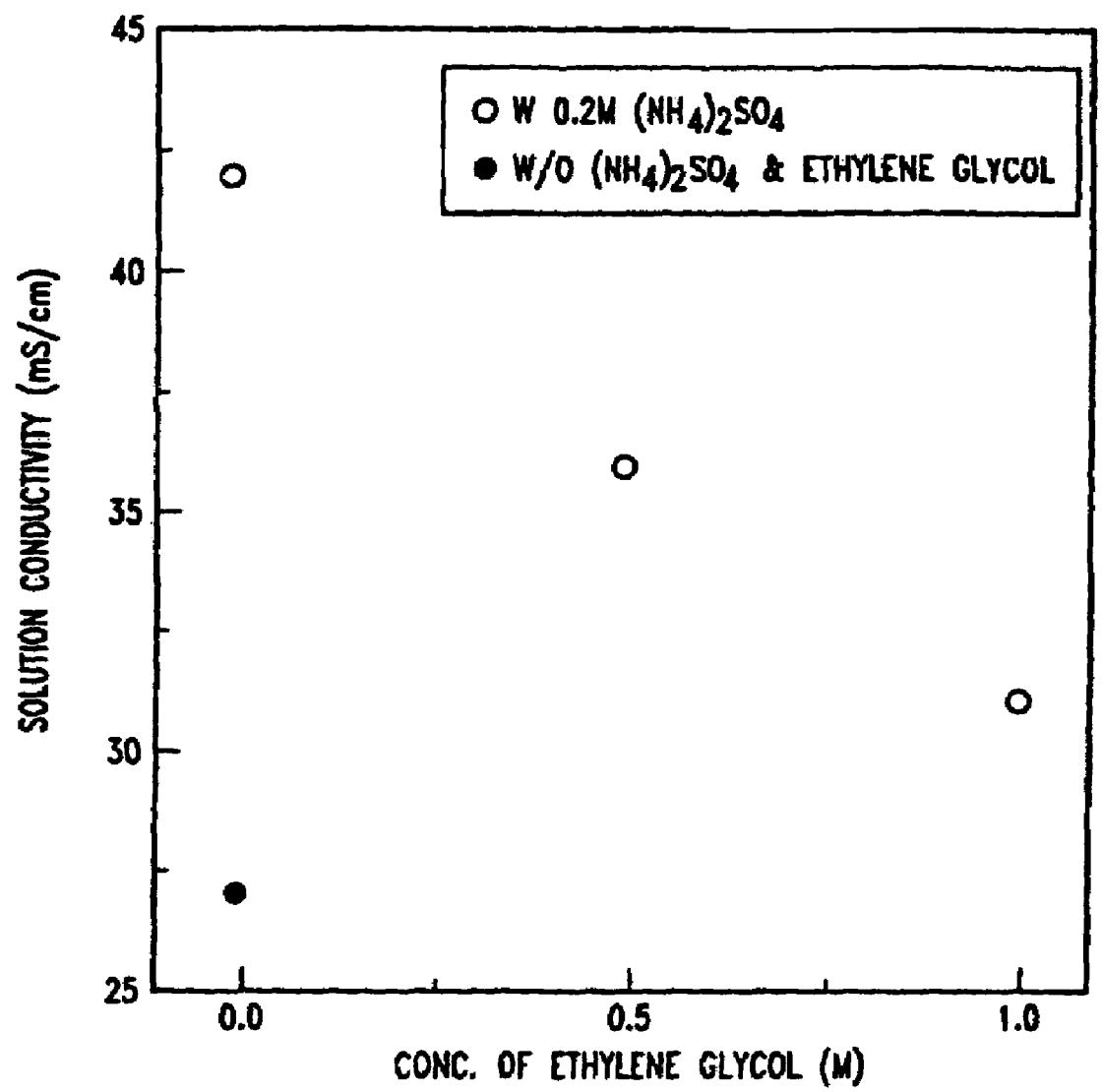
FIG. 4D is a graph illustrating plating solution conductivity as a function of ethylene glycol concentration in collating solutions with and without ammonium sulfate.

Although ammonium sulfate assists in reducing the sheet resistance of the deposited copper layer, experimental results indicate that it reduces the conformality of the resulting copper film. However, the addition of ethylene glycol to the ammonium sulfate containing solution substantially increases the conformality of the resulting deposit. FIG. 4D illustrates the relationship between the concentration of ethylene glycol and the conductivity of a plating solution containing 0.2M the of ammonium sulfate.

A suitable composition and range of concentrations for the various components of a plating bath having ammonium sulfate include the following:

1. Copper sulfate: 0.03M to 0.5M (suitably, 0.25M);
2. Complexing agent: complex to metal ratios from 1 to 4, suitably 2 using ED;
3. Ammonium sulfate: 0.01M to 0.5M, suitably 0.3M; and
4. Boric acid: 0.00 to 0.5M, suitably 0.2M.

As noted above, such a bath composition can be used for blanket plating, pattern plating, full-fill plating, and seed layer enhancement.

With reference again to the specific seed layer enhanced aspects of the present invention, the enhanced seed layer of FIG. 2C is suitable for subsequent electrochemical copper deposition. This subsequent copper deposition may take place in an alkaline bath within the apparatus employed to enhance the seed layer. This may be followed by a low-temperature annealing process that assists in lowering the resistivity of the deposited copper. Such a low-temperature annealing process suitably takes place at a temperature below about the 250 degrees Celsius and, more suitably, below about 100 degrees Celsius. When a low-K dielectric material is employed to isolate the copper structures, the upper annealing temperature limit should be chosen to be below the degradation temperature of the dielectric material.

Figure 2D:
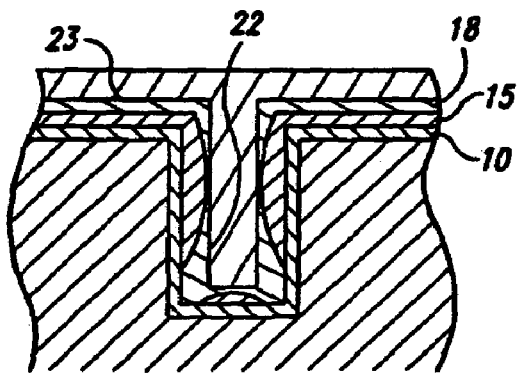
Figure 2E:
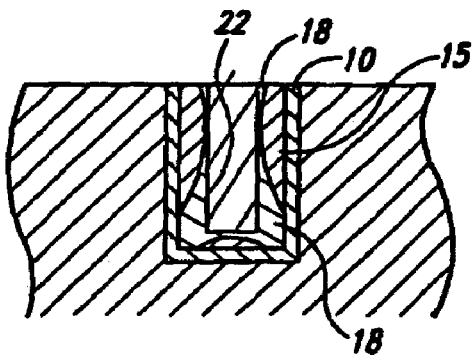

Although the foregoing alkaline bath compositions may be used for the entire electrochemical deposition process, subsequent copper deposition suitably takes place in an acid environment where plating rates are substantially higher than corresponding rates associated with alkaline plating baths. To this end, the semiconductor workpiece is suitably transferred to an apparatus wherein the workpiece is thoroughly rinsed with deionized water and then transferred to an apparatus similar to that of FIG. 3 wherein the plating bath is acidic. For example, one suitable copper bath comprises 170 g/l $H_2SO_4$, 17 g/l copper and 70 ppm Chloride ions with organic additives. The organic additives are not absolutely necessary to the plating reaction. Rather, the organic additives may be used to produce desired film characteristics and provide better filling of the recessed structures on the wafer surface. The organic additives may include levelers, brighteners, wetting agents and ductility enhancers. It is during this deposition process that the trench 5 is substantially filled with a further layer of electrochemically deposited copper 22. The resulting filled cross-section is illustrated in FIG. 2D. After being filled in this manner, the barrier layer and the copper layers disposed above the trench are removed using any suitable process thereby leaving only the trench 5 with the copper metallization and associated barrier material as shown in FIG. 2E.

While electrolytic seed layer enhancement is an embodiment of the present invention, the ultra-thin seed layer can alternately be enhanced in accordance with the present invention using an electroless plating bath solution containing metal ions to be deposited. Electroless plating baths are well know. The workpiece with ultra-thin seed layer is immersed in the electroless bath, or electroless bath solution is otherwise applies to the workpiece, for a predetermined time period sufficient to deposit additional metal ions to enhance the seed layer, rendering it suitable for metal deposition at a higher rate.

Use of an alkaline electrolytic bath to enhance the copper seed layer has particular advantages over utilizing acid copper baths without seed layer enhancement. After deposition of the PVD copper seed layer, the copper seed layer is typically exposed to an oxygen-containing environment. Oxygen readily converts metallic copper to copper oxide. If an acid copper bath is used to plate copper onto the seed layer after exposure of the seed layer to an oxygen containing environment, the acid copper bath would dissolve copper oxide that had formed, resulting in voids in the seed layer and poor uniformity of the copper layer deposited on the seed layer. Use of an alkaline copper bath in accordance with the disclosed embodiment avoids the problem by advantageously reducing any copper oxide at the surface of the seed layer to metallic copper. Another advantage of the alkaline copper bath is that the plated copper has much better adhesion to the barrier layer than that plated from an acid copper bath. Additional advantages of the seed layer enhancement aspects of the present invention can be seen from the following Example.

EXAMPLE 1

Comparison of Acid Copper Plating With and Without Seed Layer Enhancement

Semiconductor wafers 1, 2 and 3 were each coated with a 200 Angstrom PVD copper seed layer. In accordance with the present invention, wafers 1 and 2 had seed layer enhancement from citric acid and EDTA baths, respectively, the compositions of which are set forth below:

Bath for Wafer 1: 0.1 M Cu $SO_4$+0.2 M Citric acid+0.05 M $H_3BO_3$ in D.I. water at pH 9.5, temperature 25° C.

Bath for Wafer 2: 0.1 M Cu $SO_4$+0.2 M EDTA acid+0.05 $H_3BO_3$ in D.I. water at pH 12.5, temperature 25° C.

Wafer 3 did not have any seed layer enhancement.

The three wafers were then plated with a 1.5 micron copper layer from an acid copper bath under identical conditions. The following Table compares the uniformities, as deduced from sheet resistance measurements, of the three wafers after the deposition of a copper layer having a nominal thickness of 1.5 microns.

TABLE 1

| Wafer | Enhancement Bath | Current Density | Non-uniformity Standard deviation (%, 1σ) |
|---|---|---|---|
| 1 | Citrate | 3 min. at 2 mA/cm$^2$ | 7.321 |
| 2 | EDTA | 3 min. at 2 mA/cm$^2$ | 6.233 |
| 3 | None | 0 | 46.10 |

As can be seen from the results in Table 1 above, seed layer enhancement in accordance with the disclosed process provides excellent uniformity (6 to 7%) compared to that without seed layer enhancement (46%). This is consistent with observations during visual examination of the wafer after 1.5 micron electroplated copper had been deposited. Such visual examination of the wafer revealed the presence of defects at wafer electrode contact points on the wafer without seed layer enhancement.

Figure 5:
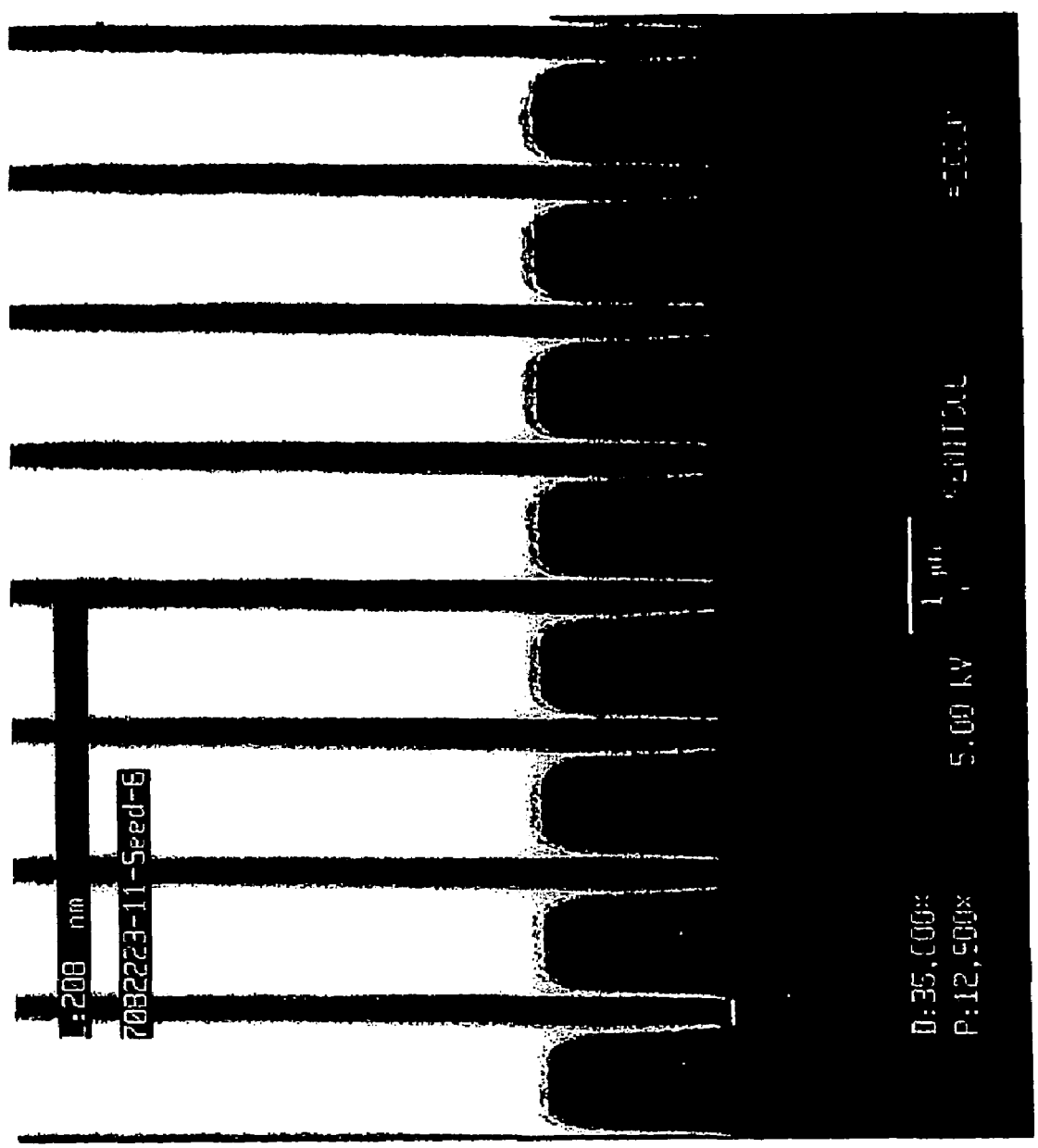
FIG. 5 is a scanning electromicrograph photograph illustrating an ultra-thin seed layer.
Figure 6A:
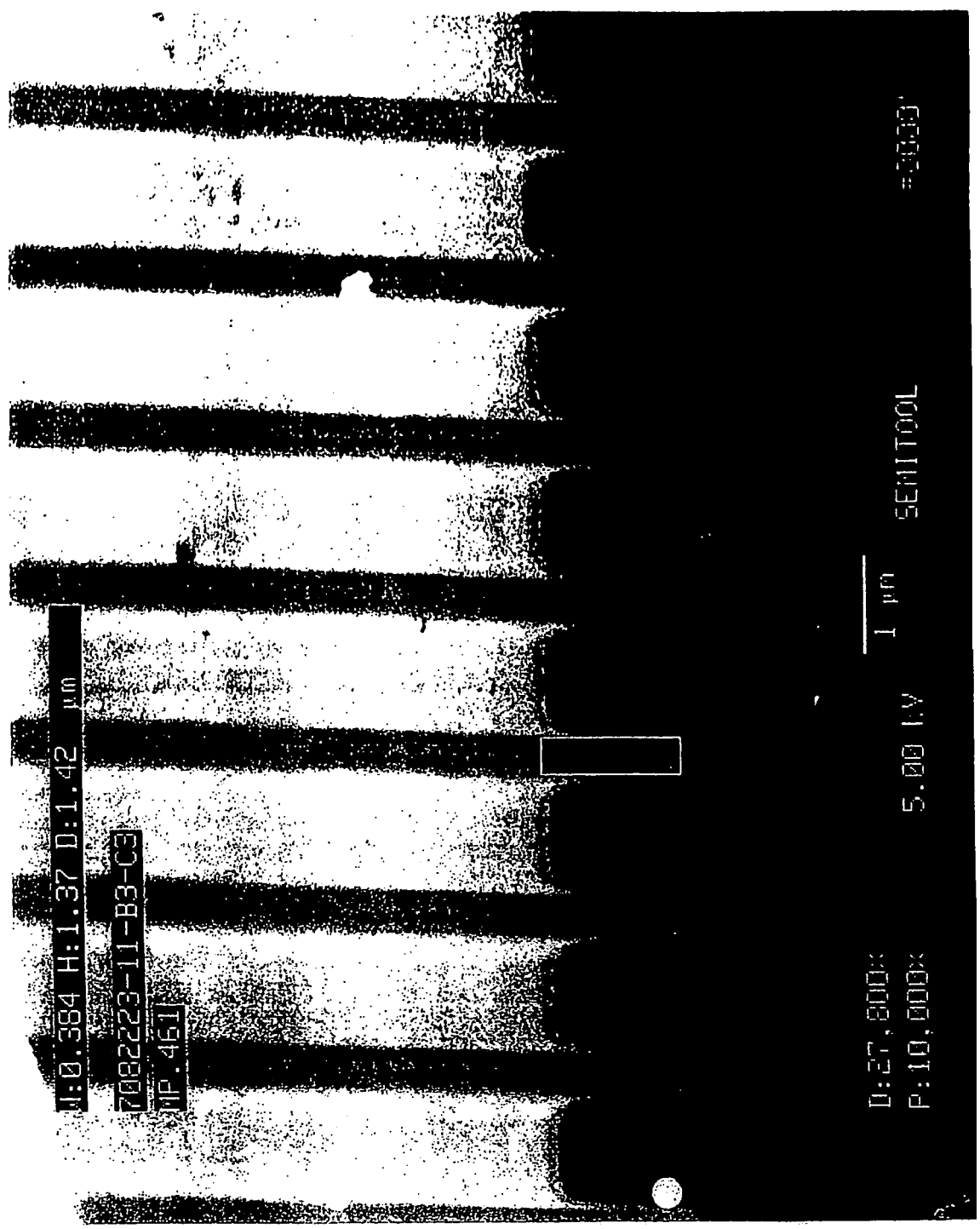
FIG. 6A is a scanning electromicrograph photograph illustrating an ultra-thin seed layer that has been enhanced in a citric acid bath.
Figure 6B:
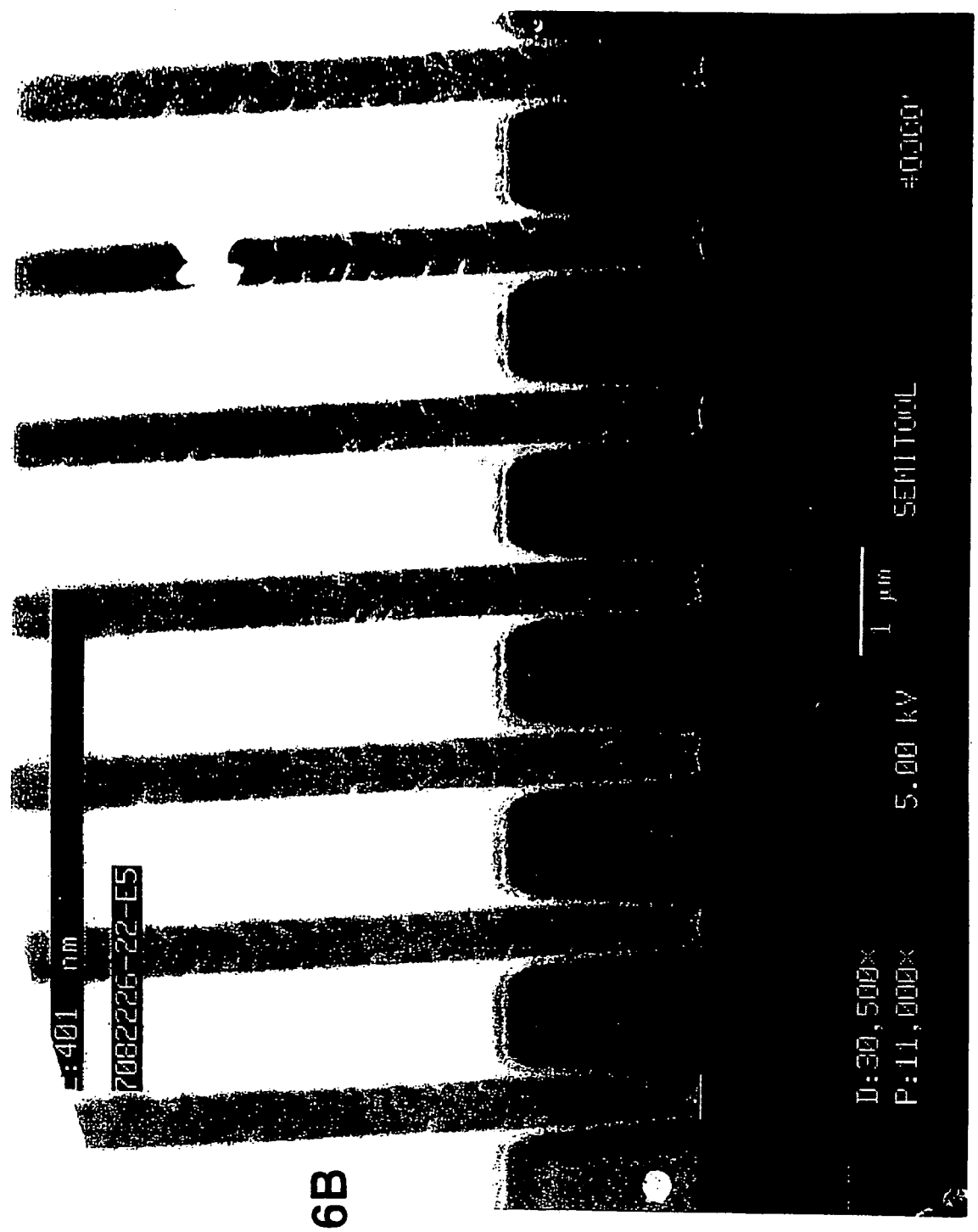
FIG. 6B is a scanning electromicrograph photograph illustrating an ultra-thin seed layer that has been enhanced in an EDTA bath.

FIGS. 5, 6A and 6B are photographs taken using a SEM. In FIG. 5, an ultra-thin seed layer has been deposited on the surface of a semiconductor wafer, including micro-structures, such as trenches 85. As shown, void regions are present at the lower corners of the trenches. In FIG. 6A, the seed layer has been enhanced in the manner described above in a bath containing citric acid as the complexing agent. This enhancement resulted in a conformal copper seed layer that is very suited for subsequent electrochemical deposition of copper metallization.

FIG. 6B illustrates a seed layer that has been enhanced in a bath containing EDTA as the complexing agent. The resulting seed layer includes larger grain sizes that project as spikes from the sidewalls of the trenches. These sidewall grain projections make subsequent electrochemical deposition filling of the trenches more difficult since they localize a higher plating rate resulting in non-uniformity of the subsequent electrochemical deposition. This effect is particularly noticeable in recessed micro-structures having small dimensions. As such, a complexing agent such as citric acid is more preferable when filling small micro-structures. Results comparable for copper baths containing citric acid have also been achieved using ED as the complexing agent.

B. Electrodeposition System

FIG. 7 is a schematic representation of a portion of a semiconductor manufacturing line 90 suitable for implementing the foregoing processes. The line 90 includes a vapor deposition tool or tool set 95 and an electrochemical copper deposition tool or tool set 100. Transfer of wafers between the tools/tool sets 95 and 100 may be implemented manually or through an automated transfer mechanism 105. Suitably, automated transfer mechanism 105 transfers workpieces in a pod or similar environment. Alternatively, the transfer mechanism 105 may transfer wafers individually or in an open carrier through a clean atmosphere joining the tools/tool sets.

In operation, vapor deposition tool/tool set 95 is utilized to apply an ultra-thin copper seed layer over at least portions of semiconductor workpieces that are processed on line 90. Suitably, this is done using a PVD application process. Workpieces with the ultra-thin seed layer are then transferred to tool/tool set 100, either individually or in batches, where they are subject to electrochemical seed layer enhancement at, for example, processing station 110. For electrolytic seed layer enhancement, processing station 110 may be constructed in the manner set forth in FIG. 3. For electroless enhancement, a similar processing station 110 will be utilized, but electrical contact is not made with the workpiece and voltage is not applied. After enhancement is completed, the workpieces are subject to a full electrochemical deposition process in which copper metallization is applied to the workpiece to a desired interconnect metallization thickness. This latter process may take place at station 10, but suitably occurs at further processing station 115 which deposits the copper metallization in the presence of an acidic plating bath. Before transfer to station 115, the workpiece is suitably rinsed in DI water at station 112. Transfer of the wafers between stations 110, 112, and 115 may be automated by a wafer conveying system 120. The electrochemical deposition tool set 100 may be implemented using, for example, an LT-210™ model or an Equinox™ model plating tool available from Semitool, Inc., of Kalispell, Mont.

C. Suitable Reactor For Seed Layer Enhancement

Figure 8:
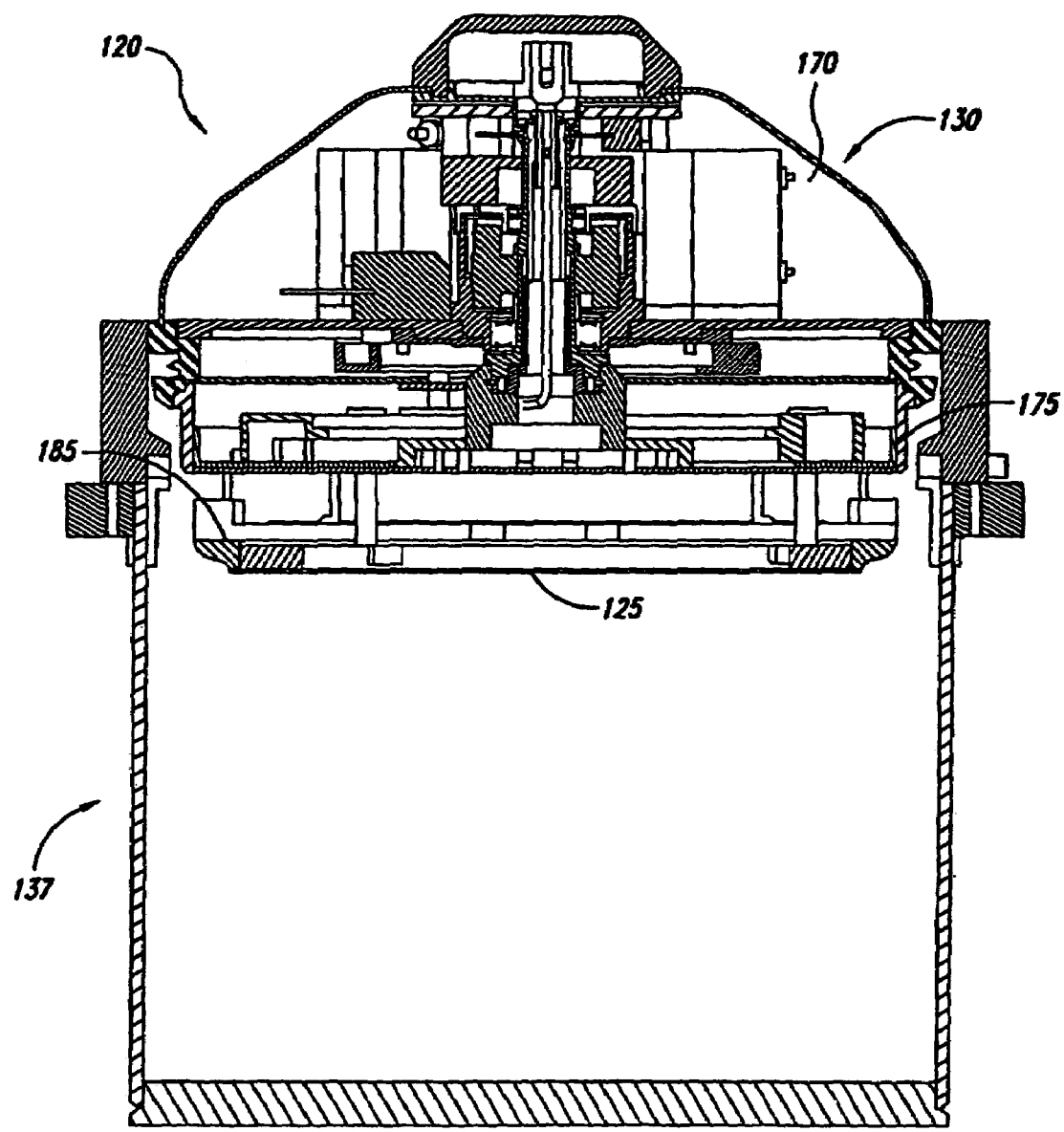
FIG. 8 is a cross-sectional view of another embodiment of an electroplating reactor assembly that may incorporate the present invention.

With reference to FIG. 8, a first reactor assembly 120 for electroplating a microelectronic workpiece 125, such as a semiconductor wafer, is shown. Generally stated, the reactor assembly 120 is comprised of a reactor head 130 and a corresponding reactor base, shown generally at 137 and described in substantial detail below, in which the electroplating solution is disposed. The reactor of FIG. 8 can also be used to implement electrochemical processing operations other than electroplating (e.g., electropolishing, anodization, etc.), and also electroless deposition processes.

The reactor head 130 of the electroplating reactor assembly may comprised of a stationary assembly 170 and a rotor assembly 175. Rotor assembly 175 is configured to receive and carry an associated microelectronic workpiece 125, position the microelectronic workpiece in a process-side down orientation within a container of reactor base 137, and to rotate or spin the workpiece while joining its electrically-conductive surface in the plating circuit of the reactor assembly 120. The rotor assembly 175 includes one or more cathode contacts (when used for electrolytic processing) that provide electroplating power to the surface of the microelectronic workpiece. In the illustrated embodiment, a cathode contact assembly is shown generally at 185 and is described in further detail below. It will be recognized, however, that backside contact may be implemented in lieu of front side contact when the substrate is conductive or when an alternative electrically conductive path is provided between the back side of the microelectronic workpiece and the front side thereof.

The reactor head 130 is typically mounted on a lift/rotate apparatus which is configured to rotate the reactor head 130 from an upwardly-facing disposition in which it receives the microelectronic workpiece to be plated, to a downwardly facing disposition in which the surface of the microelectronic workpiece to be plated is positioned so that it may be brought into contact with the electroplating solution in reactor base 137, either planar or at a given angle. A robotic arm, which suitably includes an end effector, is typically employed for placing the microelectronic workpiece 125 in position on the rotor assembly 175, and for removing the plated microelectronic workpiece from within the rotor assembly. The contact assembly 185 may be operated between an open state that allows the microelectronic workpiece to be placed on the rotor assembly 175, and a closed state that secures the microelectronic workpiece to the rotor assembly and brings the electrically conductive components of the contact assembly 185 into electrical engagement with the surface of the microelectronic workpiece that is to be plated.

It will be recognized that other reactor assembly configurations may be used with the inventive aspects of the disclosed reactor chamber, the foregoing being merely illustrative.

Figure 9:
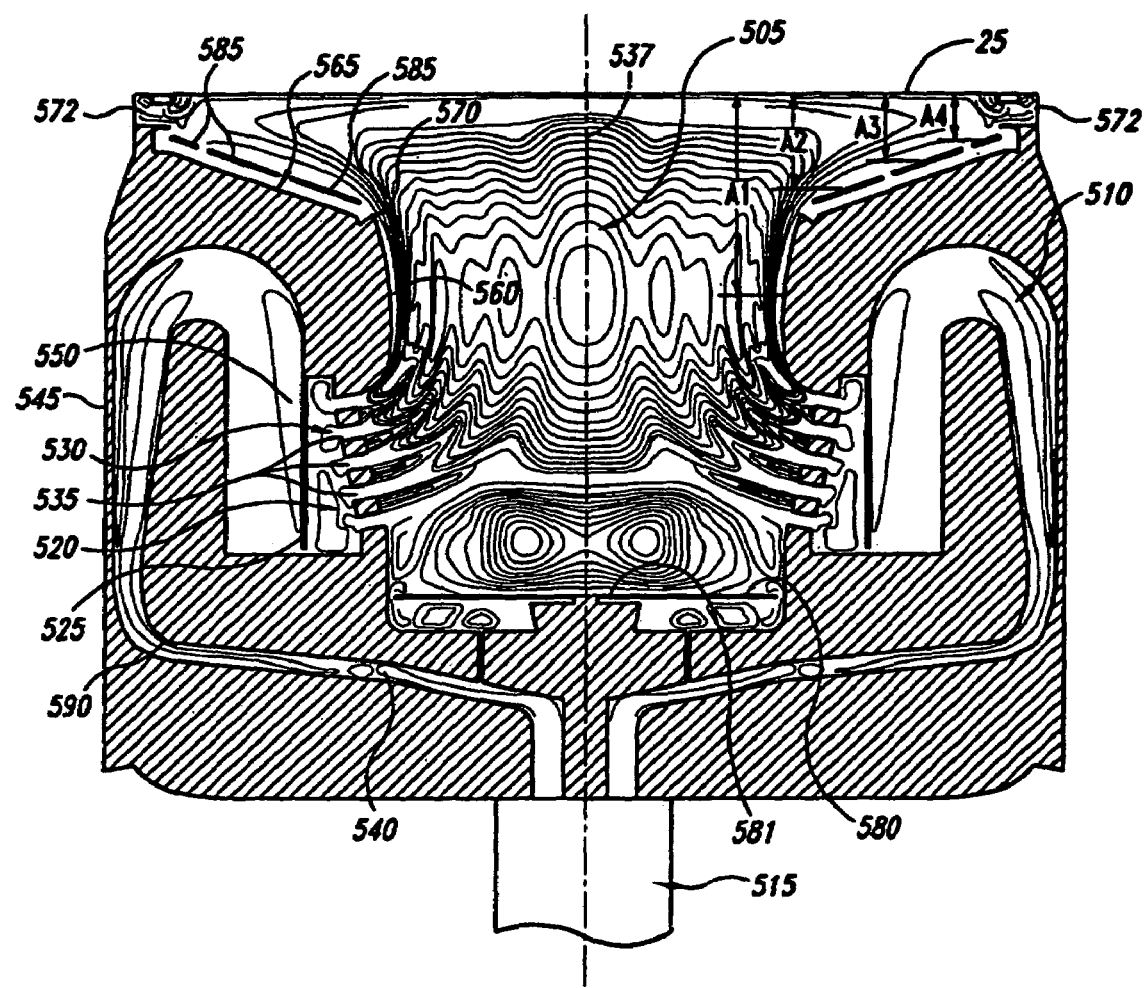
FIG. 9 is a schematic diagram of one embodiment of a reactor chamber that may be used in the reactor assembly of FIG. 8 and includes an illustration of the velocity flow profiles associated with the flow of processing fluid through the reactor chamber.

FIG. 9 illustrates the basic construction of processing base 137 and a corresponding computer simulation of the flow velocity contour pattern resulting from the processing container construction. As illustrated, the processing base 137 generally comprises a main fluid flow chamber 505, an antechamber 510, a fluid inlet 515, a plenum 520, a flow diffuser 525 separating the plenum 520 from the antechamber 510, and a nozzle/slot assembly 530 separating the plenum 520 from the main chamber 505. These components cooperate to provide a flow of electrochemical processing fluid (here, of the electroplating solution) at the microelectronic workpiece 125 that has a substantially radially independent normal component. In the illustrated embodiment, the impinging flow is centered about central axis 537 and possesses a nearly uniform component normal to the surface of the microelectronic workpiece 125. This results in a substantially uniform mass flux to the microelectronic workpiece surface that, in turn, enables substantially uniform processing thereof, for example, when used to introduce an alkaline bath solution for seed layer enhancement.

Notably, as will be clear from the description below, this desirable flow characteristic is achieved without the use of a diffuser disposed between the anode(s) and surface of the microelectronic workpiece that is to be electrochemically processed (e.g., electroplated). As such, the anodes used in the electroplating reactor can be placed in close proximity to the surface of the microelectronic workpiece to thereby provide substantial control over local electrical field/current density parameters used in the electroplating process. This substantial degree of control over the electrical parameters allows the reactor to be readily adapted to meet a wide range of electroplating requirements (e.g., seed layer thickness, seed layer type, electroplated material, electrolyte bath properties, etc.) without a corresponding change in the reactor hardware. Rather, adaptations can be implemented by altering the electrical parameters used in the electroplating process through, for example, software control of the power provided to the anodes, as shall be described further herein below.

The reactor design thus effectively de-couples the fluid flow from adjustments to the electric field. An advantage of this approach is that a chamber with nearly ideal flow for electroplating and other electrochemical processes (i.e., a design which provides a substantially uniform diffusion layer across the microelectronic workpiece) may be designed that will not be degraded when electroplating or other electrochemical process applications require significant changes to the electric field.

The foregoing advantages can be more greatly appreciated through a comparison with the conventional prior art reactors. In such conventional designs, the diffuser must be moved closer to the surface of the workpiece if the distance between the anode and the workpiece surface is to be reduced. However, moving the diffuser closer to the workpiece significantly alters the flow characteristics of the electroplating fluid at the surface of the workpiece. More particularly, the close proximity between the diffuser and the surface of the workpiece introduces a corresponding increase in the magnitude of the normal components of the flow velocity at local areas 9. As such, the anode cannot be moved so that it is in close proximity to the surface of the microelectronic workpiece that is to be electroplated without introducing substantial diffusion layer control problems and undesirable localized increases in the electrical field corresponding to the pattern of apertures in the diffuser. Since the anode cannot be moved in close proximity to the surface of the microelectronic workpiece, the advantages associated with increased control of the electrical characteristics of the electrochemical process cannot be realized. Still further, movement of the diffuser to a position in close proximity with the microelectronic workpiece effectively generates a plurality of virtual anodes defined by the hole pattern of the diffuser. Given the close proximity of these virtual anodes to the microelectronic workpiece surface, the virtual anodes have a highly localized effect. This highly localized effect cannot generally be controlled with any degree of accuracy given that any such control is solely effected by varying the power to the single, real anode. A substantially uniform electroplated film is thus difficult to achieve with such a plurality of loosely controlled virtual anodes.

Figure 10A:
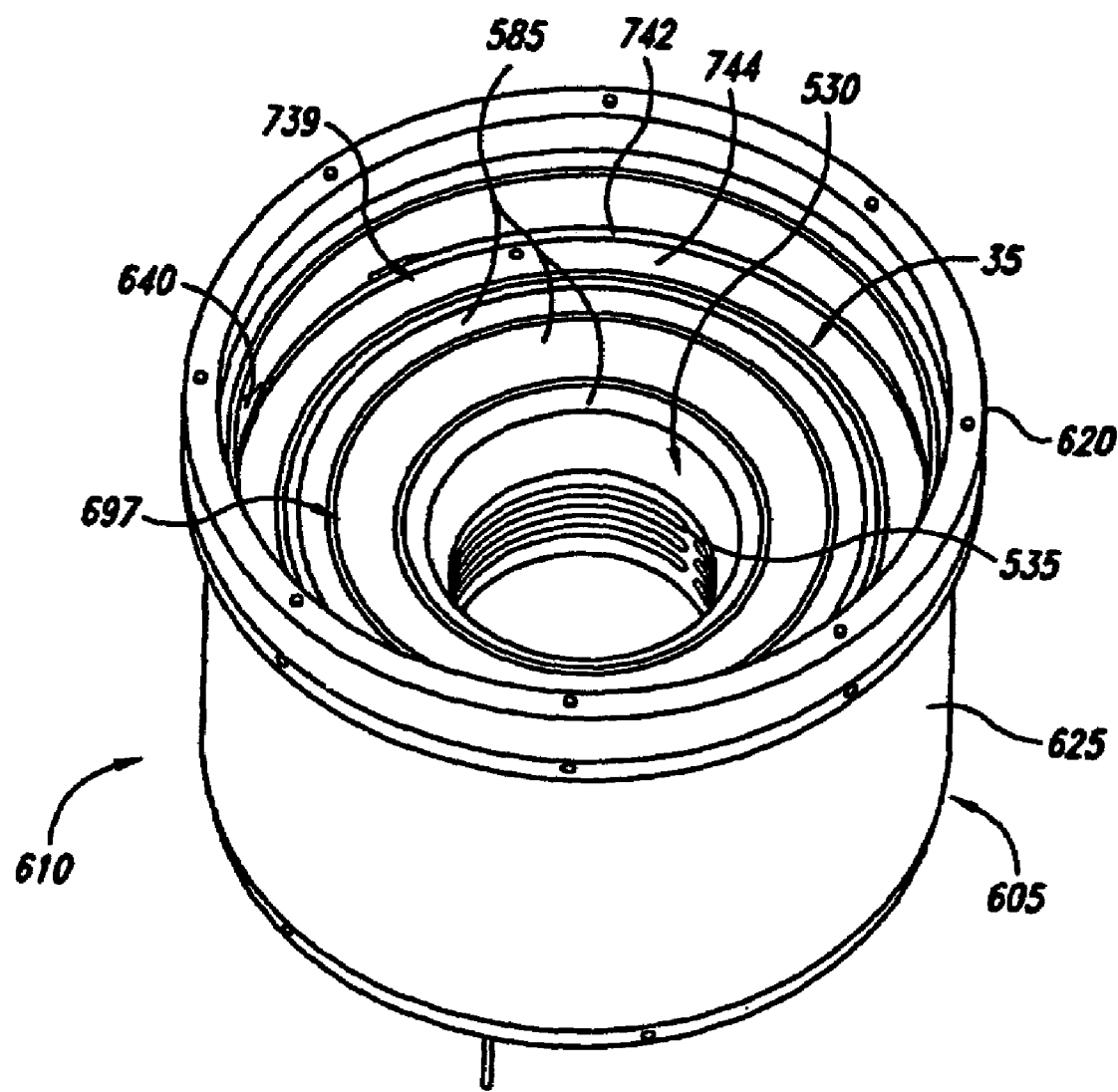
FIGS. 10A, 10B, 11 and 12 illustrate a specific construction of a complete processing chamber assembly that has been specifically adapted for electrochemical processing of a semiconductor wafer and that has been implemented to achieve the velocity flow profiles set forth in FIG. 9.

With reference again to FIG. 9, electroplating solution is provided through inlet 515 disposed at the bottom of the base 137. The fluid from the inlet 515 is directed therefrom at a relatively high velocity through antechamber 510. In the illustrated embodiment, antechamber 510 includes an acceleration channel 540 through which the electroplating solution flows radially from the fluid inlet 515 toward fluid flow region 545 of antechamber 510. Fluid flow region 545 has a generally inverted U-shaped cross-section that is substantially wider at its outlet region proximate flow diffuser 525 than at its inlet region proximate channel 540. This variation in the cross-section assists in removing any gas bubbles from the electroplating solution before the electroplating solution is allowed to enter the main chamber 505. Gas bubbles that would otherwise enter the main chamber 505 are allowed to exit the processing base 137 through a gas outlet (not illustrated in FIG. 9, but illustrated in the embodiment shown in FIGS. 10-12) disposed at an upper portion of the antechamber 510.

Electroplating solution within antechamber 510 is ultimately supplied to main chamber 505. To this end, the electroplating solution is first directed to flow from a relatively high-pressure region 550 of the antechamber 510 to the comparatively lower-pressure plenum 520 through flow diffuser 525. Nozzle assembly 530 includes a plurality of nozzles or slots 535 that are disposed at a slight angle with respect to horizontal. Electroplating solution exits plenum 520 through nozzles 535 with fluid velocity components in the vertical and radial directions.

Main chamber 505 is defined at its upper region by a contoured sidewall 560 and a slanted sidewall 565. The contoured sidewall 560 assists in preventing fluid flow separation as the electroplating solution exits nozzles 535 (particularly the uppermost nozzle(s)) and turns upward toward the surface of microelectronic workpiece 125. Beyond breakpoint 570, fluid flow separation will not substantially affect the uniformity of the normal flow. As such, sidewall 565 can generally have any shape, including a continuation of the shape of contoured sidewall 560. In the specific embodiment disclosed here, sidewall 565 is slanted and, as will be explained in further detail below, is used to support one or more anodes.

Electroplating solution exits from main chamber 505 through a generally annular outlet 572. Fluid exiting outlet 572 may be provided to a further exterior chamber for disposal or may be replenished for re-circulation through the electroplating solution supply system.

The processing base 137 is also provided with one or more anodes. In the illustrated embodiment, a principal anode 580 is disposed in the lower portion of the main chamber 505. If the peripheral edges of the surface of the microelectronic workpiece 125 extend radially beyond the extent of contoured sidewall 560, then the peripheral edges are electrically shielded from principal anode 580 and reduced plating will take place in those regions. As such, a plurality of annular anodes 585 are disposed in a generally concentric manner on slanted sidewall 565 to provide a flow of electroplating current to the peripheral regions.

Anodes 580 and 585 of the illustrated embodiment are disposed at different distances from the surface of the microelectronic workpiece 125 that is being electroplated. More particularly, the anodes 580 and 585 are concentrically disposed in different horizontal planes. Such a concentric arrangement combined with the vertical differences allow the anodes 580 and 585 to be effectively placed close to the surface of the microelectronic workpiece 125 without generating a corresponding adverse impact on the flow pattern as tailored by nozzles 535. The plurality of anodes illustrated are arranged at increasing distances from the workpiece from an innermost one of the concentric anodes to an outermost one of the concentric anodes. However, for differing deposition patterns, an alternate arrangement providing for the distance from anode to workpiece increasing from outermost to innermost is also within the scope of the present invention.

The effect and degree of control that an anode has on the electroplating of microelectronic workpiece 125 is dependent on the effective distance between that anode and the surface of the microelectronic workpiece that is being electroplated. More particularly, all other things being equal, an anode that is effectively spaced a given distance from the surface of microelectronic workpiece 125 will have an impact on a larger area of the microelectronic workpiece surface than an anode that is effectively spaced from the surface of microelectronic workpiece 125 by a lesser amount. Anodes that are effectively spaced at a comparatively large distance from the surface of microelectronic workpiece 125 thus have less localized control over the electroplating process than do those that are spaced at a smaller distance. It is therefore desirable to effectively locate the anodes in close proximity to the surface of microelectronic workpiece 125 since this allows more versatile, localized control of the electroplating process. Advantage can be taken of this increased control to achieve greater uniformity of the resulting electroplated film. Such control is exercised, for example, by placing the electroplating power provided to the individual anodes under the control of a programmable controller or the like, as shall be described subsequently herein below. Adjustments to the electroplating power can thus be made subject to software control based on manual or automated inputs.

In the illustrated embodiment, anode 580 is effectively "seen" by microelectronic workpiece 125 as being positioned an approximate distance A1 from the surface of microelectronic workpiece 125. This is due to the fact that the relationship between the anode 580 and sidewall 560 creates a virtual anode having an effective area defined by the innermost dimensions of sidewall 560. In contrast, anodes 585 are approximately at effective distances A2, A3, and A4 proceeding from the innermost anode to the outermost anode, with the outermost anode being closest to the microelectronic workpiece 125. All of the anodes 585 are in close proximity (i.e., about 25.4 mm or less, with the outermost anode being spaced from the microelectronic workpiece by about 10 mm) to the surface of the microelectronic workpiece 125 that is being electroplated. Since anodes 585 are in close proximity to the surface of the microelectronic workpiece 125, they can be used to provide effective, localized control over the radial film growth at peripheral portions of the microelectronic workpiece. Such localized control is particularly desirable at the peripheral portions of the microelectronic workpiece since it is those portions that are more likely to have a high uniformity gradient (most often due to the fact that electrical contact is made with the seed layer of the microelectronic workpiece at the outermost peripheral regions resulting in higher plating rates at the periphery of the microelectronic workpiece compared to the central portions thereof).

The electroplating power provided to the foregoing anode arrangement can be readily controlled to accommodate a wide range of plating requirements without the need for a corresponding hardware modification. Some reasons for adjusting the electroplating power include changes to the following:

seed layer thickness;
    open area of plating surface (pattern wafers, edge exclusion);

final plated thickness;

plated film type (copper, platinum, seed layer enhancement);

bath conductivity, metal concentration; and plating rate.

The foregoing anode arrangement is particularly well-suited for plating microelectronic workpieces having highly resistive seed layers, for enhancing such highly resistive seed layers, and also for plating highly resistive materials on microelectronic workpieces. Generally stated, the more resistive the seed layer or material that is to be deposited, the more the magnitude of the current or potential at the central anode 580 (or central anodes) should be increased to yield a uniform film. This effect can be understood in connection with an example and the set of corresponding graphs set forth in FIGS. 17 and 18.

Figure 17:
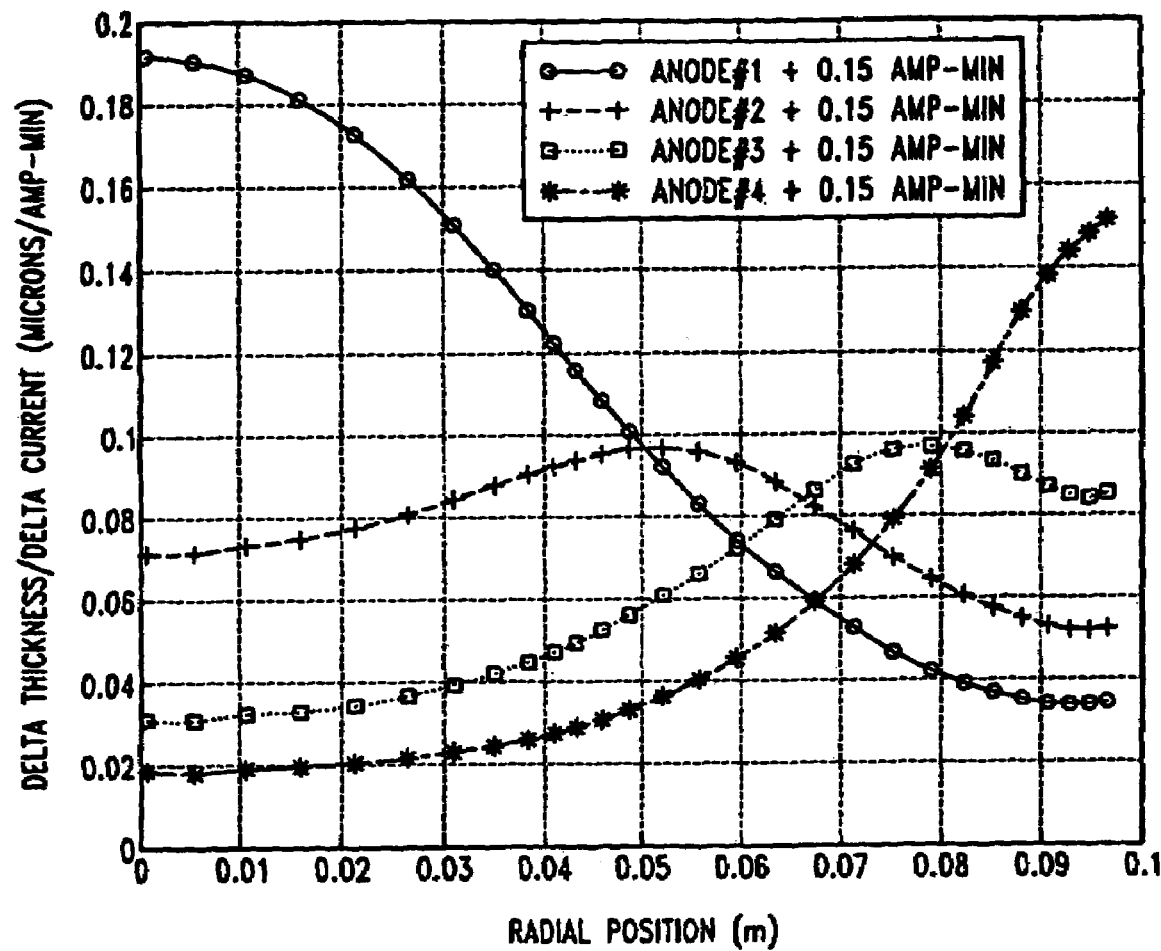
FIGS. 17 and 18 are graphs illustrating the manner in which the anode configuration of the processing chamber may be employed to achieve uniform plating.

FIG. 17 is a graph of four different computer simulations reflecting the change in growth of an electroplated film versus the radial position across the surface of a microelectronic workpiece. The graph illustrates the changing growth that occurs when the current to a given one of the four anodes 580, 585 is changed without a corresponding change in the current to the remaining anodes. In this illustration, Anode 1 corresponds to anode 580 and the remaining Anodes 2 through 4 correspond to anodes 585 proceeding from the interior most anode to the outermost anode. The peak plating for each anode occurs at a different radial position. Further, as can be seen from this graph, anode 580, being effectively at the largest distance from the surface of the workpiece, has an effect over a substantial radial portion of the workpiece and thus has a broad affect over the surface area of the workpiece. In contrast, the remaining anodes have substantially more localized effects at the radial positions corresponding to the peaks of the graph of FIG. 17.

The differential radial effectiveness of the anodes 580, 585 can be utilized to provide an effectively uniform electroplated film across the surface of the microelectronic workpiece. To this end, each of the anodes 580, 585 may be provided with a fixed current that may differ from the current provided to the remaining anodes. These plating current differences can be provided to compensate for the increased plating that generally occurs at the radial position of the workpiece surface proximate the contacts of the cathode contact assembly 185 (FIG. 8).

Likewise, the current to the individual anodes 580, 585 can be adjusted to provide a radially uniform deposition of metal during seed layer enhancement in accordance with the present invention, including during seed layer enhancement in an electrolytic alkaline bath.

Figure 18:
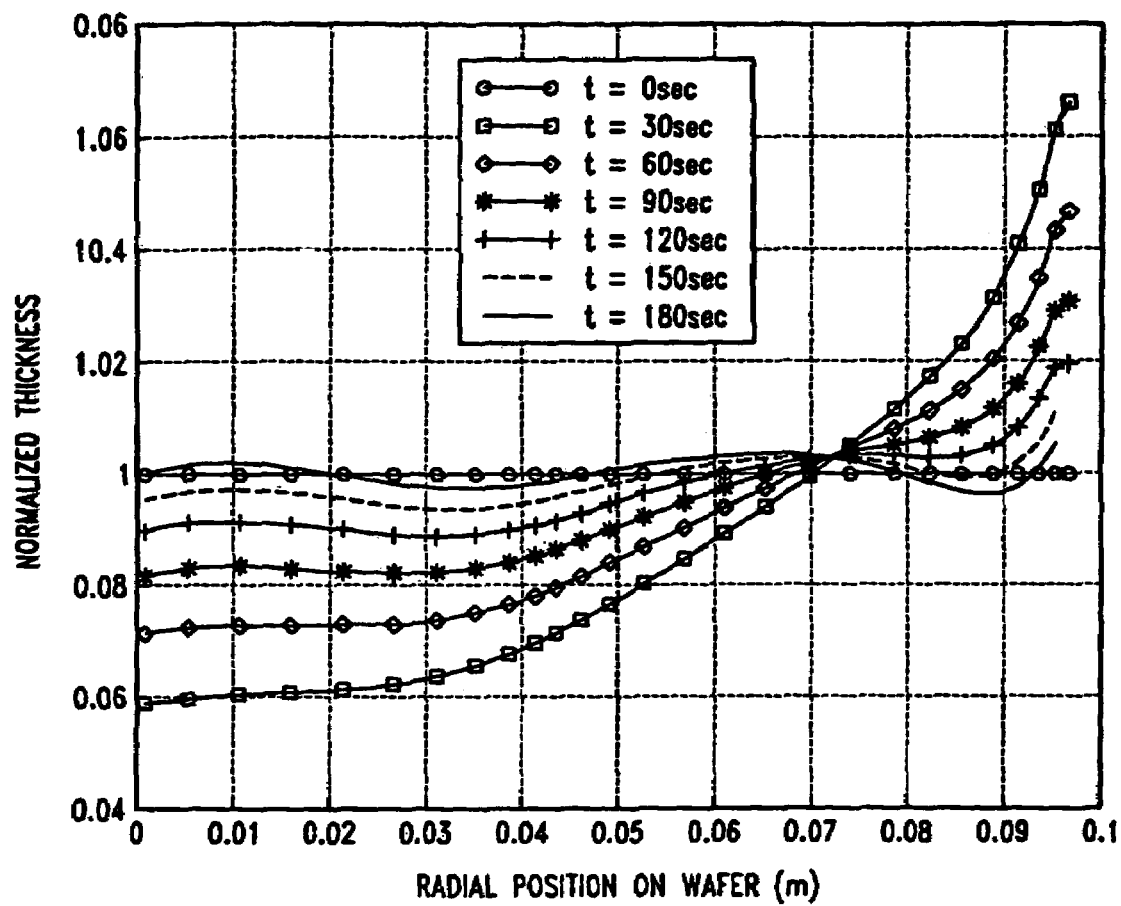

The computer simulated effect of a predetermined set of plating current differences on the normalized thickness of the electroplated film as a function of the radial position on the microelectronic workpiece over time is shown in FIG. 18. In this simulation, the seed layer was assumed to be uniform at $t_0$. As illustrated, there is a substantial difference in the thickness over the radial position on the microelectronic workpiece during the initial portion of the electroplating process. This is generally characteristic of workpieces having seed layers that are highly resistive, such as those that are formed from a highly resistive material or that are very thin. However, as can be seen from FIG. 18, the differential plating that results from the differential current provided to the anodes 580, 585 forms a substantially uniform plated film by the end of the electroplating process. It will be recognized that the particular currents that are to be provided to anodes 580, 585 depends upon numerous factors including, but not necessarily limited to, the desired thickness and material of the electroplated film, the thickness and material of the initial seed layer, the distances between anodes 580, 585 and the surface of the microelectronic workpiece, electrolyte bath properties, etc.

Anodes 580, 585 may be consumable, but are suitably inert and formed from platinized titanium or some other inert conductive material. However, as noted above, inert anodes tend to evolve gases that can impair the uniformity of the plated film. To reduce this problem, as well as to reduce the likelihood of the entry of bubbles into the main processing chamber 505, processing base 37 includes several unique features. With respect to anode 580, a small fluid flow path forms a Venturi outlet 590 between the underside of anode 580 and the relatively lower pressure channel 540 (see FIG. 9). This results in a Venturi effect that causes the electroplating solution proximate the surfaces of anode 580 to be drawn away and, further, provides a suction flow (or recirculation flow) that affects the uniformity of the impinging flow at the central portion of the surface of the microelectronic workpiece.

The Venturi flow path 590 may be shielded to prevent any large bubbles originating from outside the chamber from rising through region 590. Instead, such bubbles enter the bubble-trapping region of the antechamber 510.

Similarly, electroplating solution sweeps across the surfaces of anodes 585 in a radial direction toward fluid outlet 572 to remove gas bubbles forming at their surfaces. Further, the radial components of the fluid flow at the surface of the microelectronic workpiece assist in sweeping gas bubbles therefrom.

There are numerous further processing advantages with respect to the illustrated flow through the reactor chamber. As illustrated, the flow through the nozzles 535 is directed away from the microelectronic workpiece surface and, as such, there are no jets of fluid created to disturb the uniformity of the diffusion layer. Although the diffusion layer may not be perfectly uniform, it will be substantially uniform, and any non-uniformity will be relatively gradual as a result. Further, the effect of any minor non-uniformity may be substantially reduced by rotating the microelectronic workpiece during processing. A further advantage relates to the flow at the bottom of the main chamber 505 that is produced by the Venturi outlet, which influences the flow at the centerline thereof. The centerline flow velocity is otherwise difficult to implement and control. However, the strength of the Venturi flow provides a non-intrusive design variable that may be used to affect this aspect of the flow.

As is also evident from the foregoing reactor design, the flow that is normal to the microelectronic workpiece has a slightly greater magnitude near the center of the microelectronic workpiece and creates a dome-shaped meniscus whenever the microelectronic workpiece is not present (i.e., before the microelectronic workpiece is lowered into the fluid). The dome-shaped meniscus assists in minimizing bubble entrapment as the microelectronic workpiece or other workpiece is lowered into the processing solution (here, the electroplating solution).

A still further advantage of the foregoing reactor design is that it assists in preventing bubbles that find their way to the chamber inlet from reaching the microelectronic workpiece. To this end, the flow pattern is such that the solution travels downward just before entering the main chamber. As such, bubbles remain in the antechamber and escape through holes at the top thereof. Further, the upward sloping inlet path (see FIG. 12 and appertaining description) to the antechamber prevents bubbles from entering the main chamber through the Venturi flow path.

Figure 10B:
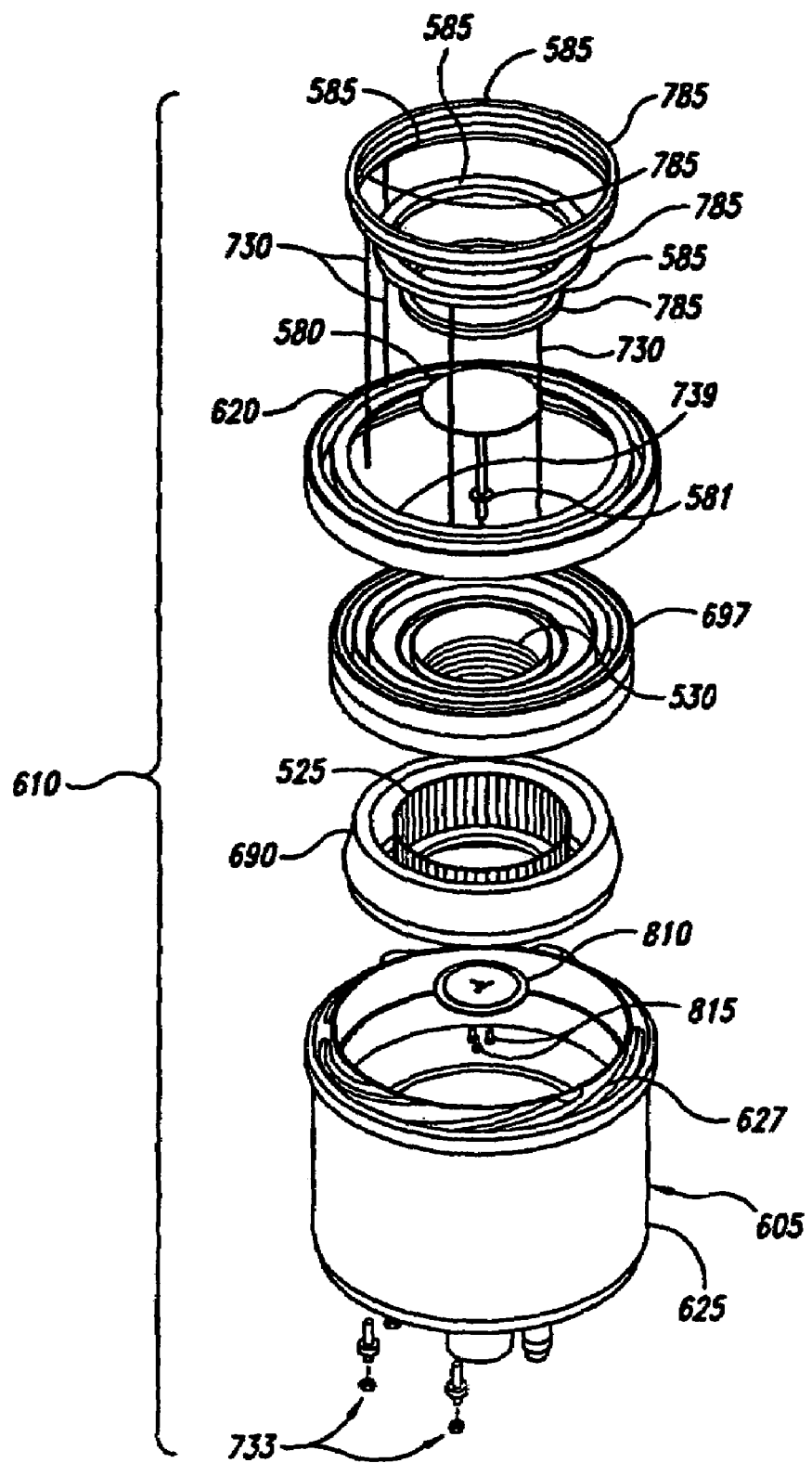
Figure 11:
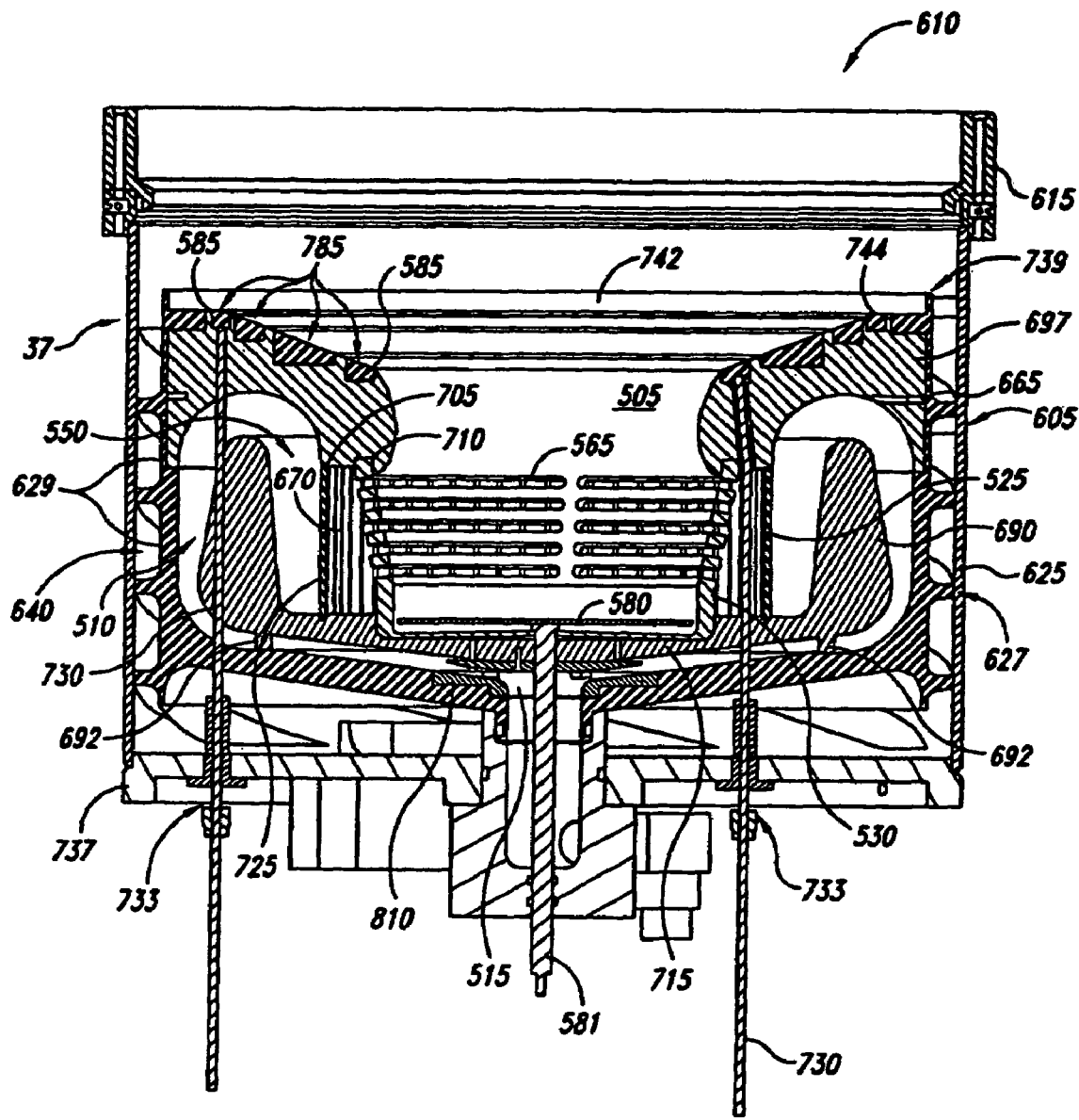
Figure 12:
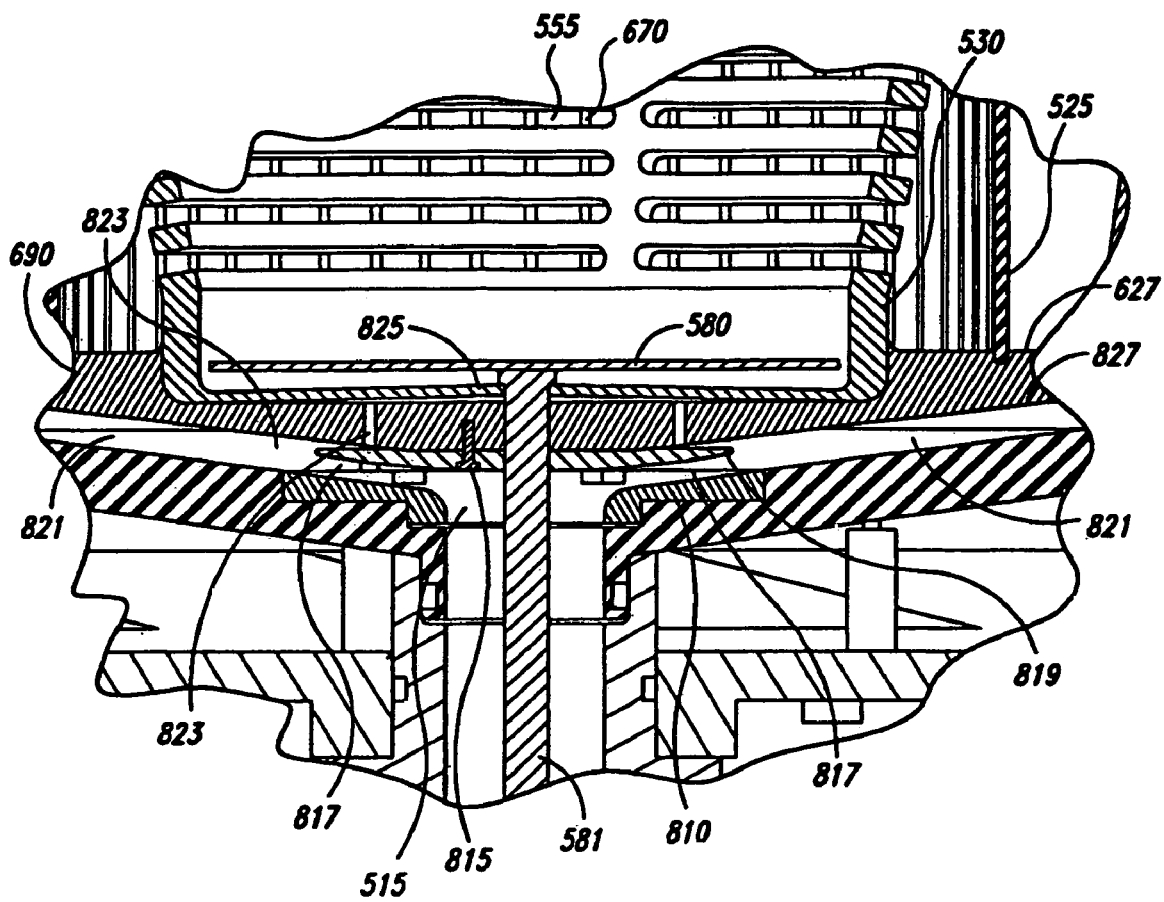

FIGS. 10-12 illustrate a specific construction of a complete processing chamber assembly 610 that has been specifically adapted for electrochemical processing of a semiconductor microelectronic workpiece. More particularly, the illustrated embodiment is specifically adapted for depositing a uniform layer of material on the surface of the workpiece using electroplating.

As illustrated, the processing base 137 shown in FIG. 8 is comprised of processing chamber assembly 610 along with a corresponding exterior cup 605. Processing chamber assembly 610 is disposed within exterior cup 605 to allow exterior cup 605 to receive spent processing fluid that overflows from the processing chamber assembly 610. A flange 615 extends about the assembly 610 for securement with, for example, the frame of the corresponding tool.

With particular reference to FIGS. 11 and 12, the flange of the exterior cup 605 is formed to engage or otherwise accept rotor assembly 75 of reactor head 30 (shown in FIG. 8) and allow contact between the microelectronic workpiece 25 and the processing solution, such as electroplating solution, in the main fluid flow chamber 505. The exterior cup 605 also includes a main cylindrical housing 625 into which a drain cup member 627 is disposed. The drain cup member 627 includes an outer surface having channels 629 that, together with the interior wall of main cylindrical housing 625, form one or more helical flow chambers 640 that serve as an outlet for the processing solution. Processing fluid overflowing a weir member 739 at the top of processing cup 35 drains through the helical flow chambers 640 and exits an outlet (not illustrated) where it is either disposed of or replenished and re-circulated. This configuration is particularly suitable for systems that include fluid re-circulation since it assists in reducing the mixing of gases with the processing solution thereby further reducing the likelihood that gas bubbles will interfere with the uniformity of the diffusion layer at the workpiece surface.

In the illustrated embodiment, antechamber 510 is defined by the walls of a plurality of separate components. More particularly, antechamber 510 is defined by the interior walls of drain cup member 627, an anode support member 697, the interior and exterior walls of a mid-chamber member 690, and the exterior walls of flow diffuser 525.

FIGS. 10B and 11 illustrate the manner in which the foregoing components are brought together to form the reactor. To this end, the mid-chamber member 690 is disposed interior of the drain cup member 627 and includes a plurality of leg supports 692 that sit upon a bottom wall thereof. The anode support member 697 includes an outer wall that engages a flange that is disposed about the interior of drain cup member 627. The anode support member 697 also includes a channel 705 that sits upon and engages an upper portion of flow diffuser 525, and a further channel 710 that sits upon and engages an upper rim of nozzle assembly 530. Mid-chamber member 690 also includes a centrally disposed receptacle 715 that is dimensioned to accept the lower portion of nozzle assembly 530. Likewise, an annular channel 725 is disposed radially exterior of the annular receptacle 715 to engage a lower portion of flow diffuser 525.

In the illustrated embodiment, the flow diffuser 525 is formed as a single piece and includes a plurality of vertically oriented slots 670. Similarly, the nozzle assembly 530 is formed as a single piece and includes a plurality of horizontally oriented slots that constitute the nozzles 535.

The anode support member 697 includes a plurality of annular grooves that are dimensioned to accept corresponding annular anode assemblies 785. Each anode assembly 785 includes an anode 585 (suitably formed from platinized titanium or another inert metal) and a conduit 730 extending from a central portion of the anode 585 through which a metal conductor may be disposed to electrically connect the anode 585 of each assembly 785 to an external source of electrical power. Conduit 730 is shown to extend entirely through the processing chamber assembly 610 and is secured at the bottom thereof by a respective fitting 733. In this manner, anode assemblies 785 effectively urge the anode support member 697 downward to clamp the flow diffuser 525, nozzle assembly 530, mid-chamber member 690, and drain cup member 627 against the bottom portion 737 of the exterior cup 605. This allows for easy assembly and disassembly of the processing chamber 610. However, it will be recognized that other means may be used to secure the chamber elements together as well as to conduct the necessary electrical power to the anodes.

The illustrated embodiment also includes a weir member 739 that detachably snaps or otherwise easily secures to the upper exterior portion of anode support member 697. As shown, weir member 739 includes a rim 742 that forms a weir over which the processing solution flows into the helical flow chamber 640. Weir member 739 also includes a transversely extending flange 744 that extends radially inward and forms an electric field shield over all or portions of one or more of the anodes 585. Since the weir member 739 may be easily removed and replaced, the processing chamber assembly 610 may be readily reconfigured and adapted to provide different electric field shapes. Such differing electrical field shapes are particularly useful in those instances in which the reactor must be configured to process more than one size or shape of a workpiece. Additionally, this allows the reactor to be configured to accommodate workpieces that are of the same size, but have different plating area requirements.

The anode support member 697, with the anodes 585 in place, forms the contoured sidewall 560 and slanted sidewall 565 that is illustrated in FIG. 9. As noted above, the lower region of anode support member 697 is contoured to define the upper interior wall of antechamber 510 and suitably includes one or more gas outlets 665 that are disposed therethrough to allow gas bubbles to exit from the antechamber 510 to the exterior environment.

With particular reference to FIG. 12, fluid inlet 515 is defined by an inlet fluid guide, shown generally at 810, that is secured to the floor of mid-chamber member 690 by one or more fasteners 815. Inlet fluid guide 810 includes a plurality of open channels 817 that guide fluid received at fluid inlet 515 to an area beneath mid-chamber member 690. Channels 817 of the illustrated embodiment are defined by upwardly angled walls 819. Processing fluid exiting channels 817 flows therefrom to one or more further channels 821 that are likewise defined by walls that angle upward.

Central anode 580 includes an electrical connection rod 581 that proceeds to the exterior of the processing chamber assembly 610 through central apertures formed in nozzle assembly 530, mid-chamber member 690 and inlet fluid guide 810. The small Venturi flow path regions shown at 590 in FIG. 9 are formed in FIG. 12 by vertical channels 823 that proceed through drain cup member 690 and the bottom wall of nozzle member 530. As illustrated, the fluid inlet guide 810 and, specifically, the upwardly angled walls 819 extend radially beyond the shielded vertical channels 823 so that any bubbles entering the inlet proceed through the upward channels 821 rather than through the vertical channels 823.

FIGS. 13-16 illustrate a further embodiment of an improved reactor chamber. The embodiment illustrated in these figures retains the advantageous electric field and flow characteristics of the foregoing reactor construction while concurrently being useful for situations in which anode/electrode isolation is desirable. Such situations include, but are not limited to, the following:

instances in which the electrochemical electroplating solution must pass over an electrode, such as an anode, at a high flow rate to be optimally effective;

instances in which one or more gases evolving from the electrochemical reactions at the anode surface must be removed in order to insure uniform electrochemical processing; and instances in which consumable electrodes are used.

Figure 13:
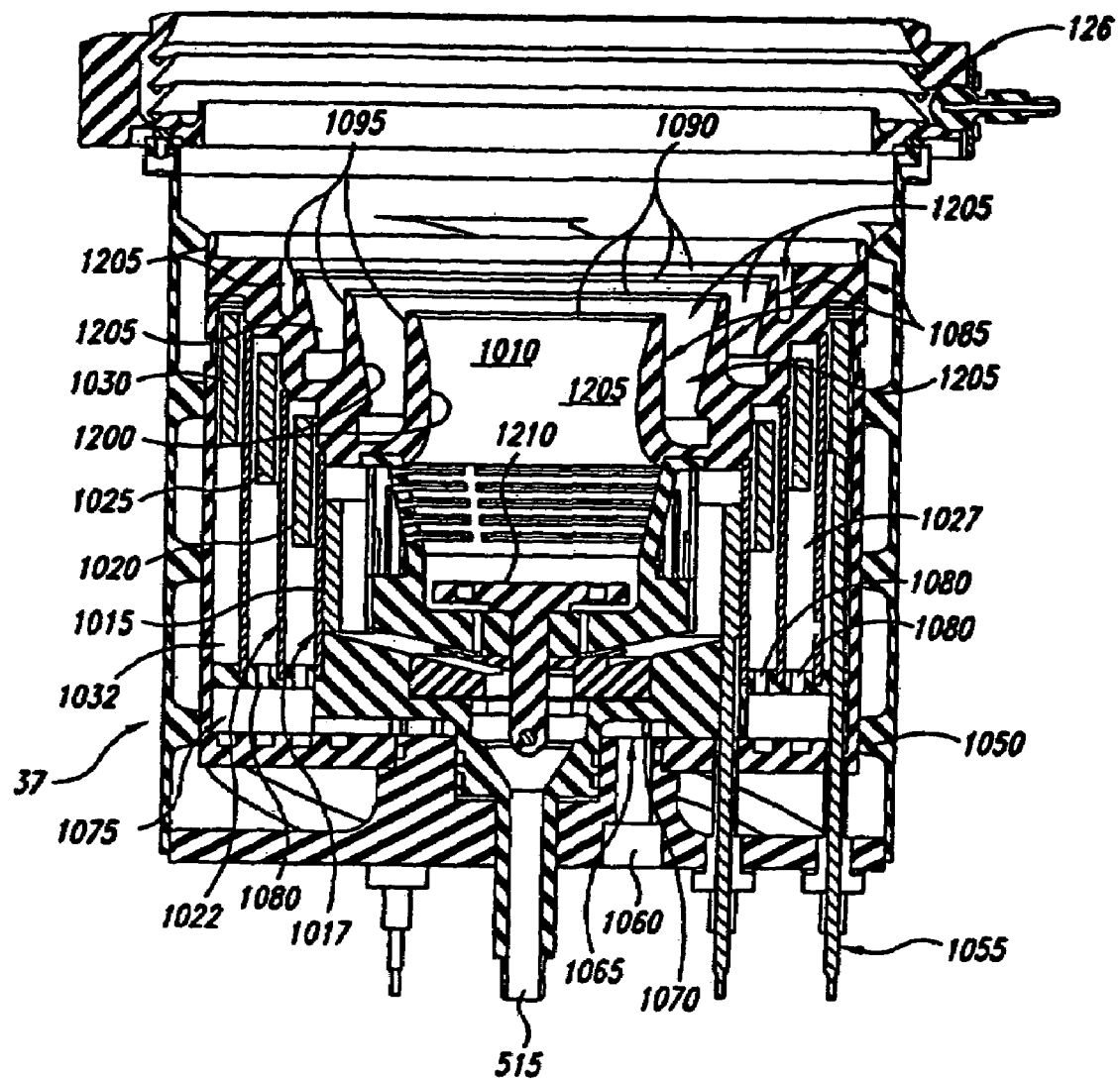
FIGS. 13 and 14 illustrate a complete processing chamber assembly that has been constructed in accordance with a further embodiment of the present invention.
Figure 14:
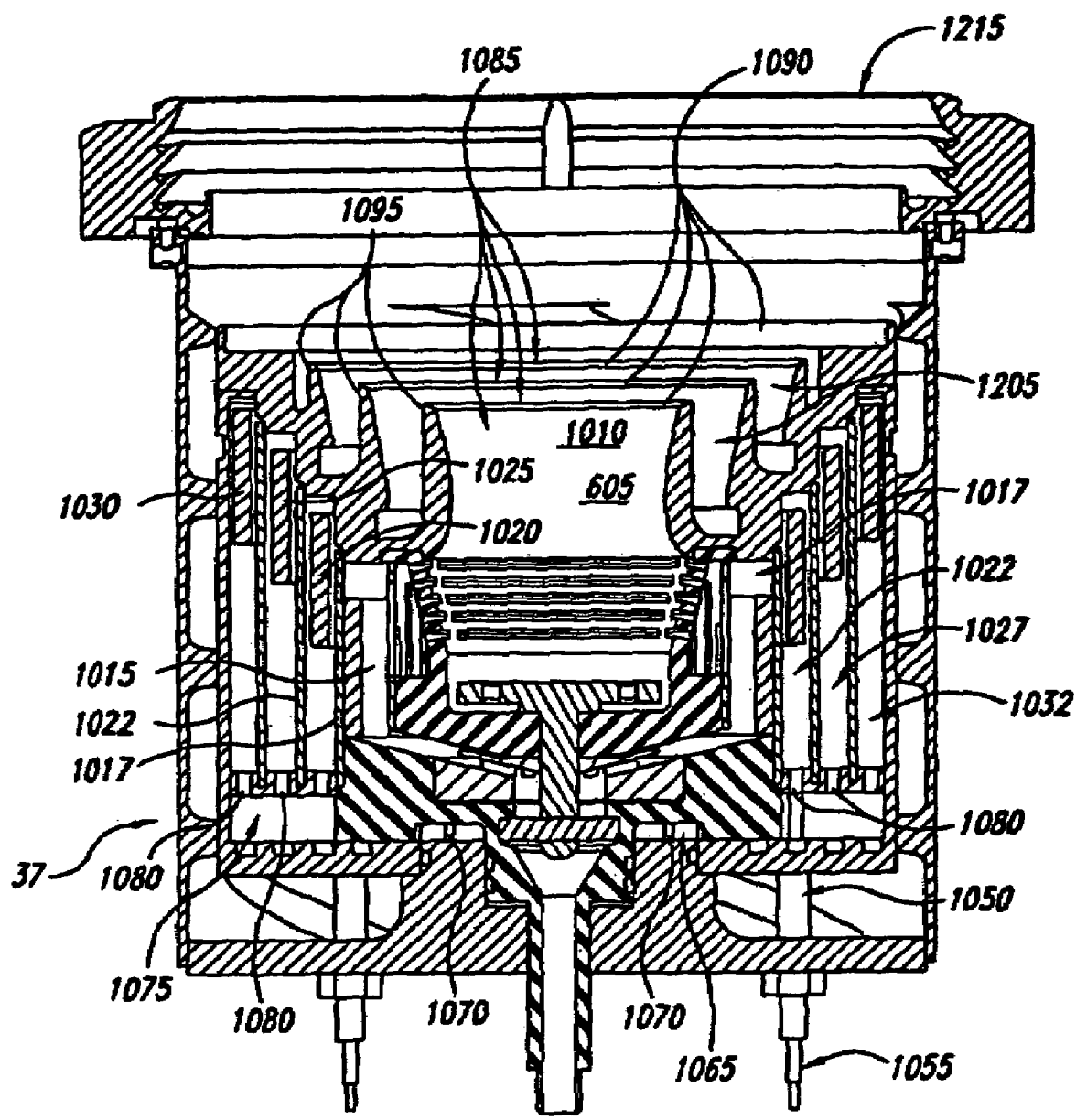

With reference to FIGS. 13 and 14, the reactor includes an electrochemical electroplating solution flow path into the innermost portion of the processing chamber that is very similar to the flow path of the embodiment illustrated in FIG. 9 and as implemented in the embodiment of the reactor chamber shown in FIGS. 10A through 12. As such, components that have similar functions are not further identified here for the sake of simplicity. Rather, only those portions of the reactor that significantly differ from the foregoing embodiment are identified and described below.

A significant distinction between the embodiments exists, however, in connection with the anode electrodes and the appertaining structures and fluid flow paths. More particularly, the reactor based 137 includes a plurality of ring-shaped anodes 1015, 1020, 1025 and 1030 that are concentrically disposed with respect to one another in respective anode chamber housings 1017, 1022, 1027 and 1032. As shown, each anode 1015, 1020, 1025 and 1030 has a vertically oriented surface area that is greater than the surface area of the corresponding anodes shown in the foregoing embodiments. Four such anodes are employed in the disclosed embodiment, but a larger or smaller number of anodes may be used depending upon the electrochemical processing parameters and results that are desired. Each anode 1015, 1020, 1025 and 1030 is supported in the respective anode chamber housing 1017, 1022, 1027 and 1032 by at least one corresponding support/conductive member 1050 that extends through the bottom of the processing base 137 and terminates at an electrical connector 1055 for connection to an electrical power source.

In accordance with the disclosed embodiment, fluid flow to and through the three outer most chamber housings 1022, 1027 and 1032 is provided from an inlet 1060 that is separate from inlet 515, which supplies the fluid flow through an innermost chamber housing 1017. As shown, fluid inlet 1060 provides electroplating solution to a manifold 1065 having a plurality of slots 1070 disposed in its exterior wall. Slots 1070 are in fluid communication with a plenum 1075 that includes a plurality of openings 1080 through which the electroplating solution respectively enters the three anode chamber housings 1022, 1027 and 1032. Fluid entering the anode chamber housings 1017, 1022, 1027 and 1032 flows over at least one vertical surface and, suitably, both vertical surfaces of the respective anode 1015, 1020, 1025 and 1030.

Each anode chamber housing 1017, 1022, 1027 and 1032 includes an upper outlet region that opens to a respective cup 1085. Cups 1085, as illustrated, are disposed in the reactor chamber so that they are concentric with one another. Each cup includes an upper rim 1090 that terminates at a predetermined height with respect to the other rims, with the rim of each cup terminating at a height that is vertically below the immediately adjacent outer concentric cup. Each of the three innermost cups further includes a substantially vertical exterior wall 1095 and a slanted interior wall 1200. This wall construction creates a flow region 1205 in the interstitial region between concentrically disposed cups (excepting the innermost cup that has a contoured interior wall that defines the fluid flow region 1205 and then the outer most flow region 1205 associated with the outer most anode) that increases in area as the fluid flows upward toward the surface of the microelectronic workpiece under process. The increase in area effectively reduces the fluid flow velocity along the vertical fluid flow path, with the velocity being greater at a lower portion of the flow region 1205 when compared to the velocity of the fluid flow at the upper portion of the particular flow region.

The interstitial region between the rims of concentrically adjacent cups effectively defines the size and shape of each of a plurality of virtual anodes, each virtual anode being respectively associated with a corresponding anode disposed in its respective anode chamber housing. The size and shape of each virtual anode that is seen by the microelectronic workpiece under process is generally independent of the size and shape of the corresponding actual anode. As such, consumable anodes that vary in size and shape over time as they are used can be employed for anodes 1015, 1020, 1025 and 1030 without a corresponding change in the overall anode configuration is seen by the microelectronic workpiece under process. Further, given the deceleration experienced by the fluid flow as it proceeds vertically through flow regions 1205, a high fluid flow velocity may be introduced across the vertical surfaces of the anodes 1015, 1020, 1025 and 1030 in the anode chamber housings 1022, 1027 and 1032 while concurrently producing a very uniform fluid flow pattern radially across the surface of the microelectronic workpiece under process. Such a high fluid flow velocity across the vertical surfaces of the anodes 1015, 1020, 1025 and 1030, as noted above, is desirable when using certain electrochemical electroplating solutions, such as electroplating fluids available from Atotech. Further, such high fluid flow velocities may be used to assist in removing some of the gas bubbles that form at the surface of the anodes, particularly inert anodes. To this end, each of the anode chamber housings 1017, 1022, 1027 and 1032 may be provided with one or more gas outlets (not illustrated) at the upper portion thereof to vent such gases.

Of further note, unlike the foregoing embodiment, element 1210 is a securement that is formed from a dielectric material. The securement 1210 is used to clamp a plurality of the structures forming reactor base 137 together. Although securement 1210 may be formed from a conductive material so that it may function as an anode, the innermost anode seen by the microelectronic workpiece under process is suitably a virtual anode corresponding to the interior most anode 1015.

Figure 15:
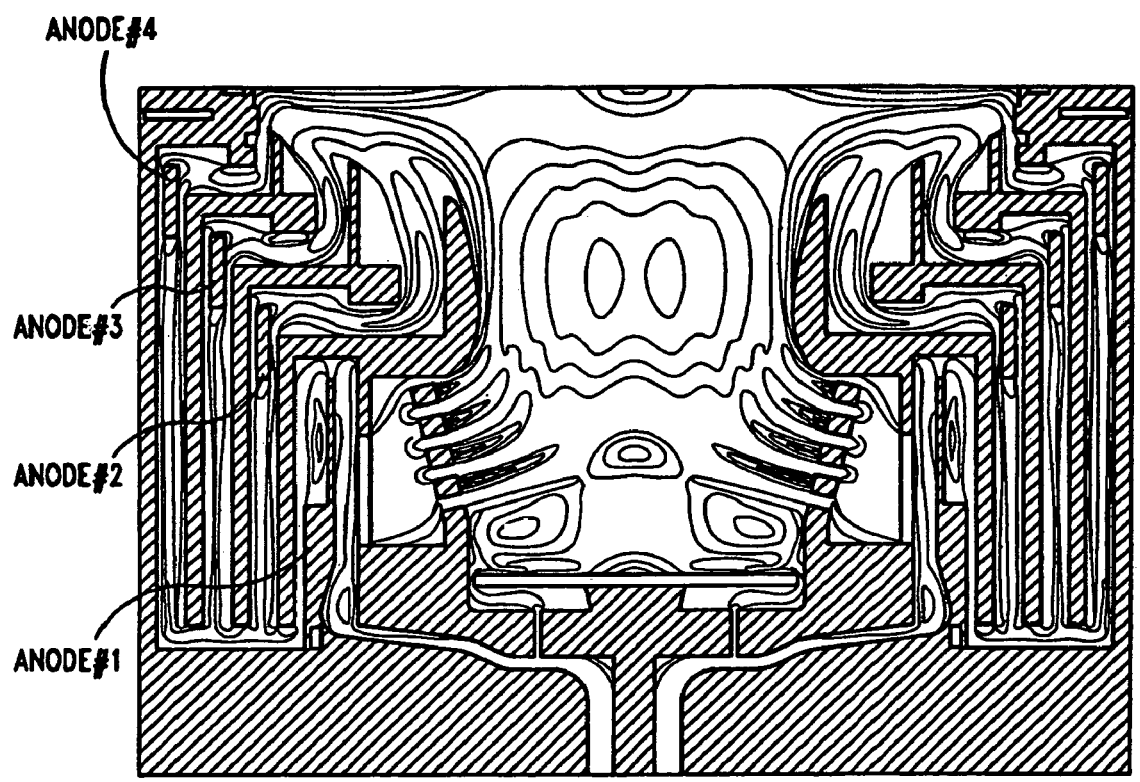
FIGS. 15 and 16 are a cross-sectional views of illustrative velocity flow contours of the processing chamber embodiment of FIGS. 13 and 14.
Figure 16:
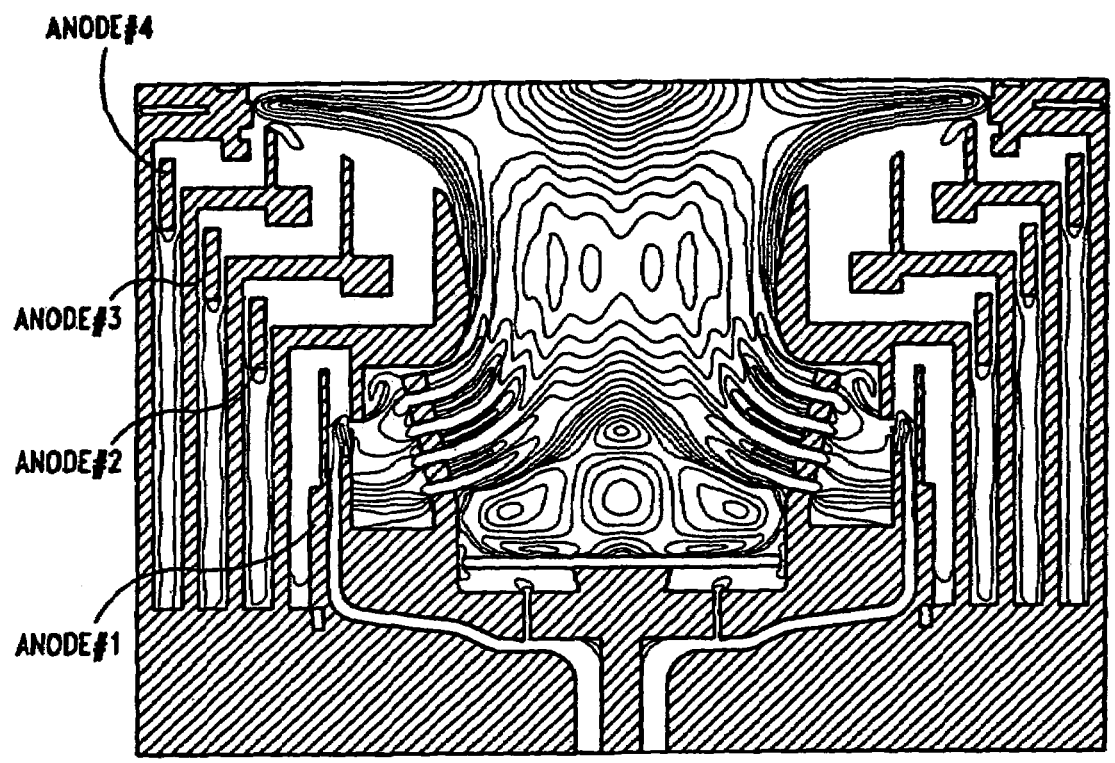
Figure 19:
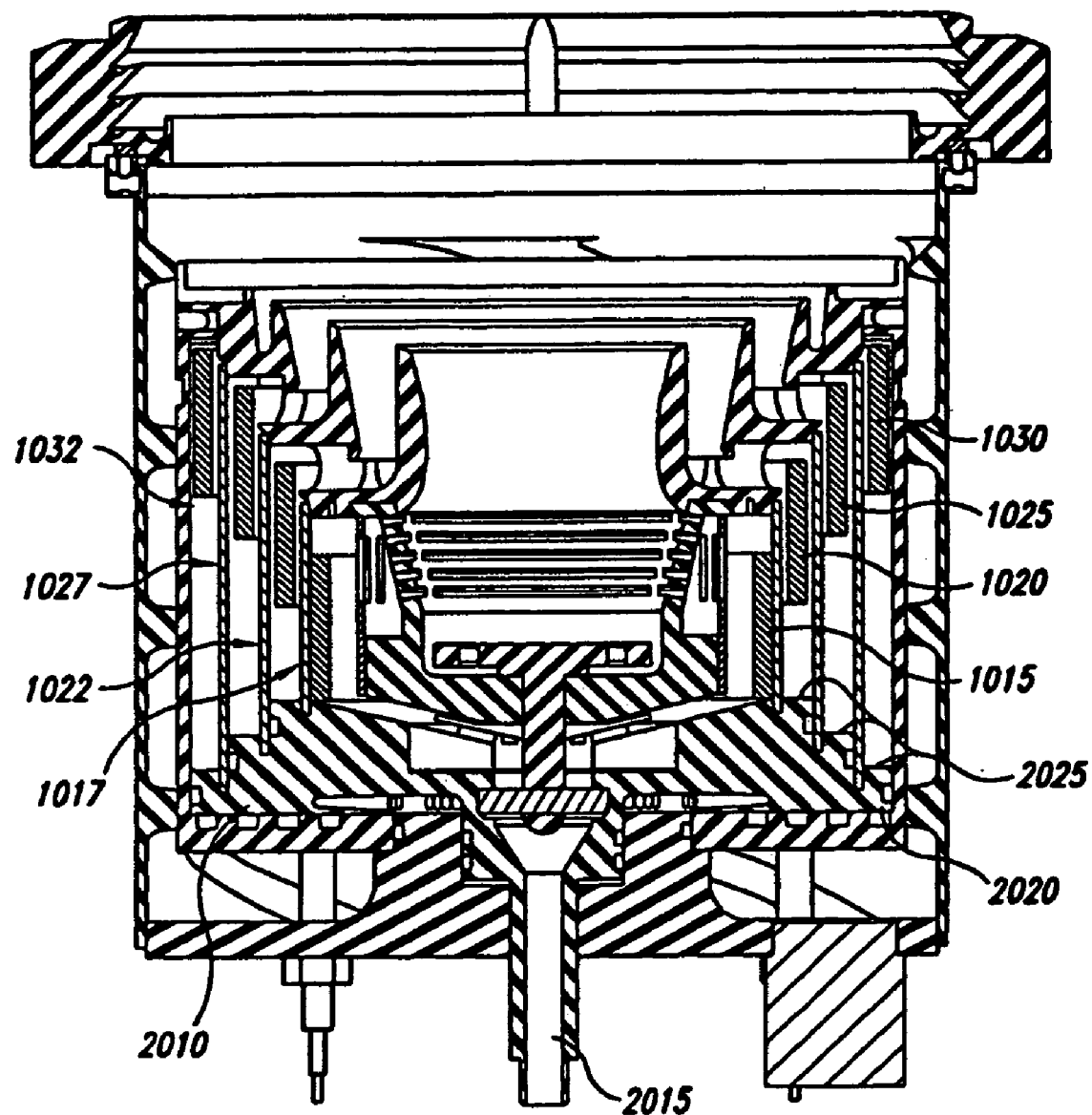
FIGS. 19 and 20 illustrate a modified version of the processing chamber of FIGS. 13 and 14.

FIGS. 15 and 16 illustrate computer simulations of fluid flow velocity contours of a reactor constructed in accordance with the embodiment shown in FIGS. 17 through 19. In this embodiment, all of the anodes of the reactor base may be isolated from a flow of fluid through the anode chamber housings. To this end, FIG. 15 illustrates the fluid flow velocity contours that occur when a flow of electroplating solution is provided through each of the anode chamber housings, while FIG. 16 illustrates the fluid flow velocity contours that occur when there is no flow of electroplating solution provided through the anode chamber housings past the anodes. This latter condition can be accomplished in the reactor of by turning off the flow from the second fluid flow inlet (described below) and may likewise be accomplished in the reactor of FIGS. 13 and 14 by turning of the fluid flow through inlet 1060. Such a condition may be desirable in those instances in which a flow of electroplating solution across the surface of the anodes is found to significantly reduce the organic additive concentration of the solution.

FIG. 19 illustrates a variation of the reactor embodiment shown in FIG. 14. For the sake of simplicity, only the elements pertinent to the following discussion are provided with reference numerals.

This further embodiment employs a different structure for providing fluid flow to the anodes 1015, 1020, 1025 and 1030. More particularly, the further embodiment employs an inlet member 2010 that serves as an inlet for the supply and distribution of the processing fluid to the anode chamber housings 1017, 1022, 1027 and 1032.

Figure 20:
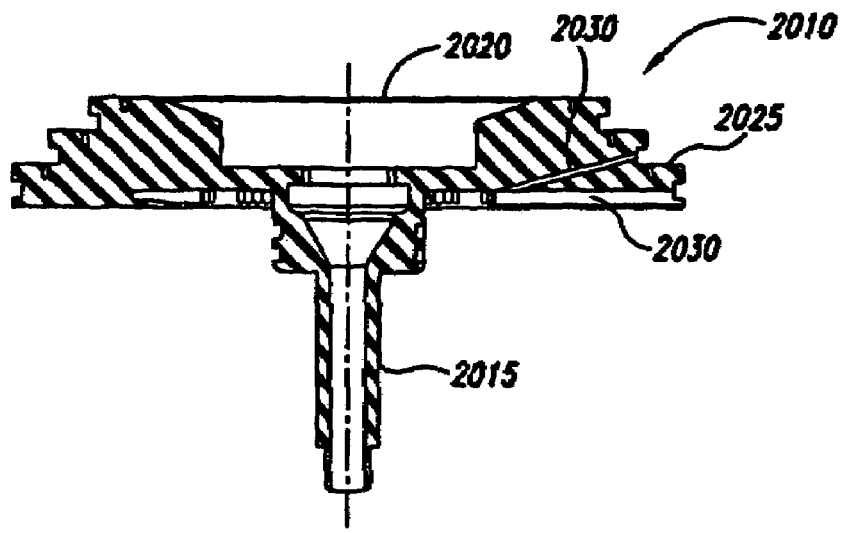

With reference to FIGS. 19 and 20, the inlet member 2010 includes a hollow stem 2015 that may be used to provide a flow of electroplating fluid. The hollow stem 2015 terminates at a stepped hub 2020. Stepped hub 2020 includes a plurality of steps 2025 that each include a groove dimensioned to receive and support a corresponding wall of the anode chamber housings. Processing fluid is directed into the anode chamber housings through a plurality of channels 2030 that proceed from a manifold area into the respective anode chamber housing.

This latter inlet arrangement assists in further electrically isolating anodes 1015, 1020, 1025 and 1030 from one another. Such electrical isolation occurs due to the increased resistance of the electrical flow path between the anodes. The increased resistance is a direct result of the increased length of the fluid flow paths that exist between the anode chamber housings.

The manner in which the electroplating power is supplied to the microelectronic workpiece at the peripheral edge thereof effects the overall film quality of the deposited metal. Some of the more desirable characteristics of a contact assembly used to provide such electroplating power include, for example, the following:

uniform distribution of electroplating power about the periphery of the microelectronic workpiece to maximize the uniformity of the deposited film;

consistent contact characteristics to insure wafer-to-wafer uniformity;

minimal intrusion of the contact assembly on the microelectronic workpiece periphery to maximize the available area for device production; and minimal plating on the barrier layer about the microelectronic workpiece periphery to inhibit peeling and/or flaking.

To meet one or more of the foregoing characteristics, reactor assembly 120 suitably employs a contact assembly 185 that provides either a continuous electrical contact or a high number of discrete electrical contacts with the microelectronic workpiece 125. By providing a more continuous contact with the outer peripheral edges of the microelectronic workpiece 125, in this case around the outer circumference of the semiconductor wafer, a more uniform current is supplied to the microelectronic workpiece 125 that promotes more uniform current densities. The more uniform current densities enhance uniformity in the depth of the deposited material.

Contact assembly 185, in accordance with an embodiment, includes contact members that provide minimal intrusion about the microelectronic workpiece periphery while concurrently providing consistent contact with the seed layer. Contact with the seed layer is enhanced by using a contact member structure that provides a wiping action against the seed layer as the microelectronic workpiece is brought into engagement with the contact assembly. This wiping action assists in removing any oxides at the seed layer surface thereby enhancing the electrical contact between the contact structure and the seed layer. As a result, uniformity of the current densities about the microelectronic workpiece periphery are increased and the resulting film is more uniform. Further, such consistency in the electrical contact facilitates greater consistency in the electroplating process from wafer-to-wafer thereby increasing wafer-to-wafer uniformity.

Contact assembly 185, as will be set forth in further detail below, also suitably includes one or more structures that provide a barrier, individually or in cooperation with other structures, that separates the contact/contacts, the peripheral edge portions and backside of the microelectronic workpiece 125 from the plating solution. This prevents the plating of metal onto the individual contacts and, further, assists in preventing any exposed portions of the barrier layer near the edge of the microelectronic workpiece 125 from being exposed to the electroplating environment. As a result, plating of the barrier layer and the appertaining potential for contamination due to flaking of any loosely adhered electroplated material is substantially limited. Exemplary contact assemblies suitable for use in the present system are illustrated in U.S. Ser. No. 09/113,723, filed Jul. 10, 1998, which is hereby incorporated by reference.

Figure 21:
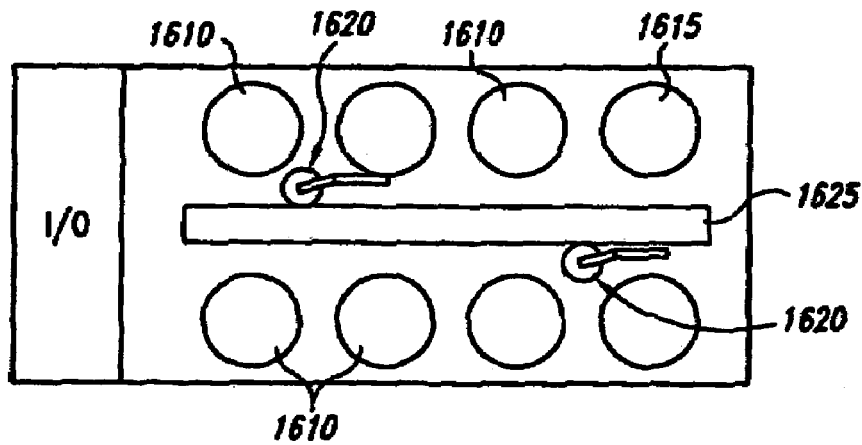
FIGS. 21 and 22 illustrate two embodiments of processing tools that may incorporate one or more processing stations constructed in accordance with the teachings of the present invention.
Figure 22:
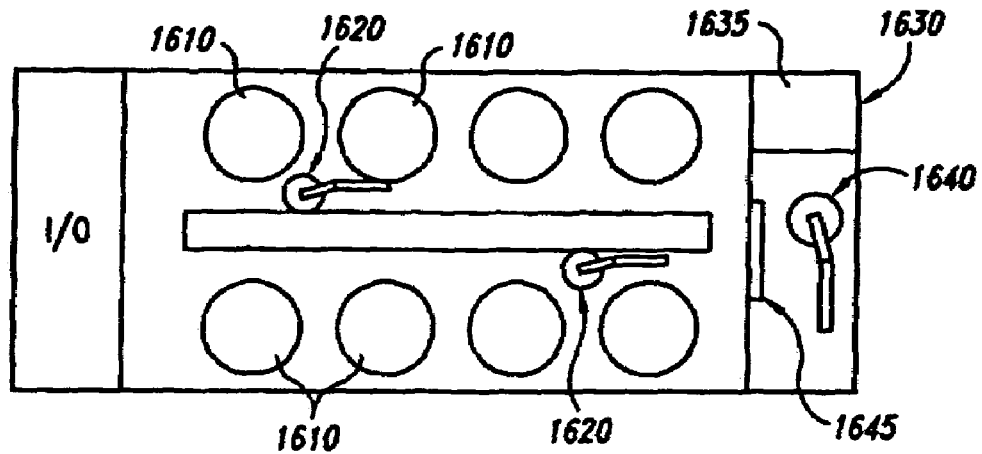

One or more of the foregoing reactor assemblies may be readily integrated in a processing tool that is capable of executing a plurality of processes on a workpiece, such as a semiconductor microelectronic workpiece. One such processing tool is the LT-210™ electroplating apparatus available from Semitool, Inc., of Kalispell, Mont. FIGS. 21 and 22 illustrate such integration.

The system of FIG. 21 includes a plurality of processing stations 1610. Suitably, these processing stations include one or more rinsing/drying stations and one or more electroplating stations (including one or more electroplating reactors such as the one above), although further immersion-chemical processing stations constructed in accordance with the of the present invention may also be employed. The system also suitably includes a thermal processing station, such as at 1615, that includes at least one thermal reactor that is adapted for rapid thermal processing (RTP).

The workpieces are transferred between the processing stations 1610 and the RTP station 1615 using one or more robotic transfer mechanisms 1620 that are disposed for linear movement along a central track 1625. One or more of the stations 1610 may also incorporate structures that are adapted for executing an in-situ rinse. Suitably, all of the processing stations as well as the robotic transfer mechanisms are disposed in a cabinet that is provided with filtered air at a positive pressure to thereby limit airborne contaminants that may reduce the effectiveness of the microelectronic workpiece processing.

FIG. 22 illustrates a further embodiment of a processing tool in which an RTP station 1635, located in portion 1630, that includes at least one thermal reactor, may be integrated in a tool set. Unlike the embodiment of FIG. 21, in this embodiment, at least one thermal reactor is serviced by a dedicated robotic mechanism 1640. The dedicated robotic mechanism 1640 accepts workpieces that are transferred to it by the robotic transfer mechanisms 1620. Transfer may take place through an intermediate staging door/area 1645. As such, it becomes possible to hygienically separate the RTP portion 1630 of the processing tool from other portions of the tool. Additionally, using such a construction, the illustrated annealing station may be implemented as a separate module that is attached to upgrade an existing tool set.

It will be recognized that other types of processing stations may be located in portion 1630 in addition to or instead of RTP station 1635.

D. Selective Electrode Control

Figure 23:
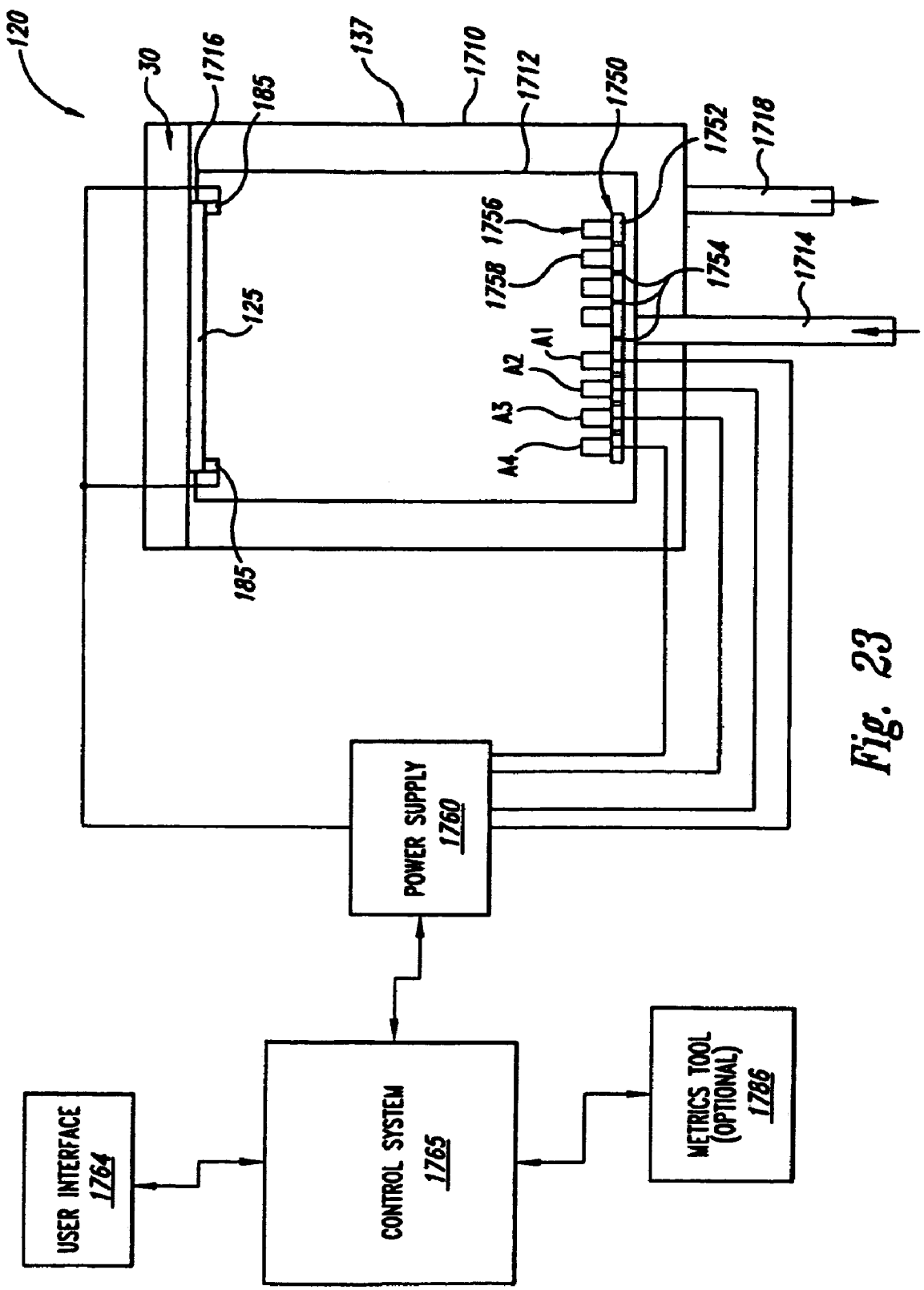
FIG. 23 is schematic block diagram of an electrochemical processing system constructed in accordance with one embodiment of the present invention.

The selective control and adjustment of the anodes for uniform electrodeposition, such as during electrochemical deposition of metallization structures or seed layer enhancement, will now be further described. FIG. 23 shows a schematic representation of the reactor assembly 120 illustrated in FIG. 8. Thus, as previously described, the reactor includes a reactor head 130 and a reactor base 137.

As previously described with reference to FIG. 9, the reactor head 130 includes a stationary assembly and a rotor assembly that carries the workpiece 125 and suitably positions it process-side down. The rotor assembly rotates or spins the workpiece 125 while joining its electrically conductive surface. The reactor head 130 thus includes one or more cathode contacts, shown generally at 185, that electrically contact the lower surface of the workpiece 125.

The reactor base 137 includes an outer overflow container 1710 and an interior processing container 1712. A flow of electroplating fluid is provided to the processing container 1712 through the inlet 1714. The electroplating fluid fills the interior of processing container 1712 and overflows a weir 1716 formed at the top of processing container 1712. The fluid overflowing weir 1716 then enters overflow container 1710, and exits the reactor 120 through an outlet 1718. Outlet 1718 may be directed to a recirculation system, chemical refurbishment system, or disposal system.

An electrode assembly, shown generally at 1750, is disposed in the processing container 1712 in contact with the electrochemical processing fluid (here, the electroplating fluid). Electrode assembly 1750 includes a base member 1752 in which a plurality of fluid flow apertures 1754 are disposed. The fluid flow apertures 1754 assist in disbursing the electroplating fluid flow entering inlet 1714 so that the flow of electroplating fluid at the surface of microelectronic workpiece 125 is less localized and radially more uniform. Electrode assembly 1750 also includes an electrode array, shown generally at 1756, that comprises a plurality of individual electrodes 1758 that are supported by base member 1752. Electrode array 1756 may take on any number of physical configurations. The particular physical configuration that is utilized in a given reactor is principally dependent on the particular type and shape of microelectronic workpiece 125 that is to be processed. In the illustrated embodiment, microelectronic workpiece 125 is in the form of a disk-shaped semiconductor wafer. Accordingly, the present inventors have found that the individual electrodes 1758 may be formed as rings of different diameters and that they may be arranged concentrically in alignment with the center of microelectronic workpiece 125. It will be recognized, however, that other electrode array configurations may also be employed without departing from the scope of the present invention.

When reactor 120 is used to electroplate at least one surface of microelectronic workpiece 125, the surface of the workpiece 125 that is electroplated functions as a cathode in the electrochemical reaction while electrode array 1756 functions as an anode. To this end, the surface of workpiece 125 that is to be electroplated is connected to a negative potential terminal of a power supply 1760 through contacts 185 and the individual electrodes 1758 of electrode array 1756 are connected to positive potential terminals of supply 1760. And the illustrated embodiment, each of the individual electrodes 1758 is connected to a discrete terminal of supply 1760 so that supply 1760 may individually alter one or more electrical parameters, such as the current flow, associated with each of the individual electrodes 1758. As such, each of the individual electrodes 1758 of FIG. 23 is an individually controllable electrode. It will be recognized, however, that one or more of the individual electrodes 1758 of electrode array 1756 may be connected to a common node/terminal of power supply 1760. In such instances, power supply 1760 will alter the one or more electrical parameters of the commonly connected electrodes 1758 concurrently, as opposed to individually, thereby effectively making the commonly connected electrodes 1758 a single, individually controllable electrode. As such, individually controllable electrodes can be formed from physically distinct electrodes that are connected to discrete terminals of power supply 1760 as well as from physically distinct electrodes that are commonly connected to a single discrete terminal of power supply 1760. Electrode array 1756 suitably comprises at least two individually controllable electrodes.

Electrode array 1756 and power supply 1760 facilitate localized control of the electrical parameters used to electrochemically process the microelectronic workpiece 125. This localized control of the electrical parameters can be used to provide greater uniformity of the electrochemical processing across the surface of the microelectronic workpiece when compared to a single electrode system. However, determining the electrical parameters for each of the electrodes 1758 in array 1756 to achieve the desired process uniformity can be problematic. Accordingly, the present inventors have developed a method and apparatus that simplifies and substantially automates the determination of the electrical parameters associated with each of the individually controllable electrodes. In accordance with this approach, a plurality of sensitivity values are determined, either experimentally or through numerical simulation, and subsequently used to adjust the electrical parameters associated with each of the individually controllable electrodes. The sensitivity values may be placed in a table or may be in the form of a Jacobian matrix. This table/matrix holds information corresponding to process parameter changes (i.e., thickness of the electroplated film) at various points on the workpiece 125 due to electrical parameter perturbations (i.e., electrical current changes) to each of the individually controllable electrodes. This table/matrix is derived from data from a baseline workpiece plus data from separate runs with a perturbation of a controllable electrical parameter to each of the individually controllable.

Figure 24:
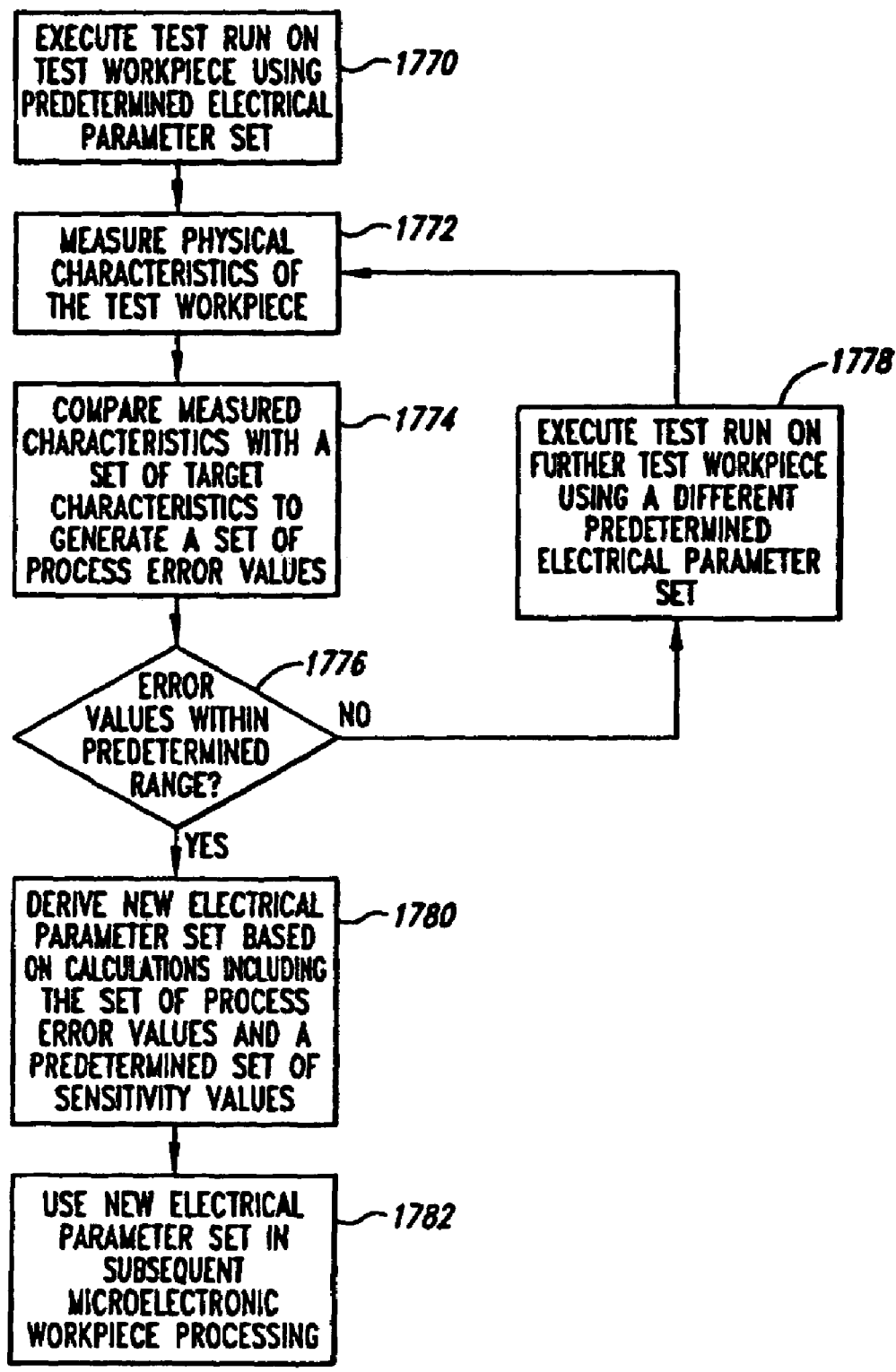
FIG. 24 is a flowchart illustrating one manner in which the system of FIG. 23 can use a predetermined set of sensitivity values to generate a more accurate electrical parameter set for use in meeting targeted physical characteristics in the processing of a microelectronic workpiece.

Once the values for the sensitivity table/matrix have been determined, the values may be stored in and used by control system 1765 to control one or more of the electrical parameters that power supply 1760 uses in connection with each of the individually controllable electrodes 1758. FIG. 24 is an exemplary flow diagram illustrating one manner in which the sensitivity table/matrix may be used to calculate an electrical parameter (i.e., current) for each of the individually controllable electrodes 1758 that may be used to meet a target process parameter (i.e., target thickness of the electroplated film).

In the exemplary process of FIG. 24, control system 1765 utilizes two sets of input parameters along with the sensitivity table/matrix to calculate the required electrical parameters. A first set of input parameters corresponds to the data derived from a test run of the process while using a known, predetermined set of electrical parameters. This first set of input parameters can be derived by first executing a test run on a test workpiece using the predetermined electrical parameter set, as shown at step 1770. For example, a test run can be performed by subjecting a microelectronic workpiece 125 to an electroplating process in which the current provided to each of the individually controllable electrodes 1758 is fixed at a predetermined magnitude for a given period of time.

After the test run is complete, the physical characteristics (i.e., thickness of the electroplated film) of the test workpiece are measured, as at step 1772, and compared against a second set of input parameters at step 1774. In the illustrated embodiment of the method, the second set of input parameters corresponds to the target physical characteristics of the microelectronic workpiece that are to be ultimately achieved by the process (i.e., the thickness of the electroplated film). Notably, the target physical characteristics can either be uniform over the surface of the microelectronic workpiece 125 or vary over the surface. For example, in the illustrated embodiment, the thickness of an electroplated film on the surface of the microelectronic workpiece 125 can be used as the target physical characteristic, and the user may expressly specify the target thicknesses at various radial distances from the center of the workpiece.

The first and second set of input parameters are used at step 1774 to generate a set of process error values. To ensure the integrity of the data obtained during the test run, the process error values may be checked at step 1776 to make sure that the values fall within a predetermined range, tolerance, etc. If the process error values do not pass this test, a further test run on a further test workpiece may be executed using a different predetermined electrical parameter set, as at step 1778, and the method begins again. If the process error values meet the test at step 1776, the control system 1765 derives a new electrical parameter set based on calculations including the set of process error values and the values of the sensitivity table/matrix, as at step 1780. Once the new electrical parameter set is derived, the control system 1765 directs power supply 1760 to use the derived electrical parameters in subsequent processing of further microelectronic workpieces to achieve the desired target physical characteristics, as at step 1782.

With reference again to FIG. 23, the exemplary system illustrates two potential manners in which the first and second set of input parameters may be provided to the control system 1765: a user interface 1784 and a metrics tool 1786. User interface 1784 may be comprised of, for example, a keyboard, a touch-sensitive screen, a voice recognition system, etc. Metrics tool 1786 may be an automated tool that is used to measure the physical characteristics of the test workpiece after the test run. When both a user interface 1784 and a metrics tool 1786 are employed, the user interface 1784 may be used to input the target physical characteristics that are to be achieved by the process while metrics tool 1786 may be used to directly communicate the measured physical characteristics of the test workpiece to the control system 1765. In the absence of a metrics tool that can communicate with control system 1765, the measured physical characteristics of the test workpiece can be provided to control system 1765 through user interface 1784. It will be recognized that other data communications devices may be used to provide the first and second set of input parameters to control system 1765, the foregoing being merely exemplary.

Figure 25:
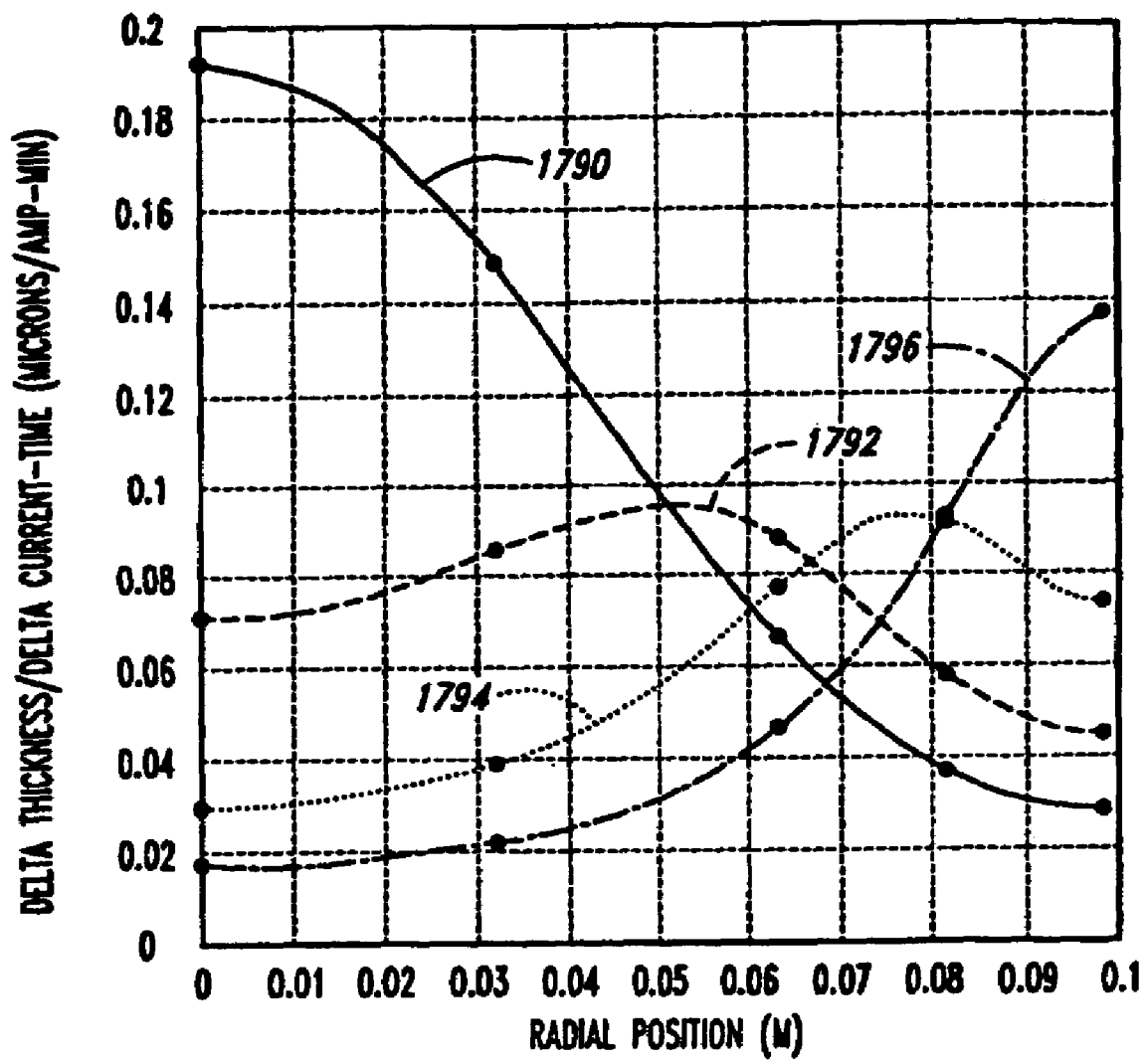
FIG. 25 is a graph of the change in electroplated film thickness per change in current-time as a function of radial position on a microelectronic workpiece for each of a plurality of individually controlled anodes, such as those shown at A1-A4 of FIG. 23.

The foregoing method and apparatus can further be understood with reference to a specific embodiment in which the electrochemical process is electroplating, the thickness of the electroplated film is the target physical parameter, and the current provided to each of the individually controlled electrodes 1758 is the electrical parameter that is to be controlled to achieve the target film thickness. In accordance with this specific embodiment, a Jacobian sensitivity matrix is first derived from experimental or numerically simulated data. FIG. 25 is a graph of such data that can be used to derive the Jacobian sensitivity matrix data. As illustrated, FIG. 25 is a graph of the change in electroplated film thickness per change in current-time as a function of radial position on the microelectronic workpiece 125 for each of the individually controlled anodes A1-A4 of FIG. 23. A first baseline workpiece is electroplated for a predetermined period of time using a predetermined set of current values to individually controlled anodes A1-A4. The thickness of the resulting electroplated film is then measured as a function of the radial position on the workpiece. These data points are then used as baseline measurements that are compared to the data acquired as the current to each of the anodes A1-A4 is perturbated. Line 1790 is a plot of the data points associated with a perturbation in the current provided by power supply 1760 to anode A1 with the current to the remaining anodes A2-A4 held at their constant predetermined values. Line 1792 is a plot of the data points associated with a perturbation in the current provided by power supply 1760 to anode A2 with the current to the remaining anodes A1 and A3-A4 held at their constant predetermined values. Line 1794 is a plot of the data points associated with a perturbation in the current provided by power supply 1760 to anode A3 with the current to the remaining anodes A1-A2 and A4 held at their constant predetermined values. Lastly, line 1796 is a plot of the data points associated with a perturbation in the current provided by power supply 1760 to anode A4 with the current to the remaining anodes A1-A3 held at their constant predetermined values.

The data for the Jacobian parameters shown in FIG. 3 may be computed using the following equations:

$$J_{mn} = \frac{\partial t_m}{\partial AM_n} \cong \frac{t_m(AM + \varepsilon_n) - t_m(AM)}{|\varepsilon_n|} \qquad \text{Equation (A1)}$$

$$AM = [AM_1 \ AM_2 \ \ldots \ AM_n] \qquad \text{Equation (A3)}$$

$$t = t(AM) \qquad \text{Equation (A2)}$$

$$\varepsilon_1 = \begin{bmatrix} \Delta AM_1 \\ 0 \\ \vdots \\ \vdots \\ 0 \end{bmatrix} \quad \varepsilon_2 = \begin{bmatrix} 0 \\ \Delta AM_2 \\ 0 \\ \vdots \\ 0 \end{bmatrix} \quad \varepsilon m = \begin{bmatrix} 0 \\ \vdots \\ \vdots \\ 0 \\ \Delta AM_m \end{bmatrix} \qquad \text{Equation (A4)}$$

where:

t represents thickness [microns];

AM represents current [amp-minutes];

$\varepsilon$ represents perturbation [amp-minutes];

m is an integer corresponding to a radial position on the workpiece; and n is an integer representing a particular anode.

The Jacobian sensitivity matrix, set forth below as Equation (A5), is an index of the Jacobian values computed using Equations (A1)-(A4). These values are also presented as highlighted data points in the graph of FIG. 25. These values correspond to the radial positions on the surface of a semiconductor wafer that are typically chosen for measurement.

$$J = \begin{vmatrix} 0.192982456 & 0.071570577 & 0.030913978 & 0.017811705 \\ 0.148448043 & 0.084824387 & 0.039650538 & 0.022264631 \\ 0.066126856 & 0.087475149 & 0.076612903 & 0.047073791 \\ 0.037112011 & 0.057654076 & 0.090725806 & 0.092239186 \\ 0.029689609 & 0.045725646 & 0.073924731 & 0.138040712 \end{vmatrix}$$

Equation (A5)

Once the values for the Jacobian sensitivity matrix have been derived, they may be stored in control system 1765 for further use.

Table 1 below sets forth exemplary data corresponding to a test run in which a 200 mm wafer is plated with copper in a multiple anode system using a nominally 2000 Å thick initial copper seed-layer. Identical currents of 1.12 Amps (for 3 minutes) were provided to all four anodes A1-A4. The resulting thickness at five radial locations was then measured and is recorded in the second column of Table 1. The 3 sigma uniformity of the wafer is 9.4% using a 49 point contour map. Target thickness were then provided and are set forth in column 3 of Table 1. The thickness errors (processed errors) between the plated film and the target thickness were then calculated and are provided in the last column of Table 1.

TABLE 1

Data from wafer plated with 1.12 Amps to each anode.

| Radial Location (m) | Measured Thickness (microns) | Target Thickness (microns) | Error (microns) |
|---|---|---|---|
| 0 | 1.1081 | 1.0291 | −0.0790 |
| 0.032 | 1.0778 | 1.0291 | −0.0487 |
| 0.063 | 1.0226 | 1.0291 | 0.0065 |
| 0.081 | 1.0169 | 1.0291 | 0.0122 |
| 0.098 | 0.09987 | 1.0291 | 0.0304 |

The Jacobian sensitivity matrix may then be used along with the thickness error values to provide a further, revised set of anode current values that should yield better film uniformity. The equations summarizing this approach are set forth below:

$\Delta AM = J^{-1} \Delta t$ (for a square system in which the number of measured radial positions corresponds to the number of individually controlled anodes in the system); and $\Delta AM = (J^T J)^{-1} \Delta t$ (for a non-square system in which the number of measured radial positions is different than the number of individually controlled anodes in the system)

Table 2 shows the foregoing equations as applied to the given data set and the corresponding current changes that have been derived from the equations to meet the target thickness at each radial location (best least square fit). The wafer uniformity obtained with the currents in the last column of Table 2 was 1.7% (compared to 9.4% for the test run wafer). This procedure can be repeated again to try to further improve the uniformity. In this example, the differences between the seed layers were ignored.

TABLE 2

Current adjustment

| Anode# | Anode Currents for Run#1 (Amps) | Change to Anode Currents (Ames) | Anode Currents for Run#2 (Amps) |
|---|---|---|---|
| 1 | 1.12 | −0.21 | 0.91 |
| 2 | 1.12 | 0.20 | 1.32 |
| 3 | 1.12 | −0.09 | 1.03 |
| 4 | 1.12 | 0.10 | 1.22 |

Once the corrected values for the anode currents have been calculated, control system 1765 of FIG. 23 directs power supply 1760 to provide the corrected current to the respective anode A1-A4 during subsequent processes to meet the target film thickness and uniformity.

In some instances, it may be desirable to iteratively apply the foregoing equations to arrive at a set of current change values (the values represented in column 3 of Table 2) that add up to zero. This may be desirable when, for example, the processing recipe defined by the user is entered using amp-minute values.

The Jacobian sensitivity matrix in the foregoing example quantifies the system response to anode current changes about a baseline condition. Ideally, a different matrix may be employed if the processing conditions vary significantly from the baseline. The number of system parameters that may influence the sensitivity values of the sensitivity matrix is quite large. Such system parameters include the seed layer thickness, the electrolyte conductivity, the metal being plated, the film thickness, the plating rate, the contact ring geometry, the wafer position relative to the chamber, and the anode shape/current distribution. Anode shape/current distribution is included for the case of consumable anodes where the anode shape changes over time. Changes to all of these items can change the current density across the wafer for a given set of anode currents and, as a result, can change the response of the system to changes in the anode currents. It is expected, however, that small changes to many of these parameters will not require the calculation of a new sensitivity matrix. Nevertheless, a plurality of sensitivity tables/matrices may be derived for different processing conditions and stored in control system 1765. Which of the sensitivity tables/matrices is to be used by the control system 1765 can be entered manually by a user, or can be set automatically depending on measurements taken by certain sensors or the like (i.e., temperature sensors, chemical analysis units, etc.) that indicate the existence of one or more particular processing conditions.

The foregoing apparatus and methods may also be used to compensate for differences and non-uniformities of the initial seed layer of the microelectronic workpiece. Generally stated, a blanket seed layer can affect the uniformity of a plated film in two ways:

If the seed layer non-uniformity changes, this non-uniformity is added to the final film. For example, if the seed layer is 100 Å thinner at the outer edge than expected, the final film thickness will also be 100 Å thinner at the outer edge.

If the average seed-layer thickness changes significantly, the resistance of the seed-layer will change resulting in a modified current density distribution across the wafer and altered film uniformity. For example, if the seed layer decreases from 2000 Å to 1000 Å, the final film will not only be thinner (because the initial film is thinner) but it will also be relatively thicker at the outer edge due to the higher resistivity of the 1000 Å seed-layer compared to the 2000 Å seed-layer (assuming an edge contact).

The foregoing apparatus and methods can be used to compensate for such seed-layer deviations. In the first case above, the changes in seed-layer uniformity may be handled in the same manner that errors between target thickness and measured thickness are handled. A pre-measurement of the wafer quantifies changes in the seed-layer thickness at the various radial measurement locations and these changes (errors) are figured into the current adjustment calculations. Using this approach, excellent uniformity results can be obtained on the new seed layer, even on the first attempt at electroplating.

In the second case noted above, an update of or selection all of the and other stored sensitivity/Jacobian matrix can be used to account for a significantly different resistance of the seed-layer. A simple method to adjust for the new seed layer thickness is to plate a film onto the new seed layer using the same currents used in plating a film on the previous seed layer. The thickness errors measured from this wafer can be used with a sensitivity matrix appropriate for the new seed-layer to adjust the currents.

The Jacobian matrix analysis or other methods of determining how to selectively control the electrodes A1-A4 can also be used to carry out the seed layer enhancement as set forth above herein, so as to create a more uniform seed layer across the face of the workpiece prior to subsequent electrodeposition. Independent control of electrodes or banks of electrodes is particularly useful for tuning the reactor to compensate for high resistance in the substream or barrier on which the seed layer is formed, both during seed layer enhancement and subsequent deposition.

The foregoing apparatus and methods may also be used to compensate for reactor-to-reactor variations in a multiple reactor system, such as the LT-210C™ available from Semitool, Inc., of Kalispell, Mont. In such a system, there is a possibility that the anode currents required to plate a specified film might be different on one reactor when compared to another. Some possible sources for such differences include variations in the wafer position due to tolerances in the lift-rotate mechanism, variations in the current provided to each anode due to power supply manufacturing tolerances, variations in the chamber geometry due to manufacturing tolerances, variations in the plating solution, etc.

In a single anode system, the reactor-to-reactor variation is typically reduced either by reducing hardware manufacturing tolerances or by making slight hardware modifications to each reactor to compensate for reactor variations. In a multiple anode reactor constructed in accordance with the teachings of the present invention, reactor-to-reactor variations can be reduced/eliminated by running slightly different current sets in each reactor. As long as the reactor variations do not fundamentally change the system response (i.e. the sensitivity matrix), the self-tuning scheme disclosed herein is expected to find anode currents that meet film thickness targets. Reactor-to-reactor variations can be quantified by comparing differences in the final anode currents for each chamber. These differences can be saved in one or more offset tables in the control system 65 so that the same recipe may be utilized in each reactor. In addition, these offset tables may be used to increase the efficiency of entering new processing recipes into the control system 65. Furthermore, these findings can be used to trouble-shoot reactor set up. For example, if the values in the offset table are over a particular threshold, the deviation may indicate a hardware deficiency that needs to be corrected.

The anode arrangements described hereinabove, such as that illustrated and described in FIG. 9, are particularly well-suited for enhancing seed layers that are deposited on highly resistive barrier layers or substrates, for plating microelectronic workpieces having highly resistive seed layers as well as for plating highly resistive materials on microelectronic workpieces. Generally stated, the more resistive the seed layer or material that is to be deposited, the more the magnitude of the current at the central anode (or central anodes) should be increased to yield a uniform film.

The embodiments of the invention in which an exclusive property or privilege is claimed are defined as follows:

1. A process for applying a metallization interconnect structure, comprising:
   (a) providing a workpiece comprising a surface on which a copper metal seed layer is to be formed;
   (b) using a first electrolytic deposition process to deposit the copper metal seed layer to substantially the entire surface simultaneously, the first electrolytic deposition process forming the copper metal seed layer directly on an underlying barrier layer; and
   (c) the first electrolytic deposition process taking place within a principal fluid flow chamber of a reactor and comprising supplying electroplating power to a plurality of anodes disposed at different positions within the principal fluid flow chamber relative to the workpiece.

2. The process of claim 1, wherein the copper metal is a copper alloy.

3. The process of claim 1, wherein the first electrolytic deposition process occurs in an alkaline bath.

4. The process of claim 3, wherein the alkaline bath comprises metal ions and an agent effective in complexing the metal ions.

5. The process of claim 4, wherein the complexing agent comprises one or more complexing agents selected from EDTA, ED, and polycarboxylic acid.

6. The process of claim 4, wherein the complexing agent comprises ED and wherein the ED in the electrolytic bath has a concentration within the range of 0.03 to 1.0 M.

7. The process of claim 4, wherein the complexing agent comprises citric acid and the citric acid in the bath has a concentration within the range of 0.03 to 1.0 M.

8. The process of claim 1, further including a second electrolytic deposition process to complete deposition of the metal to a thickness needed for the formation of the interconnect structure.

9. The process of claim 8, wherein the second electrolytic deposition process occurs in an acidic electrolytic solution.

10. The process of claim 1, wherein one or more of the plurality of concentric anodes is disposed in close proximity to the workpiece.

11. The process of claim 1, further including a second electrolytic deposition process comprising depositing a copper metal on the metal seed layer under conditions in which the deposition rate of the second electrolytic deposition process is substantially greater than the deposition rate of the first electrolytic deposition process.

12. The new process of claim 1, wherein the workpiece includes one or more sub-micron recesses in which the copper metal seed layer is to be formed.

13. The process of claim 1, wherein the plurality of anodes are concentrically arranged at varying distances from the workpiece from an innermost one of the plurality of anodes to an outermost one of the plurality of anodes.

14. The process of claim 1, wherein one or more of the plurality of anodes includes a virtual anode.

15. The process of claim 14, wherein the virtual anode comprises an anode chamber housing having a processing fluid inlet and a processing fluid outlet, the processing fluid outlet being disposed in close proximity to the workpiece, and at least one conductive anode element disposed in the anode chamber housing.

16. The process of claim 15, wherein the at least one conductive anode element is formed from non consumable material.

17. The process of claim 1, wherein the principal fluid chamber in which the first electrolytic deposition is carried out, is defined in an upper portion thereof by an angled wall, the angled wall supporting one or more of the plurality of anodes.

18. The process of claim 1, wherein the deposition of the copper metal seed layer is carried out in a principal fluid flow chamber that comprises an inlet disposed at a lower portion thereof and that is configured to provide a venturi effect that facilitates recirculation of a chemical processing fluid in a lower portion of the principal fluid flow chamber.

19. The process of claim 1, wherein during the first electrolytic deposition process at least two of the plurality of anodes are independently connected to an electrical power supply, and the first electrolytic deposition process further comprises independently controlling the supply of electrical power to the at least two of the plurality of anodes.

20. The process of claim 19, wherein the controlling of the supply of power for at least one of the independently controlled anodes is based on one or more user input parameters and a plurality of predetermined sensitivity.

21. The process of claim 20, wherein the electrical power parameter is electrical current.

22. The process of claim 21, wherein the sensitivity values are logically arranged within a controller as one or more Jacobian matrices.

23. A process for applying a metallization interconnect structure, comprising:
(a) providing a workpiece on which a copper metal seed layer has been formed using a first deposition process, the workpiece defining a first horizontal plane, the first deposition process being an electrolytic deposition process that forms the copper metal seed layer directly on an underlying barrier layer;
(b) the first deposition process comprising supplying electroplating power to a plurality of electrodes within a principal fluid flow chamber, wherein the plurality of electrodes are concentrically disposed in different horizontal planes substantially parallel to the first horizontal plane, wherein at least two of the plurality of electrodes are independently connected to an electrical power supply, further comprising independently controlling the supply of electrical power to the at least two electrodes during deposition of the copper metal seed layer; and
(c) electrolytically depositing copper metal on the copper metal seed layer with a second deposition process under conditions in which the deposition rate of the second deposition process is substantially greater than the deposition rate of the first deposition process.

24. The process of claim 23, wherein the copper metal is a copper alloy.

25. The process of claim 24, wherein the first electrolytic deposition process occurs in an alkaline bath.

26. The process of claim 23, wherein the controlling of the supply of power for at least one of the independently controlled electrodes is based on one or more user input parameters and a plurality of predetermined sensitivity values associated with the workpiece, the predetermined sensitivity values corresponding to process perturbations resulting from perturbations of an electrical power supply parameter for the at least one independently controlled electrode.

27. The process of claim 26, wherein the electrical power parameter is electrical current or potential.

28. The process of claim 26, wherein the sensitivity values are logically arranged within a controller as one or more Jacobian matrices.

29. The process of claim 23, wherein the workpiece includes one or more sub-micron recesses in which the copper metal seed layer has been formed.

30. A process for applying a metallization interconnect structure to a workpiece, comprising:
(a) depositing a copper metal seed layer using a first deposition process wherein the first deposition process occurs in an alkaline bath, the first deposition process being an electrolytic deposition that forms the copper metal seed layer directly on a barrier layer;
(b) the first electrolytic deposition process comprising supplying electroplating power to a plurality of concentric anodes disposed at different positions relative to the workpiece, wherein more than one of the concentric anodes substantially simultaneously contribute to the first electrolytic deposition process; and
(c) electrolytically depositing a metal on the copper metal seed layer using a second deposition process, wherein the second deposition process occurs in an acidic bath.

31. The process of claim 30, wherein the metal deposited during the second deposition process is copper.

32. The process of claim 30, wherein the alkaline bath includes a complexing agent comprising EDTA, ED, polycarboxylic acid, and mixtures thereof.

33. The process of claim 30, wherein the workpiece includes one or more microstructures on which the copper metal seed layer is deposited.

34. The process of claim 30, wherein during the first deposition process at least two of the plurality of anodes are independently connected to an electrical power supply, and further comprises independently controlling the supply of electrical power to the at least two of the plurality of anodes.

35. The process of claim 30, wherein the second deposition process comprises supplying electroplating power to a plurality of concentric anodes disposed at different positions within the principal fluid flow chamber relative to the workpiece.

36. A process for applying a metallization interconnect structure, comprising:
(a) providing a workpiece on which a copper metal seed layer is to be formed;
(b) using a first electrolytic deposition process to deposit the copper metal seed layer directly on an underlying barrier layer, wherein the copper metal seed layer is deposited in a single electrolytic deposition step; and (c) the first electrolytic deposition process taking place within a principal fluid flow chamber of a reactor and comprising supplying electroplating power to a plurality of anodes disposed at different positions within the principal fluid flow chamber relative to the workpiece.

37. A process for applying a metallization interconnect structure, comprising:
   (a) providing a workpiece on which a copper metal seed layer is to be formed;
   (b) using a first electrolytic deposition process to deposit the copper metal seed layer, the first electrolytic deposition process forming the copper metal seed layer directly on an underlying barrier layer; and
   (c) the first electrolytic deposition process taking place within a principal fluid flow chamber of a reactor and comprising supplying electroplating power to a plurality of anodes disposed at different positions within the principal fluid flow chamber relative to the workpiece, wherein the principal fluid is defined in an upper portion thereof by an angled wall, the angled wall supporting one or more of the plurality of anodes.

38. A process for applying a metallization interconnect structure, comprising:
   (a) providing a workpiece on which a copper metal seed layer is to be formed;
   (b) using a first electrolytic deposition process to deposit the copper metal seed layer, the first electrolytic deposition process forming the copper metal seed layer directly on an underlying barrier layer; and
   (c) the first electrolytic deposition process taking place within a principal fluid flow chamber of a reactor and comprising supplying electroplating power to a plurality of anodes disposed at different positions within the principal fluid flow chamber relative to the workpiece, wherein the principal fluid flow chamber comprises an inlet disposed at a lower portion thereof and that is configured to provide a venturi effect that facilitates recirculation of a chemical processing fluid in a lower portion of the principal fluid flow chamber.

* * * * *